(12) United States Patent
Park et al.

(10) Patent No.: US 12,446,387 B2
(45) Date of Patent: Oct. 14, 2025

(54) DISPLAY DEVICE AND MANUFACTURING METHOD THEREOF

(71) Applicant: Samsung Display Co., LTD., Yongin-si (KR)

(72) Inventors: Sung Kook Park, Yongin-si (KR); Dae Ho Song, Yongin-si (KR); Min Woo Kim, Yongin-si (KR); Byung Choon Yang, Yongin-si (KR); So Yeon Yoon, Yongin-si (KR); Hyung Il Jeon, Yongin-si (KR); Joo Woan Cho, Yongin-si (KR); Jin Woo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 588 days.

(21) Appl. No.: 17/692,823

(22) Filed: Mar. 11, 2022

(65) Prior Publication Data

US 2022/0352249 A1 Nov. 3, 2022

Related U.S. Application Data

(60) Provisional application No. 63/182,270, filed on Apr. 30, 2021.

(30) Foreign Application Priority Data

Apr. 30, 2021 (KR) .......................... 10-2021-0056919
Jun. 4, 2021 (KR) .......................... 10-2021-0073047

(51) Int. Cl.
*H10H 29/14* (2025.01)
*B82Y 20/00* (2011.01)
*H10H 20/01* (2025.01)
*H10H 20/851* (2025.01)
*H10H 20/856* (2025.01)

(52) U.S. Cl.
CPC .......... *H10H 29/142* (2025.01); *H10H 20/01* (2025.01); *H10H 20/8512* (2025.01); *H10H 20/856* (2025.01); *B82Y 20/00* (2013.01); *H10H 20/0361* (2025.01)

(58) Field of Classification Search
CPC ... H01L 27/156; H01L 33/005; H01L 33/502; H01L 33/60; H10H 29/142; H10H 20/01; H10H 20/8512; H10H 20/856; H10H 20/0361
See application file for complete search history.

(56) References Cited

U.S. PATENT DOCUMENTS

| | | |
|---|---|---|
| 9,905,543 B2 | 2/2018 | Yeon et al. |
| 10,008,645 B2 | 6/2018 | Bonar et al. |
| (Continued) | | |

FOREIGN PATENT DOCUMENTS

| | | |
|---|---|---|
| CN | 111129062 A | 5/2020 |
| JP | 6576579 B2 | 8/2019 |
| (Continued) | | |

*Primary Examiner* — Richard A Booth
(74) *Attorney, Agent, or Firm* — Womble Bond Dickinson (US) LLP

(57) ABSTRACT

A display device includes: a base layer; and light-emitting elements on a first surface of the base layer. The base layer includes groove patterns that are recessed from a second surface of the base layer, and the groove patterns overlap with the light-emitting elements, respectively.

18 Claims, 29 Drawing Sheets

(56) References Cited

U.S. PATENT DOCUMENTS

| | | |
|---|---|---|
| 10,192,858 B2 | 1/2019 | Higginson et al. |
| 10,636,349 B2 | 4/2020 | Shin et al. |
| 2022/0255045 A1* | 8/2022 | Yamazaki .............. H10K 59/12 |

FOREIGN PATENT DOCUMENTS

| | | |
|---|---|---|
| KR | 10-2017-0100999 A | 9/2017 |
| KR | 10-2018-0118488 A | 10/2018 |
| KR | 10-1968592 B1 | 4/2019 |
| KR | 10-2021-0026150 A | 3/2021 |

* cited by examiner

DISPLAY DEVICE AND MANUFACTURING METHOD THEREOF

CROSS-REFERENCE TO RELATED APPLICATION

This application claims priority to and the benefit of U.S. Provisional Application No. 63/182,270, filed on Apr. 30, 2021 in the United States Patent and Trademark office, and priority to and the benefit of Korean Patent Application No. 10-2021-0056919, filed in the Korean Intellectual Property Office on Apr. 30, 2021, and Korean Patent Application No. 10-2021-0073047, filed in the Korean Intellectual Property Office on Jun. 4, 2021, the entire content of all of which are incorporated herein by reference.

BACKGROUND

1. Field

Aspects of embodiments of the present disclosure relate to a light-emitting display device, and a manufacturing method thereof.

2. Description of the Related Art

Recently, as interest in information display is increasing, research and development on display devices are continuously being made.

SUMMARY

One or more embodiments of the present disclosure are directed to a high-resolution display device capable of simplifying a manufacturing process.

However, the aspects and features of the present disclosure are not limited to those above, and other aspects and features may be clearly understood by those skilled in the art from the description below.

According to one or more embodiments of the present disclosure, a display device includes: a base layer; and light-emitting elements on a first surface of the base layer. The base layer includes groove patterns that are recessed from a second surface of the base layer, and the groove patterns overlap with the light-emitting elements, respectively.

In an embodiment, the light-emitting elements may be directly on the first surface of the base layer.

In an embodiment, the display device may further include a color conversion layer in the groove patterns.

In an embodiment, the display device may further include a protective layer covering the second surface of the base layer and the color conversion layer.

In an embodiment, the display device may further include a color filter layer on the color conversion layer.

In an embodiment, the display device may further include a reflective layer between the groove patterns and the color conversion layer.

In an embodiment, the color conversion layer may include: a base resin; and quantum dots dispersed in the base resin.

In an embodiment, the display device may further include a planarization layer between the light-emitting elements.

In an embodiment, the display device may further include a substrate on the planarization layer, and electrically connected to the light-emitting elements.

In an embodiment, the display device may further include a connection electrode between the substrate and the light-emitting elements.

In an embodiment, each of the light-emitting elements may include: a first semiconductor layer; a second semiconductor layer on the first semiconductor layer; and an active layer between the first semiconductor layer and the second semiconductor layer.

In an embodiment, the second semiconductor layer may be directly on the first surface of the base layer.

According to one or more embodiments of the present disclosure, a manufacturing method of a display device, includes: forming light-emitting elements on a first surface of a base layer; connecting the light-emitting elements to a substrate; and etching a second surface of the base layer to form groove patterns overlapping with the light-emitting elements.

In an embodiment, the method may further include forming a color conversion layer in the groove patterns.

In an embodiment, the method may further include forming a protective layer covering the second surface of the base layer and the color conversion layer.

In an embodiment, the method may further include forming a color filter layer on the color conversion layer.

In an embodiment, the method may further include forming a planarization layer between the light-emitting elements; and forming a first electrode on the light-emitting elements. The first electrode on the light-emitting elements may be connected to a first connection electrode on the substrate.

In an embodiment, the forming of the light-emitting elements may include: providing a light-emitting stack on the base layer; and etching the light-emitting stack.

In an embodiment, the light-emitting stack may include: a first semiconductor layer; a second semiconductor layer formed on the first semiconductor layer; and an active layer formed between the first semiconductor layer and the second semiconductor layer.

In an embodiment, the second semiconductor layer may be directly formed on the first surface of the base layer.

The above and other aspects and features of the present disclosure are described in more detail below with reference to the drawings.

According to one or more embodiments of the present disclosure, because the color conversion layer may be provided in the base layer that may be a growth substrate of the light-emitting elements, a separate substrate for providing the color conversion layer may be omitted, thereby simplifying a manufacturing process of the display device. In addition, a high-resolution display device may be implemented by forming fine groove patterns on the base layer, and forming the color conversion layer in the groove patterns by using a capillary phenomenon.

However, the aspects and features of the present disclosure are not limited to those described above, and other aspects and features may be included in the present specification.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
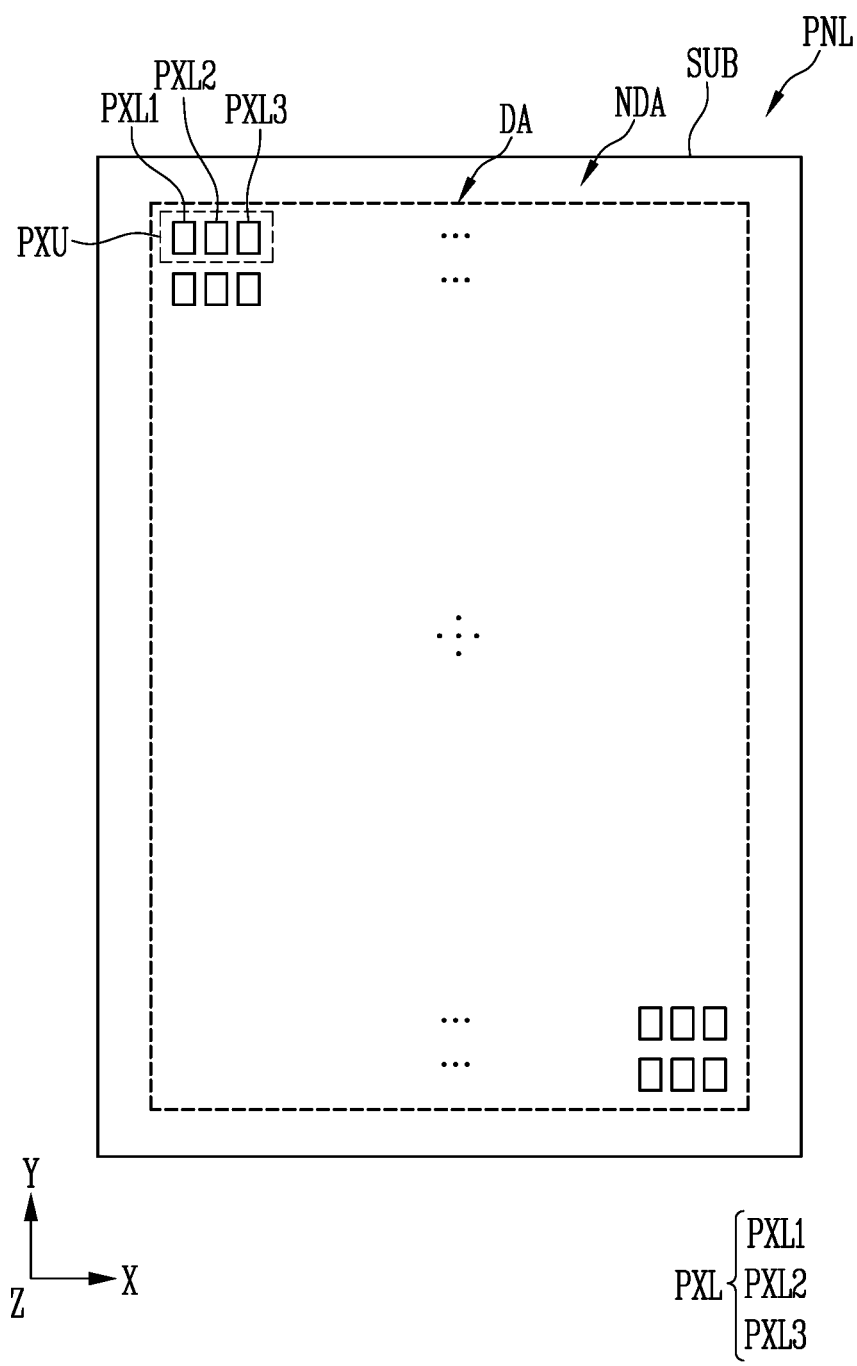
FIG. 1 is a plan view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. Likewise, it will also be understood that when an element or layer is referred to as being "between" two elements or layers, it can be the only element or layer between the two elements or layers, or one or more intervening elements or layers may also be present. In addition, the term "connection" or "access" may refer to a physical and/or electrical connection or access collectively. Further, it may refer to a direct or indirect connection or access, and/or an integral or non-integral connection or access collectively.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
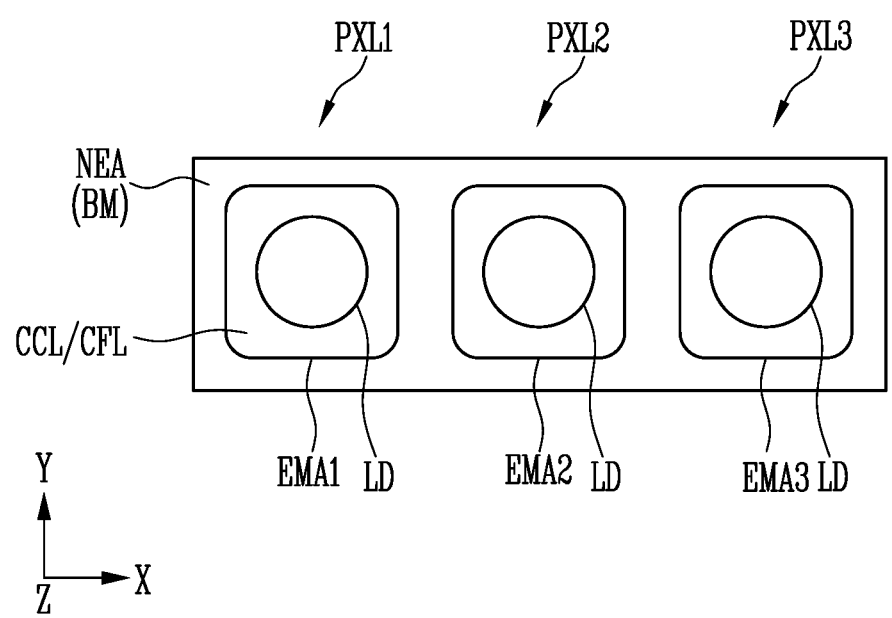
FIG. 2 is a plan view illustrating a pixel according to an embodiment.

FIG. 1 is a plan view illustrating a display device according to an embodiment. FIG. 2 is a plan view illustrating a pixel according to an embodiment.

FIG. 1 illustrates a display device that may use (e.g., that may include) a light-emitting element as a light source, for example, as included in a display panel PNL provided in the display device.

For convenience of illustration, a structure of the display panel PNL is partially shown and will be briefly described centering on a display area DA shown in FIG. 1. However, at least one driving circuit or driving circuit unit (e.g., at least one of a scan driver and/or a data driver), lines, and/or pads may be further disposed at (e.g., in or on) the display panel PNL according to an embodiment.

Referring to FIGS. 1 and 2, the display panel PNL may include a substrate SUB, and a pixel unit (e.g., a pixel device or a pixel structure) PXU disposed on the substrate SUB. The pixel unit PXU may include a first pixel PXL1, a second pixel PXL2, and/or a third pixel PXL3. Hereinafter, when at least one of the first pixel PXL1, the second pixel PXL2, or the third pixel PXL3 is arbitrarily referred to, or when two or more from among the pixels are collectively referred to, it will be referred to as a "pixel PXL" or "pixels PXL".

The substrate SUB may constitute a base member of the display panel PNL, and may be a rigid or flexible substrate or film. For example, the substrate SUB may include (e.g., may be made of) a rigid substrate made of glass or tempered glass, or a flexible substrate (or thin film) made of plastic or metal, but the material and/or physical properties of the substrate SUB are not particularly limited thereto.

The display panel PNL and the substrate SUB thereof may include the display area DA for displaying an image, and a non-display area NDA excluding the display area DA. For example, the non-display area NDA may be adjacent to the display area DA, and/or may at least partially surround (e.g., around a periphery of) the display area DA. The pixels PXL may be disposed at (e.g., in or on) the display area DA. Various suitable lines, pads, and/or built-in circuit units (e.g., circuit boards, integrated circuits, and/or the like) connected to the pixels PXL of the display area DA may be disposed at (e.g., in or on) the non-display area NDA. The pixels PXL may be regularly arranged according to a stripe or an RGBG type arrangement structure (e.g., in a PEN-TILE® arrangement, PENTILE® being a duly registered trademark of Samsung Display Co., Ltd.). However, an arrangement of the pixels PXL is not limited thereto, and the pixels PXL may be arranged at (e.g., in or on) the display area DA in various suitable structures and/or ways as would be known to those skilled in the art.

According to an embodiment, two or more kinds of pixels PXL for emitting light of different colors from each other may be disposed at (e.g., in or on) the display area DA. For example, first pixels PXL1 for emitting light of a first color, second pixels PXL2 for emitting light of a second color, and third pixels PXL3 for emitting light of a third color may be arranged at (e.g., in or on) the display area DA. At least one of the first to third pixels PXL1, PXL2, and PXL3 that are disposed adjacent to each other may constitute one pixel unit PXU capable of emitting light of various colors. For example, each of the first to third pixels PXL1, PXL2, and PXL3 may be a sub-pixel for emitting light of a suitable color (e.g., a predetermined color). According to one or more embodiments, the first pixel PXL1 may be a red pixel for emitting red light, the second pixel PXL2 may be a green pixel for emitting green light, and the third pixel PXL3 may be a blue pixel for emitting blue light, but the present disclosure is not limited thereto.

In an embodiment, the first pixel PXL1 may include a first light-emitting area EMA1, the second pixel PXL2 may include a second light-emitting area EMA2, and the third pixel PXL3 may include a third light-emitting area EMA3. A boundary between the first to third light-emitting areas EMA1, EMA2, and EMA3 may be a non-light-emitting area NEA, and a light blocking layer BM may be disposed at (e.g., in or on) the boundary (e.g., at the non-light-emitting area NEA), but the present disclosure is not limited thereto.

In an embodiment, the first pixel PXL1, the second pixel PXL2, and the third pixel PXL3 may include light-emitting elements LD for emitting light of the same color as each other, and may include the color conversion layer and/or the color filter layer of different colors disposed on the light-emitting elements LD, thereby emitting light of the first color, the second color, and the third color, respectively. In another embodiment, the first pixel PXL1, the second pixel PXL2, and the third pixel PXL3 may include (e.g., may use) a light-emitting element for emitting light of the first color, a light-emitting element for emitting light of the second color, and a light-emitting element for emitting light of the third color as light sources, respectively, thereby emitting light of the first color, the second color, and the third color, respectively. However, the color, type, and/or number of pixels PXL constituting each pixel unit PXU are not particularly limited. In other words, the color of light emitted from each pixel PXL may be variously modified as needed or desired.

The pixel PXL may include at least one light source driven by a control signal (e.g., a predetermined control signal), for example, such as a scan signal and/or a data signal, and/or a suitable power supply (e.g., a predetermined power supply), for example, such as a first power supply and/or a second power supply. In an embodiment, the light source may include ultra-small pillar light-emitting elements having a size as small as a nanometer scale to a micrometer scale. However, the present disclosure is not limited thereto, and various suitable kinds of light-emitting elements may be used as the light source of the pixel PXL.

In an embodiment, each pixel PXL may be formed of an active pixel (e.g., an active type). However, the type, structure, and/or driving method of the pixels PXL applicable to the display device are not particularly limited. For example, each pixel PXL may be a pixel of a passive light-emitting display device or an active light-emitting display device having various suitable structures and/or driving methods.

Figure 3:
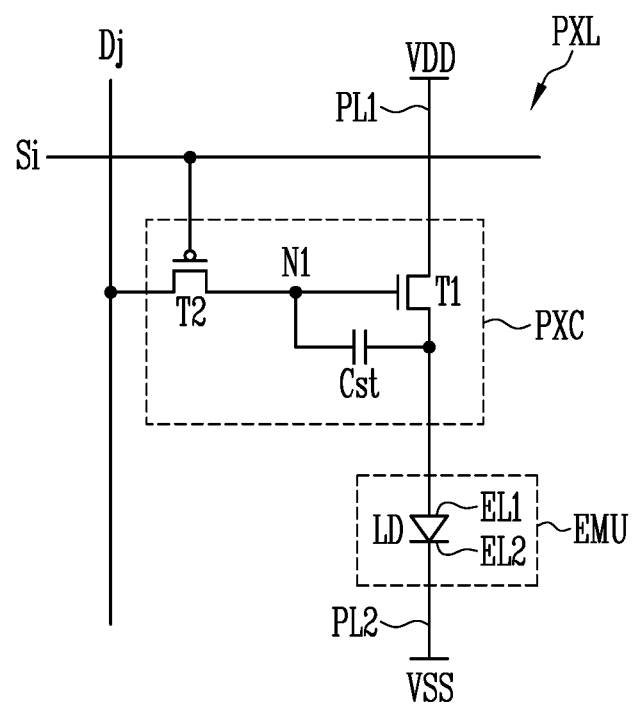
FIG. 3 is a circuit diagram of a pixel according to an embodiment.

FIG. 3 is a circuit diagram of a pixel according to an embodiment.

FIG. 3 illustrates an electrical connection relationship between constituent elements included in the pixel PXL that may be applied to an active display device. However, the kinds of constituent elements included in the pixel PXL are not limited thereto.

According to an embodiment, the first pixel PXL1, the second pixel PXL2, and the third pixel PXL3 may have the same or substantially the same (or similar) structure as each other. Thus, the pixel PXL illustrated in FIG. 3 may represent (e.g., may be) any one of the first pixel PXL1, the second pixel PXL2, and the third pixel PXL3 provided at (e.g., in or on) the display panel PNL of FIG. 1.

Referring to FIG. 3, the pixel PXL may include a light-emitting unit (e.g., a light-emitting device) EMU that generates light having a luminance corresponding to a data signal. Also, the pixel PXL may further include a pixel circuit PXC for driving the light-emitting unit EMU.

According to an embodiment, the light-emitting unit EMU may include at least one light-emitting element LD electrically connected between a first power line PL1 to which a voltage of a first driving power supply VDD is applied, and a second power line PL2 to which a voltage of a second driving power supply VSS is applied. For example, the light-emitting unit EMU may include a first electrode EL1 connected to the first driving power supply VDD through the pixel circuit PXC and the first power line PL1, a second electrode EL2 connected to the second driving power supply VSS through the second power line PL2, and a light-emitting element LD connected between the first electrode EL1 and the second electrode EL2. In an embodiment, the first electrode EL1 may be an anode, and the second electrode EL2 may be a cathode.

The light-emitting element LD may include one end connected to the first driving power supply VDD and the other end connected to the second driving power supply VSS. In some embodiments, the one end of the light-emitting element LD may be provided integrally with the first electrode EL1 to be connected to the first electrode EL1, and the other end of the light-emitting element LD may be provided integrally with the second electrode EL2 to be connected to the second electrode EL2. The first driving power supply VDD and the second driving power supply VSS may have different potentials from each other. In this case, a potential difference between the first and second driving power supplies VDD and VSS may be determined (e.g., may be set) to be greater than or equal to a threshold voltage of the light-emitting element LD during a light-emitting period of the pixel PXL.

The light-emitting element LD may constitute an effective light source of the light-emitting unit EMU. The light-emitting element LD may emit light having a luminance corresponding to a driving current supplied through the pixel circuit PXC. For example, during each frame period, the pixel circuit PXC may supply a driving current corresponding to a grayscale value of corresponding frame data to the light-emitting unit EMU. The driving current supplied to the light-emitting unit EMU may flow through the light-emitting element LD. Accordingly, when the light-emitting element LD emits light having the luminance corresponding to the driving current, the corresponding light-emitting unit EMU may emit light.

The pixel circuit PXC may be connected to a scan line and a data line of the pixel PXL. For example, when the pixel PXL is disposed at an i-th row (where i is a natural number) and a j-th column (where j is a natural number) of the display area DA, the pixel circuit PXC of the pixel PXL may be connected to an i-th scan line Si and a j-th data line Dj of the display area DA. According to an embodiment, the pixel circuit PXC may include first and second transistors T1 and T2, and a storage capacitor Cst. However, the structure of the pixel circuit PXC is not limited to that of the embodiment shown in FIG. 3.

The pixel circuit PXC may include the first and second transistors T1 and T2, and the storage capacitor Cst.

A first terminal of the first transistor T1 (e.g., a driving transistor) may be connected to the first driving power supply VDD, and a second terminal of the first transistor T1 may be electrically connected to the light-emitting element LD. A gate electrode of the first transistor T1 may be connected to a first node N1. The first transistor T1 may control an amount of the driving current supplied to the light-emitting element LD in response to a voltage of the first node N1.

A first terminal of the second transistor T2 (e.g., a switching transistor) may be connected to the j-th data line Dj, and a second terminal of the second transistor T2 may be connected to the first node N1. Here, the first terminal and the second terminal of the second transistor T2 may be different terminals. For example, when the first terminal is a source electrode, the second terminal may be a drain electrode. A gate electrode of the second transistor T2 may be connected to the i-th scan line Si.

The second transistor T2 may be turned on when a scan signal of a suitable voltage (e.g., a turn-on voltage) at which the second transistor T2 may be turned on is supplied from the i-th scan line Si, and may electrically connect the j-th data line Dj and the first node N1 to each other. In this case, the data signal of a corresponding frame may be supplied to the j-th data line Dj, and accordingly, the data signal may be transferred to the first node N1. The data signal transferred to the first node N1 may be charged in the storage capacitor Cst.

The storage capacitor Cst may charge a voltage corresponding to the data signal supplied to the first node N1, and may maintain or substantially maintain the charged voltage until the data signal of a next frame is supplied.

In FIG. 3, the pixel circuit PXC is shown as including the second transistor T2 for transferring the data signal into the pixel PXL, the storage capacitor Cst for storing the data signal, and the first transistor T1 for supplying a driving current corresponding to the data signal to the light-emitting element LD. However, the present disclosure is not limited thereto, and the structure of the pixel circuit PXC may be variously modified as needed or desired. For example, the pixel circuit PXC may further include at least one additional transistor element, such as a transistor element for compensating for the threshold voltage of the first transistor T1, a transistor element for initializing the first node N1, a transistor element for controlling a light-emitting time of the light-emitting element LD, and/or the like, or other suitable circuit elements, such as a boosting capacitor for boosting a voltage of the first node N1, and/or the like, may be further included.

Figure 4:
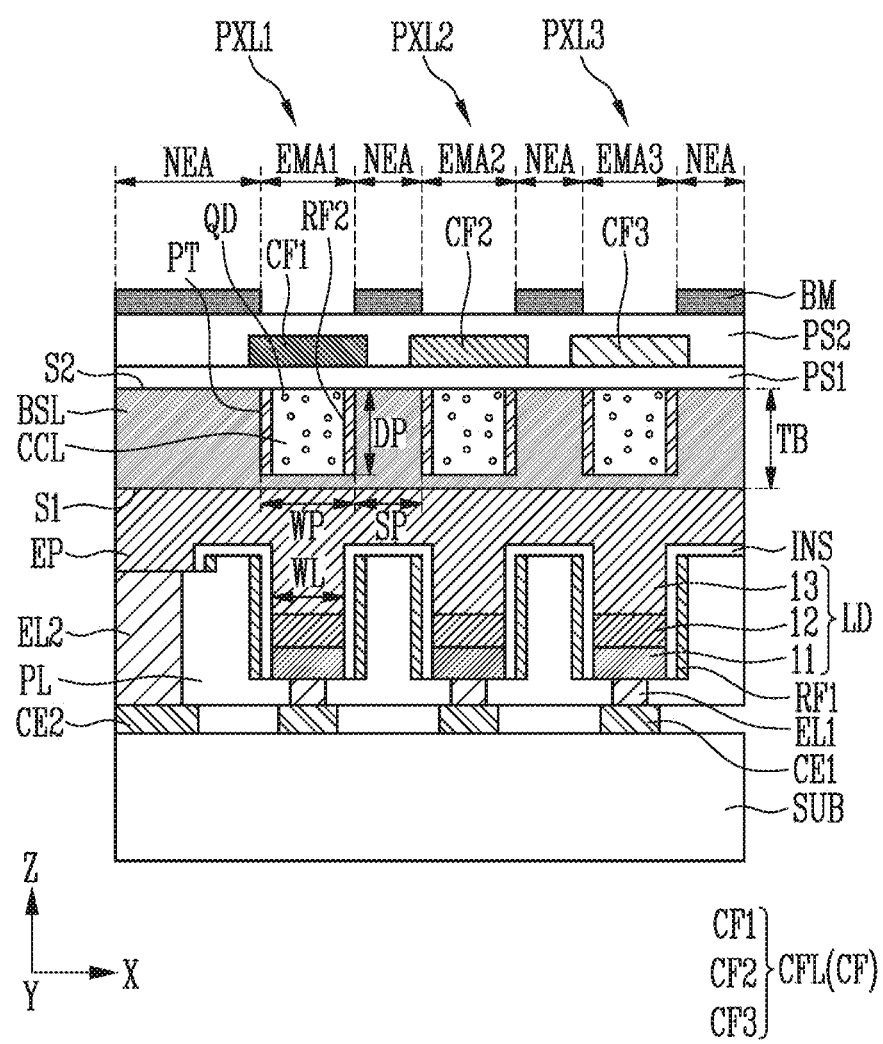
FIGS. 4-5 are cross-sectional views illustrating a pixel according to one or more embodiments.
Figure 5:
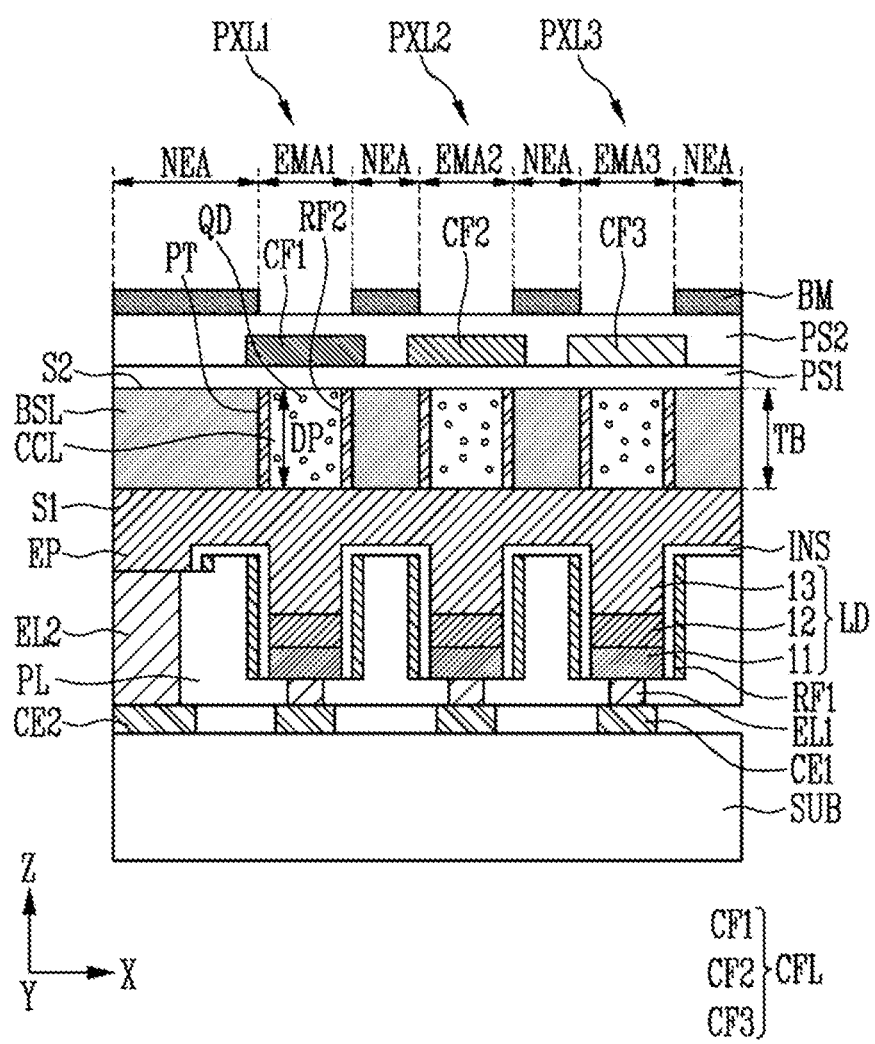

FIGS. 4 and 5 are cross-sectional views illustrating a pixel according to one or more embodiments.

FIGS. 4 and 5 schematically illustrate cross-sectional structures of a first pixel PXL1, a second pixel PXL2, and a third pixel PXL3 that are adjacent to each other.

Referring to FIGS. 4 and 5, a pixel PXL and a display device including the pixel PXL may include a substrate SUB, light-emitting elements LD disposed on the substrate SUB, a base layer BSL, a color conversion layer CCL, and a color filter layer CFL. The substrate SUB may be a driving substrate including circuit elements, for example, such as the transistors constituting the pixel circuit PXC (e.g., see FIG. 3) of each pixel PXL. For example, the substrate SUB may include (e.g., may use) a CMOS substrate including a combination of N-channel metal-oxide semiconductor (NMOS) and P-channel metal-oxide semiconductor (PMOS), but the present disclosure is not limited thereto.

The light-emitting elements LD may be disposed in the light-emitting areas EMA1, EMA2, and EMA3 of the first to third pixels PXL1, PXL2, and PXL3, respectively. Each of the light-emitting elements LD may be provided in a shape extending in one direction. For example, each of the light-emitting elements LD may be provided on the substrate SUB in a shape extending from a first surface S1 of the base layer BSL in a direction towards the substrate SUB (e.g., a direction opposite to a third direction or a (−) Z-axis direction). For example, the light-emitting elements LD may have a rod or rod-like shape or a bar or bar-like shape that is longer in the third direction (e.g., the Z-axis direction), for example, with an aspect ratio greater than 1, but the present disclosure is not limited thereto. For example, each of the light-emitting elements LD may have a pillar shape having a diameter at one end and a diameter at another end that are different from each other. In addition, the light-emitting elements LD may be light-emitting diodes (LED) manufactured in an ultra-small size to have a diameter and/or a length of about a nanometer scale to a micrometer scale. However, the present disclosure is not limited thereto, and the size of the light-emitting element LD may be variously modified according to requirements (and/or design conditions) of a lighting device or a display device to which the light-emitting element LD is applied.

The light-emitting elements LD may include a first semiconductor layer 11, a second semiconductor layer 13, and an active layer 12 interposed between the first and second semiconductor layers 11 and 13. For example, the first semiconductor layer 11, the active layer 12, and the second semiconductor layer 13 of the light-emitting elements LD may be sequentially stacked in the third direction (e.g., the Z-axis direction).

The first semiconductor layer 11 of the light-emitting elements LD may include, for example, at least one p-type semiconductor layer. For example, the first semiconductor layer 11 of the light-emitting elements LD may include at least one semiconductor material from among GaN, InGaN, InAlGaN, AlGaN, or AlN, and may include the p-type semiconductor layer doped with a first conductive dopant (or a p-type dopant), such as Mg, Zn, Ca, Sr, Ba, and/or the like. For example, the first semiconductor layer 11 of the light-emitting elements LD may include a GaN semiconductor material doped with a first conductive dopant (or a p-type dopant), but the present disclosure is not limited thereto, and the first semiconductor layer 11 of the light-emitting elements LD may be formed of various suitable other materials.

The active layer 12 of the light-emitting elements LD may be disposed between the first semiconductor layer 11 and the second semiconductor layer 13. The active layer 12 of the light-emitting elements LD may include any one of a single well structure, a multi well structure, a single quantum well structure, a multi quantum well (MQW) structure, a quantum dot structure, or a quantum line structure, but the present disclosure is not limited thereto. The active layer 12 of the light-emitting elements LD may include GaN, InGaN, InAlGaN, AlGaN, or AlN, and/or various other suitable materials may constitute the active layer 12 of the light-emitting elements LD.

When a suitable signal or voltage (e.g., a predetermined signal or voltage) is applied to each end of the light-emitting elements LD, each light-emitting element LD emits light while electron-hole pairs are combined in the active layer 12 of the light-emitting elements LD. By controlling the light emitted by each of the light-emitting elements LD as described above, the light-emitting element LD may be used as a light source of various suitable light-emitting elements or devices including the pixel PXL of a display device.

According to one or more embodiments, an electron blocking layer (EBL) may be further disposed between the active layer 12 and the first semiconductor layer 11 of the light-emitting elements LD. The electron blocking layer may block the flow of electrons supplied from the second semiconductor layer 13 from escaping to the first semiconductor layer 11, thereby increasing the electron-hole recombination probability in the active layer 12. The energy bandgap of the electron blocking layer may be greater than that of the active layer 12 and/or the first semiconductor layer 11, but the present disclosure is not limited thereto.

According to one or more embodiments, a super lattice layer (SLL) may be further disposed between the active layer 12 and the second semiconductor layer 13 of the light-emitting elements LD. The super lattice layer may relieve a stress of the active layer 12 and the second semiconductor layer 13 to improve the quality of the light-emitting elements LD. For example, the super lattice layer may be formed in a structure in which InGaN and GaN are alternately stacked, but the present disclosure is not limited thereto.

The second semiconductor layer 13 of the light-emitting elements LD may be disposed on the active layer 12, and may include a semiconductor layer of a different kind from that of the first semiconductor layer 11. In an embodiment, the second semiconductor layer 13 of the light-emitting elements LD may include at least one n-type semiconductor layer. For example, the second semiconductor layer 13 of the light-emitting elements LD may include a semiconductor material, such as GaN, InGaN, InAlGaN, AlGaN, or AlN, and may be an n-type semiconductor layer doped with a second conductive dopant (or an n-type dopant), such as Si, Ge, Sn, and/or the like. For example, the second semiconductor layer 13 of the light-emitting elements LD may include a GaN semiconductor material doped with the second conductive dopant (or the n-type dopant). However, the material constituting the second semiconductor layer 13 of the light-emitting elements LD is not limited thereto, and various suitable materials may be used to form the second semiconductor layer 13 of the light-emitting elements LD.

The first semiconductor layer 11 of the light-emitting elements LD may be electrically connected to a first connection electrode CE1 provided on the substrate SUB. For example, the first electrode EL1 may be disposed on the first semiconductor layer 11 of the light-emitting elements LD, and the first semiconductor layer 11 of the light-emitting elements LD may be electrically connected to the first connection electrode CE1 provided on the substrate SUB through the first electrode EL1. As the first electrode EL1 and the first connection electrode CE1 are bonded to each other, the light-emitting elements LD and the substrate SUB may be connected to (e.g., coupled to or attached to) each other.

The second semiconductor layer 13 of the light-emitting elements LD may be electrically connected to a second connection electrode CE2 provided on the substrate SUB. For example, the second semiconductor layer 13 of the light-emitting elements LD may be connected to an electrode part EP, and the electrode part EP may be electrically connected to the second connection electrode CE2 provided on the substrate SUB through the second electrode EL2. The electrode part EP may be integrally formed with the second semiconductor layer 13 of the light-emitting elements LD, but the present disclosure is not limited thereto. As the second electrode EL2 and the second connection electrode CE2 are bonded to each other, the electrode part EP and the substrate SUB may be connected to (e.g., may be coupled to or attached to) each other.

Each of the first and second electrodes EL1 and EL2 may include a metal or a metal oxide. For example, each of the first and second electrodes EL1 and EL2 may include copper (Cu), gold (Au), chromium (Cr), titanium (Ti), aluminum (Al), nickel (Ni), indium tin oxide (ITO), oxides or alloys thereof, and/or the like, but the present disclosure is not limited thereto. The first and second electrodes EL1 and EL2 may be concurrently (e.g., simultaneously) formed with each other in the same process, but the present disclosure is not limited thereto.

An insulating layer INS may be provided on the light-emitting elements LD. The insulating layer INS may be provided on side surfaces of the light-emitting elements LD and/or the electrode part EP. The insulating layer INS may prevent or substantially prevent an electrical short that may occur when the active layer 12 of the light-emitting elements LD contacts conductive materials other than the first and second semiconductor layers 11 and 13. In addition, the insulating layer INS may reduce or minimize surface defects of each light-emitting element LD, thereby improving a lifespan and luminous efficiency of each light-emitting element LD.

The insulating layer INS may cover the side surfaces of the light-emitting elements LD and/or the electrode part EP, but may be partially removed to expose upper surfaces of the light-emitting elements LD and/or the electrode part EP. For example, the insulating layer INS may be partially removed to expose the first semiconductor layer 11 of the light-emitting elements LD.

The insulating film INS may include silicon oxide (SiOx), silicon nitride (SiNx), silicon oxynitride (SiOxNy), silicon oxycarbide (SiOxCy), aluminum oxide (AlOx), aluminum nitride (AlNx), zirconium oxide (ZrOx), hafnium oxide (HfOx), or titanium oxide (TiOx), but the present disclosure is not necessarily limited thereto.

According to one or more embodiments, a first reflective layer RF1 may be disposed on the insulating layer INS. For example, the first reflective layer RF1 may be disposed on the side surfaces of the light-emitting elements LD and/or the electrode part EP, and may expose the upper surfaces of the light-emitting elements LD and/or the electrode part EP. The first reflective layer RF1 may reflect light emitted from the light-emitting elements LD, and may guide the light in the third direction (e.g., the Z-axis direction), or in other words, in a front direction of the display panel PNL, thereby improving light-output efficiency. The material of the first reflective layer RF1 is not particularly limited, and may include various suitable reflective materials.

A planarization layer PL may be disposed between the light-emitting elements LD. The planarization layer PL may be disposed between the base layer BSL and the substrate SUB. The planarization layer PL may serve to planarize or substantially planarize steps of the light-emitting elements LD. The planarization layer PL may be formed of an organic material to planarize or substantially planarize the steps. For example, the planarization layer PL may include an organic material, such as acrylates resin, epoxy resin, phenolic resin, polyamides resin, polyimides resin, polyesters resin, polyphenylenesulfides resin, or benzocyclobutene (BCB). However, the present disclosure is not limited thereto, and the planarization layer PL may include an inorganic material, such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The base layer BSL may be disposed on the light-emitting elements LD. The light-emitting elements LD may be disposed on a first surface S1 of the base layer BSL. In an embodiment, the light-emitting elements LD may be structures manufactured by stacking or growing one or more suitable materials, elements, or members on the first surface S1 of the base layer BSL, and may be disposed directly on the first surface S1 of the base layer BSL. For example, the second semiconductor layer 13 of the light-emitting elements LD may be directly disposed on the first surface S1 of the base layer BSL. A second surface S2 of the base layer BSL may be a surface opposite to the first surface S1, and may correspond to a display surface (or a front surface) of the display panel PNL from which light is emitted from the pixel PXL.

The base layer BSL may include groove patterns PT recessed from the second surface S2. The groove patterns PT may be areas recessed in a direction opposite to the third direction (e.g., the (−) Z-axis direction) from the second surface S2 of the base layer BSL.

Each of the groove patterns PT may overlap with a corresponding one of the light-emitting elements LD in the third direction (e.g., the Z-axis direction). In an embodiment, each of the groove patterns PT may entirely overlap (e.g., completely overlap) with the corresponding one of the light-emitting elements LD in the third direction (e.g., the Z-axis direction). Accordingly, light emitted from the light-emitting elements LD may be incident into the groove patterns PT, and may be provided to the color conversion layer CCL or the like disposed inside the groove patterns PT.

In an embodiment, the groove patterns PT may be fine patterns having a width WP in a first direction (e.g., an X-axis direction) of about a nanometer scale to a micrometer scale.

The width WP of the groove patterns PT in the first direction (e.g., the X-axis direction) may be greater than the width WL of the light-emitting elements LD in the first direction (e.g., the X-axis direction). Also, the width WP of the groove patterns PT in the first direction (e.g., the X-axis direction) may be greater than a distance SP between adjacent ones of the groove patterns PT in the first direction (e.g., the X-axis direction). However, the present disclosure is not limited thereto, and the width WP of the groove patterns PT in the first direction (e.g., the X-axis direction) may be variously modified within a range capable of promoting a capillary phenomenon, which will be described in more detail below.

A depth DP of the groove patterns PT in the third direction (e.g., the Z-axis direction) may be different from a thickness TB of the base layer BSL in the third direction (e.g., the Z-axis direction). For example, as shown in FIG. 4, the depth DP of the groove patterns PT in the third direction (e.g., the Z-axis direction) may be smaller than the thickness TB of the base layer BSL in the third direction (e.g., the Z-axis direction). As such, when the base layer BSL is disposed under (e.g., underneath) the groove patterns PT with a suitable thickness (e.g., a predetermined thickness), the base layer BSL under (e.g., underneath) the groove patterns PT may recycle light emitted from the light-emitting elements LD to guide the light to the color conversion layer CCL disposed inside the groove patterns PT, thereby improving the light-output efficiency.

However, the present disclosure is not limited thereto, and as shown in FIG. 5, the depth DP in the third direction (e.g., the Z-axis direction) of the groove patterns PT may be the same or substantially the same as (e.g., may be equal to or substantially equal to) the thickness TB of the base layer BSL in the third direction (e.g., the Z-axis direction). In other words, the groove patterns PT may have a hole shape penetrating through the base layer BSL. In this case, the groove patterns PT may penetrate the base layer BSL to expose the ends (e.g., the second semiconductor layer 13) of the light-emitting elements LD disposed thereunder.

According to one or more embodiments, side surfaces of the groove patterns PT may be perpendicular to or substantially perpendicular to a lower surface of the groove patterns PT or the second surface S2 of the base layer BSL. However, the present disclosure is not limited thereto, and the shape of the groove patterns PT may be variously modified. For example, the side surfaces of the groove patterns PT may have a suitable inclination angle (e.g., a predetermined inclination angle) with respect to the lower surface of the groove patterns PT or the second surface S2 of the base layer BSL. In other words, the groove patterns PT may have a trapezoidal shape having a width decreasing in the direction opposite to the third direction (e.g., the (−) Z-axis direction). As another example, the side and/or lower surfaces of the groove patterns PT may be implemented as curved surfaces.

The color conversion layer CCL may be disposed inside the groove patterns PT of the base layer BSL. As such, when the color conversion layer CCL is provided on the base layer BSL, which may be a growth substrate of the light-emitting elements LD, a separate substrate for providing the color conversion layer CCL may not be used (e.g., may be omitted), thereby simplifying the manufacturing process of the display device.

In an embodiment, the color conversion layer CCL may be implanted into the groove patterns PT by a capillary phenomenon. As such, when the color conversion layer CCL is formed inside the fine groove patterns PT formed in the base layer BSL by using the capillary phenomenon, a high-resolution display device may be realized beyond limitations that may be imposed by a photo process or inkjet process. This will be described in more detail below with reference to FIG. 16.

The color conversion layer CCL may include a quantum dot QD that converts light emitted from the light-emitting elements LD of the pixel PXL into light of a desired color (e.g., a specific color). For example, the color conversion layer CCL may include a plurality of quantum dots QD dispersed in a suitable matrix material (e.g., a predetermined matrix material), such as a base resin.

In an embodiment, the first to third pixels PXL1, PXL2, and PXL3 may include the light-emitting elements LD that emit light of the same color as each other. For example, the first to third pixels PXL1, PXL2, and PXL3 may include the light-emitting elements LD for emitting a third color (e.g., blue). The color conversion layer CCL may include a quantum dot QD that converts blue light emitted from the light-emitting element LD into white light. For example, the color conversion layer CCL may include a first quantum dot that converts blue light emitted from the light-emitting element LD into red light, and a second quantum dot that converts blue light into green light, but the present disclosure is not limited thereto.

In this case, the absorption coefficient of the quantum dot QD may be increased by injecting blue light having a relatively short wavelength in the visible ray range to the quantum dot QD. Accordingly, the light efficiency emitted from the pixels PXL may be improved, and excellent color reproducibility may be secured. In addition, the light-emitting unit EMU of the first to third pixels PXL1, PXL2, and PXL3 may be composed of the light-emitting elements LD (e.g., the blue light-emitting elements) that emit light of the same color as each other, and thus, manufacturing efficiency of the display device may be increased. However, the present disclosure is not limited thereto, and the first to third pixels PXL1, PXL2, and PXL3 may include light-emitting elements LD that emit light of different colors from each other. For example, the first pixel PXL1 may include a first color (e.g., red) light-emitting element LD, the second pixel PXL2 may include a second color (e.g., green) light-emitting element LD, and the third pixel PXL3 may include a third color (e.g., blue) light-emitting element LD.

In an embodiment, a second reflective layer RF2 may be further disposed between the groove patterns PT of the base layer BSL and the color conversion layer CCL. The second reflective layer RF2 may reflect light emitted from the light-emitting elements LD and the color conversion layer CCL to improve the light output-efficiency of the display panel PNL. In addition, the second reflective layer RF2 may be disposed on the side surfaces of the groove patterns PT to prevent or substantially prevent color mixing between adjacent pixels PXL. The material of the second reflective layer RF2 is not particularly limited, and may include various suitable reflective materials.

A protective layer PS (e.g., a first protective layer PS1) may be disposed on the color conversion layer CCL. The protective layer PS may cover the second surface S2 of the base layer BSL and/or the color conversion layer CCL. One surface of the protective layer PS may be in contact with the second surface S2 of the base layer BSL and/or the color conversion layer CCL, and the other surface of the protective layer PS may be in contact with a color filter layer CFL described in more detail below. The protective layer PS may be disposed over the first to third pixels PXL1, PXL2, and PXL3. The protective layer PS may prevent or substantially prevent impurities, for example, such as moisture and/or air, from penetrating from the outside and damaging or contaminating the color conversion layer CCL.

The protective layer PS may be an inorganic layer, and may be formed of silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like.

The color filter layer CFL may be disposed on the protective layer PS (e.g., the first protective layer PS1). The color filter layer CFL may be directly disposed on the protective layer PS. The color filter layer CFL may include color filters CF1, CF2, and CF3 corresponding to the color of each pixel PXL. A full-color image may be displayed by disposing the color filters CF1, CF2, and CF3 corresponding to the colors of the first to third pixels PXL1, PXL2, and PXL3, respectively.

The color filter layer CFL may include a first color filter CF1, a second color filter CF2, and a third color filter CF3. The first color filter CR1 may be disposed in the first pixel PXL1, and may selectively transmit light emitted from the first pixel PXL1. The second color filter CF2 may be disposed in the second pixel PXL2, and may selectively transmit light emitted from the second pixel PXL2. The third color filter CF3 may be disposed in the third pixel PXL3, and may selectively transmit light emitted from the third pixel PXL3.

In an embodiment, the first color filter CF1, the second color filter CF2, and the third color filter CF3 may be a red color filter, a green color filter, and a blue color filter, respectively, but the present disclosure is not limited thereto. Hereinafter, the term "color filter CF" or "color filters CF" may refer to any color filter of the first color filter CF1, the second color filter CF2, and the third color filter CF3, or may refer to two or more of the color filters collectively.

The first color filter CF1 may overlap with the light-emitting element LD and the color conversion layer CCL of the first pixel PXL1 in the third direction (e.g., the Z-axis direction). The first color filter CF1 may include a color filter material that selectively transmits light of the first color (e.g., red). For example, when the first pixel PXL1 is the red pixel, the first color filter CF1 may include a red color filter material.

The second color filter CF2 may overlap with the light-emitting element LD and the color conversion layer CCL of the second pixel PXL2 in the third direction (e.g., the Z-axis direction). The second color filter CF2 may include a color filter material that selectively transmits light of the second color (e.g., green). For example, when the second pixel PXL2 is the green pixel, the second color filter CF2 may include a green color filter material.

The third color filter CF3 may overlap with the light-emitting element LD and the color conversion layer CCL of the third pixel PXL3 in the third direction (e.g., the Z-axis direction). The third color filter CF3 may include a color filter material that selectively transmits light of the third color (e.g., blue). For example, when the third pixel PXL3 is the blue pixel, the third color filter CF3 may include a blue color filter material.

A second protective layer PS2 may be disposed on the color filter layer CFL. The second protective layer PS2 may cover a lower member including the color filter layer CFL. The second protective layer PS2 may prevent or substantially prevent moisture and/or air from penetrating into the lower member including the color filter layer CFL. In addition, the second protective layer PS2 may protect the lower member from foreign substances, for example, such as dust.

In an embodiment, the second protective layer PS2 may include at least one inorganic layer. For example, the inorganic layer may include at least one of aluminum nitride (AlNx), silicon oxide (SiOx), silicon nitride (SiNx), silicon oxynitride (SiOxNy), zirconium oxide (ZrOx), hafnium oxide (HfOx), titanium oxide (TiOx), or the like, but the present disclosure is not limited thereto.

According to one or more embodiments, the second protective layer PS2 may include at least one organic layer. For example, the organic layer may include an organic material, such as acrylates resin, epoxy resin, phenolic resin, polyamides resin, polyimides rein, polyesters resin, polyphenylenesulfides resin, or benzocyclobutene (BCB), but the present disclosure is not limited thereto.

According to one or more embodiments, a light blocking layer BM may be further disposed on the second protective layer PS2, and the light blocking layer BM may be disposed at (e.g., in or on) the non-light-emitting area NEA. The light blocking layer BM may be disposed at a boundary between the first to third light-emitting areas EMA1, EMA2, and EMA3. As such, when the light blocking layer BM is formed at the boundary between the first to third light-emitting regions EMA1, EMA2, and EMA3, color mixing defects that may be visible from the front or side surfaces of the display device may be prevented or substantially prevented. The material of the light blocking layer BM is not particularly limited, and may include various suitable light blocking materials.

According to one or more of the embodiments described above, the light-emitting elements LD may be formed on the first surface S1 of the base layer BSL, and the fine groove patterns PT for implanting the color conversion layer CCL may be formed at (e.g., in or on) the second surface S2 of the base layer BSL, thereby simplifying the manufacturing process of the display device and realizing a high-resolution display device.

Hereinafter, other embodiments of the present disclosure will be described in more detail. The same or substantially the same components as the components described above are referred to using the same reference symbols in embodiments below, and thus, redundant description may be simplified or may not be repeated.

Figure 6:
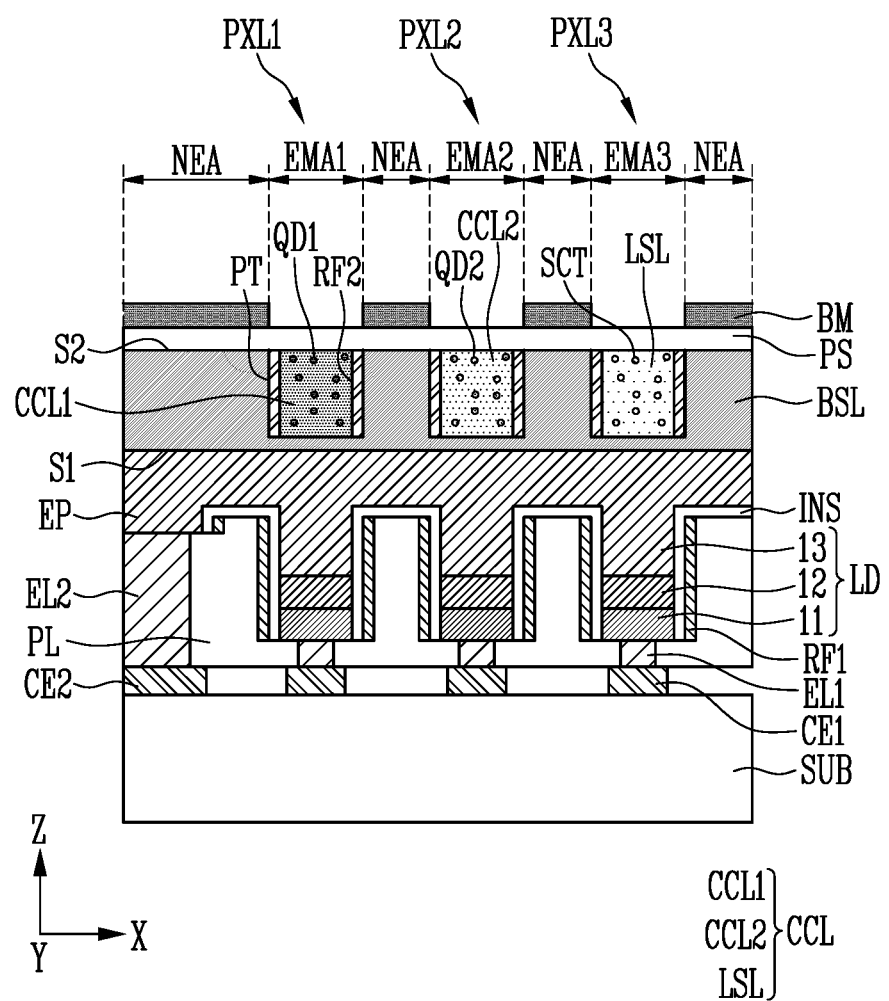
FIG. 6 is a cross-sectional view illustrating a pixel according to another embodiment.

FIG. 6 is a cross-sectional view illustrating a pixel according to another embodiment.

Referring to FIG. 6, the present embodiment may be different from the embodiments of FIGS. 1 to 5, in that in the embodiment of FIG. 6, the color conversion layer CCL includes a first color conversion layer CCL1 disposed at (e.g., in or on) the first pixel PXL1, a second color conversion layer CCL2 disposed at (e.g., in or on) the second pixel PXL2, and a light scattering layer LSL disposed at (e.g., in or on) the third pixel PXL3. Further, in the embodiment of FIG. 6, the color filter layer CFL is omitted.

In an embodiment, the first to third pixels PXL1, PXL2, and PXL3 may include the light-emitting elements LD that emit light of the same color as each other. For example, the first to third pixels PXL1, PXL2, and PXL3 may include light-emitting elements LD that emit light of a third color (e.g., blue). The color conversion layer CCL including color conversion particles may be disposed at (e.g., in or on) the first to third pixels PXL1, PXL2, and PXL3, so that a full-color image may be displayed.

The first color conversion layer CCL1 may include first color conversion particles that convert light of the third color emitted from the light-emitting element LD into light of the first color. For example, the first color conversion layer CCL1 may include a plurality of first quantum dots QD1 dispersed in a suitable matrix material (e.g., a predetermined matrix material), such as a base resin.

In an embodiment, when the light-emitting element LD is a blue light-emitting element for emitting blue light, and the first pixel PXL1 is a red pixel, the first color conversion layer CCL1 may include the first quantum dot QD1 that converts light of the blue color emitted from the blue light-emitting element into the light of the red color. The first quantum dot QD1 may absorb blue light to shift a wavelength according to an energy transition, thereby emitting red light. On the other hand, when the first pixel PXL1 is a pixel of a different color from the red pixel, the first color conversion layer CCL1 may include a first quantum dot QD1 corresponding to the different color of the first pixel PXL1.

The second color conversion layer CCL2 may include second color conversion particles that convert light of the third color emitted from the light-emitting element LD into light of the second color. For example, the second color conversion layer CCL2 may include a plurality of second quantum dots QD2 dispersed in a suitable matrix material (e.g., a predetermined matrix material), such as a base resin.

In an embodiment, when the light-emitting element LD is a blue light-emitting element for emitting blue light, and the second pixel PXL2 is a green pixel, the second color conversion layer CCL2 may include the second quantum dot QD2 that converts the blue light emitted from the blue light-emitting element into the green light. The second quantum dot QD2 may absorb blue light to shift a wavelength according to an energy transition, thereby emitting green light. On the other hand, when the second pixel PXL2 is a pixel of a different color, the second color conversion layer CCL2 may include a second quantum dot QD2 corresponding to the different color of the second pixel PXL2.

In an embodiment, the absorption coefficient of the first quantum dot QD1 and the second quantum dot QD2 may be increased by injecting blue light having a relatively short wavelength in the visible light range to the first quantum dot QD1 and the second quantum dot QD2. Accordingly, the light efficiency emitted from the first pixel PXL1 and the second pixel PXL2 may be improved, and excellent color reproducibility may be secured. In addition, the light-emitting unit EMU of the first to third pixels PXL1, PXL2, and PXL3 may be composed of the light-emitting elements LD (e.g., the blue light-emitting elements) of the same color as each other, and thus, manufacturing efficiency of the display device may be increased.

The light scattering layer LSL may be provided to efficiently use the light of the third color (e.g., blue) emitted from the light-emitting element LD. For example, when the light-emitting element LD is a blue light-emitting element for emitting blue light, and the third pixel PXL3 is a blue pixel, the light scattering layer LSL may include at least one kind of light scattering particles SCT to efficiently use the blue light emitted from the light-emitting element LD.

For example, the light scattering layer LSL may include the plurality of light scattering particles SCT dispersed in a suitable matrix material (e.g., a predetermined matrix material), such as a base resin. For example, the light scattering layer LSL may include the light scattering particles SCT, such as silica, but the material of the light scattering particles SCT is not limited thereto. On the other hand, the light scattering particles SCT may not only be disposed at (e.g., in or on) the third pixel PXL3, but may also be selectively included in the first color conversion layer CCL1 or the second color conversion layer CCL2 as needed or desired. However, the present disclosure is not limited thereto, and according to one or more embodiments, the light scattering layer LSL may be omitted, or a transparent polymer may be provided instead of the light scattering layer LSL.

A protective layer PS may be disposed on the color conversion layer CCL. The protective layer PS may cover the second surface S2 of the base layer BSL and/or the color conversion layer CCL. The protective layer PS may prevent or substantially prevent impurities, for example, such as moisture and/or air, from penetrating from the outside and damaging or contaminating the color conversion layer CCL.

In an embodiment, the protective layer PS may include at least one inorganic layer. For example, the inorganic layer may include one or more suitable inorganic materials, such as aluminum nitride (AlNx), silicon oxide (SiOx), silicon nitride (SiNx), silicon oxynitride (SiOxNy), zirconium oxide (ZrOx), hafnium oxide (HfOx), titanium oxide (TiOx), or the like, but the present disclosure is not limited thereto.

According to one or more embodiments, the protective layer PS may include at least one organic layer. For example, the organic layer may include an organic material, such as acrylates resin, epoxy resin, phenolic resin, polyamides resin, polyimides resin, polyesters resin, polyphenylenesulfides resin, or benzocyclobutene (BCB), but the present disclosure is not limited thereto.

A light blocking layer BM may be further disposed on the protective layer PS. The light blocking layer BM may be disposed at a boundary between the first to third light-emitting areas EMA1, EMA2, and EMA3. As such, when the light blocking layer BM is formed at the boundary between the first to third light-emitting regions EMA1, EMA2, and EMA3, color mixing defects that may be visible from the front or side surfaces of the display device may be prevented or reduced.

Figure 7:
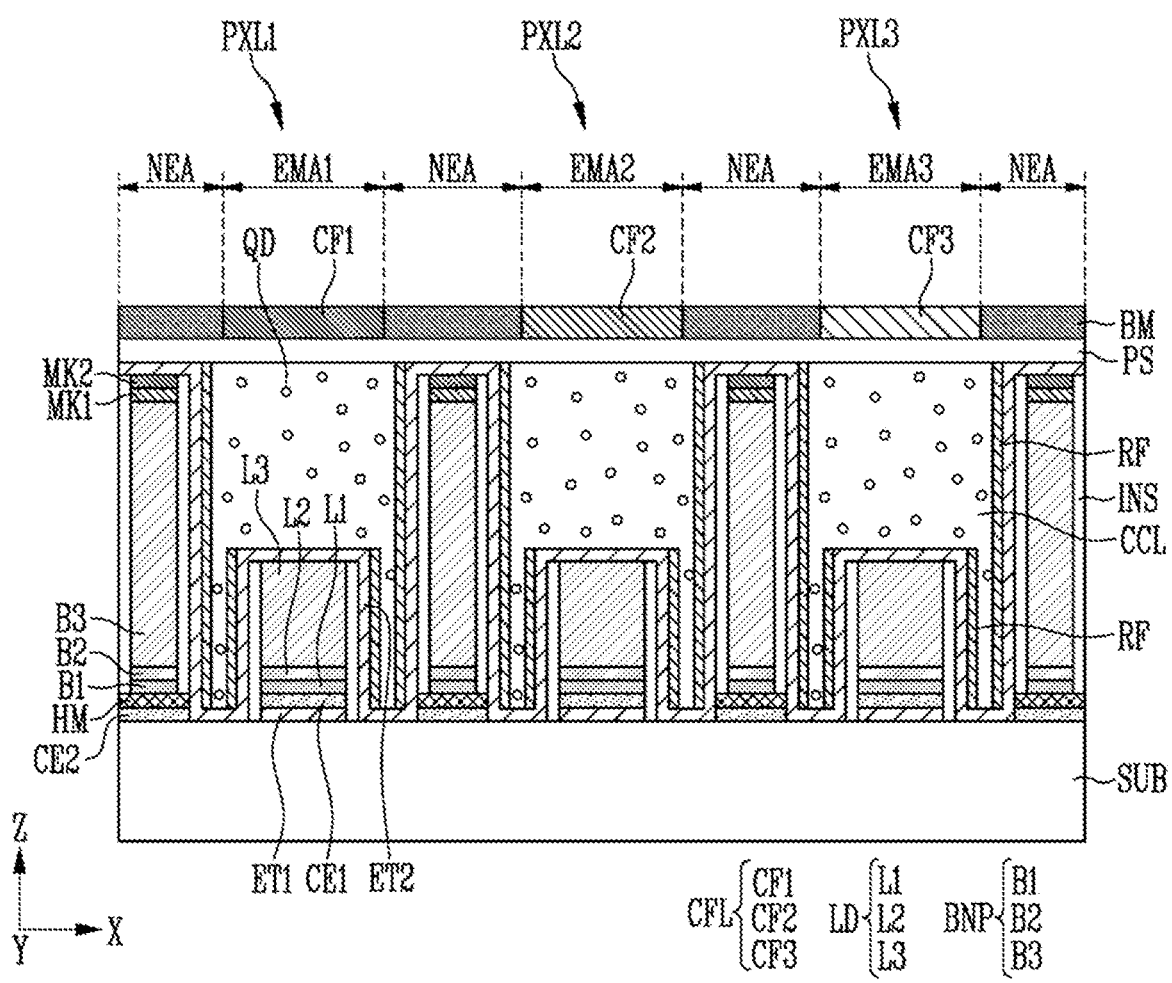
FIG. 7 is a cross-sectional view illustrating a pixel according to another embodiment.

FIG. 7 is a cross-sectional view illustrating a pixel according to another embodiment.

Referring to FIG. 7, the present embodiment may be different from the embodiment shown in FIG. 5, in that in the embodiment of FIG. 7, the pixel PXL may further include bank patterns BNP provided on the substrate SUB, and the color conversion layer CCL may be provided between the bank patterns BNP.

The substrate SUB may be a driving substrate including suitable circuit elements, for example, such as the transistors constituting the pixel circuit PXC (e.g., see FIG. 3) of each pixel PXL. For example, the substrate SUB may use a CMOS substrate including a combination of NMOS and PMOS, but the present disclosure is not limited thereto.

The bank patterns BNP may be disposed at (e.g., in or on) a boundary between the first to third pixels PXL1, PXL2, and PXL3 on the substrate SUB. Each of the bank patterns BNP may be provided in a suitable shape extending in one direction. For example, each of the bank patterns BNP may be provided on the substrate SUB in a shape extending in the third direction (e.g., the Z-axis direction) from the substrate SUB.

The bank patterns BNP may include a first semiconductor layer B1, a second semiconductor layer B3, and an active layer B2 interposed between the first and second semiconductor layers B1 and B3. For example, the first semiconductor layer B1, the active layer B2, and the second semiconductor layer B3 of the bank patterns BNP may be sequentially stacked on the substrate SUB in the third direction (e.g., the Z-axis direction).

The first semiconductor layer B1 of the bank patterns BNP may include, for example, at least one p-type semiconductor layer. For example, the first semiconductor layer B1 of the bank patterns BNP may include at least one semiconductor material of GaN, InGaN, InAlGaN, AlGaN, or AlN, and may include the p-type semiconductor layer doped with a first conductive dopant (e.g., a p-type dopant), such as Mg, Zn, Ca, Sr, Ba, and/or the like. For example, the first semiconductor layer B1 of the bank patterns BNP may include a GaN semiconductor material doped with the first conductive dopant (e.g., the p-type dopant), but the present disclosure is not limited thereto. The first semiconductor layer B1 of the bank patterns BNP may be formed of various suitable other materials.

The active layer B2 of the bank patterns BNP may be disposed between the first semiconductor layer B1 and the second semiconductor layer B3. The active layer B2 of the bank patterns BNP may include any one of a single well structure, a multiple well structure, a single quantum well structure, a multi quantum well (MQW) structure, a quantum dot structure, or a quantum line structure, but the present disclosure is not limited thereto. The active layer B2 of the bank patterns BNP may include GaN, InGaN, InAlGaN, AlGaN, or AlN, but the present disclosure is not limited thereto, and various other suitable materials may constitute the active layer B2 of the bank patterns BNP.

The second semiconductor layer B3 of the bank patterns BNP may be disposed on the active layer B2, and may include a semiconductor layer of a different kind from that of the first semiconductor layer B1. In an embodiment, the second semiconductor layer B3 of the bank patterns BNP may include at least one n-type semiconductor layer. For example, the second semiconductor layer B3 of the bank patterns BNP may include a suitable semiconductor material, such as GaN, InGaN, InAlGaN, AlGaN, or AlN, and a second conductive dopant (e.g., Si, Ge, Sn, or the like). As another example, the second semiconductor layer B3 may be an n-type semiconductor layer doped with an n-type dopant. For example, the second semiconductor layer B3 of the bank patterns BNP may include a GaN semiconductor material doped with the second conductive dopant (e.g., the n-type dopant). However, the material constituting the second semiconductor layer B3 of the bank patterns BNP is not limited thereto, and the second semiconductor layer B3 of the bank patterns BNP may be formed of various other suitable materials.

According to one or more embodiments, the bank patterns BNP may further include mask layers MK1 and MK2 disposed on the second semiconductor layer B3. The mask layers MK1 and MK2 may include a first mask layer MK1 disposed on the second semiconductor layer B3, and a second mask layer MK2 disposed on the first mask layer MK1. The first mask layer MK1 and the second mask layer MK2 may be formed of different materials from each other. For example, the first mask layer MK1 may include silicon oxide (SiOx), and the second mask layer MK2 may include nickel (Ni), but the present disclosure is not limited thereto.

The light-emitting elements LD may be disposed at (e.g., in or on) each of the first to third pixels PXL1, PXL2, and PXL3. The light-emitting elements LD may be disposed on the substrate SUB between side surfaces of the bank patterns BNP.

Each of the light-emitting elements LD may be provided in various suitable shapes. For example, the light-emitting elements LD may have a rod or rod-like shape or a bar or bar-like shape that is longer in the third direction (e.g., the Z-axis direction), for example, with an aspect ratio greater than 1, but the present disclosure is not limited thereto. For example, each of the light-emitting elements LD may have a pillar shape in which a diameter of one end and a diameter of another end are different from each other. In addition, the light-emitting elements LD may be light-emitting diodes (LED) manufactured in an ultra-small size to have a diameter and/or a length of about a nanometer scale to a micrometer scale. However, the present disclosure is not limited thereto, and the size of the light-emitting elements LD may be variously modified according to requirements (or design conditions) of a lighting device or a display device to which the light-emitting elements LD are applied.

The light-emitting elements LD may include a first semiconductor layer L1, a second semiconductor layer L3, and an active layer L2 interposed between the first and second semiconductor layers L1 and L3. For example, the first semiconductor layer L1, the active layer L2, and the second semiconductor layer L3 of the light-emitting elements LD may be sequentially stacked in the third direction (e.g., the Z-axis direction) on the substrate SUB.

The first semiconductor layer L1 of the light-emitting elements LD may include, for example, at least one p-type semiconductor layer. For example, the first semiconductor layer L1 of the light-emitting elements LD may include at least one semiconductor material of GaN, InGaN, InAlGaN, AlGaN, or AlN, and may include the p-type semiconductor layer doped with the first conductive dopant (e.g., the p-type dopant), such as Mg, Zn, Ca, Sr, Ba, and/or the like. For example, the first semiconductor layer L1 of the light-emitting elements LD may include a GaN semiconductor material doped with the first conductive dopant (e.g., the p-type dopant), but the present disclosure is not limited thereto. The first semiconductor layer L1 of the light-emitting elements LD may be formed of various other suitable materials.

The active layer L2 of the light-emitting elements LD may be disposed between the first semiconductor layer L1 and the second semiconductor layer L3. The active layer L2 of the light-emitting elements LD may include any one of a single well structure, a multi well structure, a single quantum well structure, a multi quantum well (MQW) structure, a quantum dot structure, or a quantum line structure, but the present disclosure is not limited thereto. The active layer L2 of the light-emitting elements LD may include GaN, InGaN, InAlGaN, AlGaN, or AlN, but the present disclosure is not limited thereto, and various other suitable materials may constitute the active layer L2 of the light-emitting elements LD.

When a suitable signal or voltage (e.g., a predetermined signal or voltage) is applied to each end of the light-emitting elements LD, each light-emitting element LD emits light while electron-hole pairs are combined in the active layer L2 of the light-emitting elements LD. By controlling the light-emitting of each light-emitting element LD as described above, the light-emitting element LD may be used as a light source of various suitable light-emitting elements or devices including the pixel PXL of a display device.

According to one or more embodiments, an electron blocking layer (EBL) may be further disposed between the active layer L2 and the first semiconductor layer L1 of the light-emitting elements LD. The electron blocking layer may block the flow of electrons supplied from the second semiconductor layer L3 from escaping to the first semiconductor layer L1, thereby increasing the electron-hole recombination probability in the active layer L2. The energy bandgap of the electron blocking layer may be greater than that of the active layer L2 and/or the first semiconductor layer L1, but the present disclosure is not limited thereto.

According to one or more embodiments, a super lattice layer (SLL) may be further disposed between the active layer L2 and the second semiconductor layer L3 of the light-emitting elements LD. The super lattice layer may relieve a stress of the active layer L2 and the second semiconductor layer L3 to improve the quality of the light-emitting elements LD. For example, the super lattice layer may be formed in a structure in which InGaN and GaN are alternately stacked, but the present disclosure is not limited thereto.

The second semiconductor layer L3 of the light-emitting elements LD may be disposed on the active layer L2, and may include a semiconductor layer of a different kind from that of the first semiconductor layer L1. In an embodiment, the second semiconductor layer L3 of the light-emitting elements LD may include at least one n-type semiconductor layer. For example, the second semiconductor layer L3 of the light-emitting elements LD may include a suitable semiconductor material, such as GaN, InGaN, InAlGaN, AlGaN, or AlN, and may be an n-type semiconductor layer doped with a second conductive dopant (e.g., an n-type dopant), such as Si, Ge, Sn, and/or the like. For example, the second semiconductor layer L3 of the light-emitting elements LD may include a GaN semiconductor material doped with the second conductive dopant (e.g., the n-type dopant). However, the material constituting the second semiconductor layer L3 of the light-emitting elements LD is not limited thereto, and various suitable materials may be used to form the second semiconductor layer L3 of the light-emitting elements LD.

In an embodiment, the light-emitting elements LD and the bank patterns BNP may include the same material as each other. For example, the first semiconductor layer L1, the active layer L2, and/or the second semiconductor layer L3 of the light-emitting elements LD may include the same materials as those of the first semiconductor layer B1, the active layer B2, and/or the second semiconductor layer B3, respectively, of the above-described bank patterns BNP. In this case, the first semiconductor layer L1, the active layer L2, and/or the second semiconductor layer L3 of the light-emitting elements LD may be concurrently (e.g., simultaneously) formed in the same or substantially the same process as those of the first semiconductor layer B1, the active layer B2, and/or the second semiconductor layer B3, respectively, of the bank patterns BNP. Accordingly, the manufacturing process of the display device may be simplified to secure process economics. The manufacturing method will be described in more detail below with reference to FIGS. 19 to 21.

The light-emitting elements LD may be disposed on the first electrode ET1 provided on the substrate SUB. For example, the first semiconductor layer L1 of the light-emitting elements LD may be disposed on the first electrode ET1 to be electrically connected to the first electrode ET1. The first electrode ET1 may include a metal or a metal oxide. For example, the first electrode ET1 may include copper (Cu), gold (Au), chromium (Cr), titanium (Ti), aluminum (Al), nickel (Ni), indium tin oxide (ITO), oxides or alloys thereof, and/or the like, and may include an oxide or an alloy, but the present disclosure is not limited thereto. The first electrode ET1 may correspond to the first electrode EL1 described above with reference to FIG. 3.

According to one or more embodiments, connection electrodes CE1 and CE2 may be further disposed between the substrate SUB and the light-emitting elements LD and/or the bank patterns BNP. The connection electrodes CE1 and CE2 may include a first connection electrode CE1 provided between the light-emitting elements LD and the substrate SUB, and a second connection electrode CE2 provided between the bank patterns BNP and the substrate SUB.

The first connection electrode CE1 may be disposed between the first semiconductor layer L1 of the light-emitting elements LD and the first electrode ET1 provided on the substrate SUB. The light-emitting elements LD may be electrically connected to the first electrode ET1 provided on the substrate SUB through the first connection electrode CE1.

The second connection electrode CE2 may include the same material as that of the first connection electrode CE1. For example, each of the first and second connection electrodes CE1 and CE2 may include a metal or a metal oxide. For example, each of the first and second connection electrodes CE1 and CE2 may include copper (Cu), gold (Au), chromium (Cr), titanium (Ti), aluminum (Al), nickel (Ni), indium tin oxide (ITO), oxides or alloys thereof, and/or the like, but the present disclosure is not limited thereto. The second connection electrode CE2 may be concurrently (e.g., simultaneously) formed in the same process as that of the first connection electrode CE1, but the present disclosure is not limited thereto.

According to one or more embodiments, a hard mask layer HM may be further disposed between the bank patterns BNP and the second connection electrode CE2. The hard mask layer HM may be disposed between the first semiconductor layer B1 and the second connection electrode CE2 of the bank patterns BNP. However, the present disclosure is not limited thereto, and in other embodiments, the hard mask layer HM may be omitted as needed or desired.

An insulating layer INS may be provided on surfaces of the light-emitting elements LD and/or the bank patterns BNP. The insulating layer INS may be provided on side surfaces of the light-emitting elements LD and/or the bank patterns BNP. The insulating layer INS may prevent or substantially prevent an electrical short that may occur when the active layer L2 of the light-emitting elements LD contacts conductive materials other than the first and second semiconductor layers L1 and L3. In addition, the insulating layer INS may reduce or minimize surface defects of the light-emitting elements LD, thereby improving a lifespan and luminous efficiency of the light-emitting elements LD.

The insulating layer INS may cover the side surfaces of the light-emitting elements LD and/or the bank patterns BNP, but may be partially removed to expose upper surfaces of the light-emitting elements LD and/or the bank patterns BNP. For example, the insulating layer INS may cover side surfaces of the light-emitting elements LD, but may be partially removed to expose the second semiconductor layer L3 of the light-emitting elements LD.

The insulating layer INS may include silicon oxide (SiOx), silicon nitride (SiNx), silicon oxynitride (SiOxNy), silicon oxycarbide (SiOxCy), aluminum oxide (AlOx), aluminum nitride (AlNx), zirconium oxide (ZrOx), hafnium oxide (HfOx), or titanium oxide (TiOx), but the present disclosure is not limited thereto.

The second electrode ET2 may be disposed on the light-emitting elements LD. The second electrode ET2 may be directly disposed on the upper surface of the light-emitting elements LD exposed by the insulating layer INS, and may be in contact with the second semiconductor layer L3 of the light-emitting elements LD. The second electrode ET2 may be disposed over the first to third pixels PXL1, PXL2, and PXL3. The second electrode ET2 may correspond to the second electrode EL2 described above with reference to FIG. 3.

The second electrode ET2 may be formed of various suitable transparent conductive materials. For example, the second electrode ET2 may include at least one of various suitable transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be transparent or substantially transparent or translucent to satisfy a desired light transmittance (e.g., a predetermined light transmittance). Accordingly, the light emitted from the light-emitting elements LD may pass through the second electrode ET2, and may be emitted to the outside of the display panel PNL.

The color conversion layer CCL may be disposed on the light-emitting elements LD. The color conversion layer CCL may be disposed between the bank patterns BNP. The color conversion layer CCL may be disposed between the side surfaces of the bank patterns BNP on the light-emitting elements LD. In other words, the color conversion layer CCL may be provided in a space or an opening defined by the bank patterns BNP. In this way, when the color conversion layer CCL is provided in a space defined by the bank patterns BNP, a separate substrate for providing the color conversion layer CCL may be omitted, thereby simplifying the manufacturing process of the display device.

In an embodiment, the color conversion layer CCL may be implanted between the bank patterns BNP by a capillary phenomenon. As such, when the color conversion layer CCL is formed between the bank patterns BNP by using the capillary phenomenon, a high-resolution display device may be realized beyond limitations that may be imposed by the photo process or the inkjet process. The capillary phenomenon will be described in more detail below with reference to FIG. 25.

The color conversion layer CCL may include quantum dots as a color conversion material that converts light emitted from the light-emitting elements LD of each pixel PXL into light of a desired color (e.g., a specific color). For example, the color conversion layer CCL may include a plurality of quantum dots dispersed in a suitable matrix material (e.g., a predetermined matrix material), such as a base resin.

In an embodiment, the first to third pixels PXL1, PXL2, and PXL3 may include the light-emitting elements LD that emit light of the same color as each other. For example, the first to third pixels PXL1, PXL2, and PXL3 may include light-emitting elements LD for emitting a third color (e.g., blue). The color conversion layer CCL may include quantum dots that convert blue light emitted from the light-emitting element LD into white light. For example, the color conversion layer CCL may include a first quantum dot that converts blue light emitted from the blue light-emitting element into red light, and a second quantum dot that converts blue light into green light, but the present disclosure is not limited thereto. When a quantum dot is used as the color conversion material, the absorption coefficient of the quantum dot may be increased by injecting blue light having a relatively short wavelength in the visible light range to the quantum dot. Accordingly, the light efficiency emitted from the pixels PXL may be improved, and excellent color reproducibility may be secured. In addition, the light-emitting unit EMU of the first to third pixels PXL1, PXL2, and PXL3 may be composed of the light-emitting elements LD (e.g., the blue light-emitting elements) of the same color as each other, and thus, manufacturing efficiency of the display device may be increased. However, the present disclosure is not limited thereto, and the first to third pixels PXL1, PXL2, and PXL3 may include light-emitting elements LD that emit light of different colors from each other. For example, the first pixel PXL1 may include a first color (e.g., red) light-emitting element LD, the second pixel PXL2 may include a second color (e.g., green) light-emitting element LD, and the third pixel PXL3 may include a third color (e.g., blue) light-emitting element LD.

A protective layer PS may be disposed on the color conversion layer CCL. The protective layer PS may directly cover the color conversion layer CCL. The protective layer PS may be disposed over the first to third pixels PXL1, PXL2, and PXL3. The protective layer PS may prevent or substantially prevent impurities, such as moisture and/or air, from penetrating from the outside and damaging or contaminating the color conversion layer CCL. One surface of the protective layer PS may be in contact with the color conversion layer CCL, and another surface of the protective layer PS may be in contact with a color filter layer CFL.

In an embodiment, the protective layer PS may include an organic material, for example, such as acrylates resin, epoxy resin, phenolic resin, polyamides resin, polyimides resin, polyesters resin, polyphenylenesulfides resin, or benzocyclobutene (BCB), but the present disclosure is not limited thereto.

According to one or more embodiments, the protective layer PS may include an inorganic material, for example, such as silicon oxide (SiOx), silicon nitride (SiNx), silicon oxynitride (SiOxNy), silicon oxycarbide (SiOxCy), aluminum oxide (AlOx), aluminum nitride (AlNx), zirconium oxide (ZrOx), hafnium oxide (HfOx), or titanium oxide (TiOx).

The color filter layer CFL may be disposed on the protective layer PS. The color filter layer CFL may be disposed between the bank patterns BNP (e.g., in a plan view). The color filter layer CFL may include color filters CF1, CF2, and CF3 corresponding to the color of each pixel PXL. A full-color image may be displayed by disposing the color filters CF1, CF2, and CF3 corresponding to the colors of the first to third pixels PXL1, PXL2, and PXL3, respectively.

The color filter layer CFL may include a first color filter CF1, a second color filter CF2, and a third color filter CF3. The first color filter CF1 may be disposed at (e.g., in or on) the first pixel PXL1, and may selectively transmit light emitted from the first pixel PXL1. The second color filter CF2 may be disposed at (e.g., in or on) the second pixel PXL2, and may selectively transmit light emitted from the second pixel PXL2. The third color filter CF3 may be disposed at (e.g., in or on) the third pixel PXL3, and may selectively transmit light emitted from the third pixel PXL3.

In an embodiment, the first color filter CF1, the second color filter CF2, and the third color filter CF3 may be a red color filter, a green color filter, and a blue color filter, respectively, but the present disclosure is not limited thereto. Hereinafter, the term "color filter CF" or "color filters CF" may refer to any color filter of the first color filter CF1, the second color filter CF2, and the third color filter CF3, or may refer to two or more of these color filters collectively.

The first color filter CF1 may overlap with the light-emitting element LD and the color conversion layer CCL of the first pixel PXL1 in the third direction (e.g., the Z-axis direction). The first color filter CF1 may include a color filter material that selectively transmits light of a first color (e.g., red). For example, when the first pixel PXL1 is the red pixel, the first color filter CF1 may include a red color filter material.

The second color filter CF2 may overlap with the light-emitting element LD and the color conversion layer CCL of the second pixel PXL2 in the third direction (e.g., the Z-axis direction). The second color filter CF2 may include a color filter material that selectively transmits light of the second color (e.g., green). For example, when the second pixel PXL2 is the green pixel, the second color filter CF2 may include a green color filter material.

The third color filter CF3 may overlap with the light-emitting element LD and the color conversion layer CCL of the third pixel PXL3 in the third direction (e.g., the Z-axis direction). The third color filter CF3 may include a color filter material that selectively transmits light of a third color (e.g., blue). For example, when the third pixel PXL3 is the blue pixel, the third color filter CF3 may include a blue color filter material.

A reflective layer RF may be disposed between the bank patterns BNP and the color conversion layer CCL. The reflective layer RF may reflect light emitted from the light-emitting elements LD to improve the light-output efficiency of the display panel PNL. In addition, the reflective layer RF may be disposed on side surfaces of the bank patterns BNP to prevent or substantially prevent color mixing between adjacent ones of the pixels PXL. The material of the reflective layer RF is not particularly limited, and may include various suitable reflective materials.

The reflective layer RF may be further disposed between the light-emitting elements LD and the color conversion layer CCL. For example, the reflective layer RF may be disposed on the side surfaces of the light-emitting elements LD to reflect light emitted from the light-emitting elements LD, thereby improving the light-output efficiency of the display panel PNL.

A light blocking layer BM may be further disposed between the first to third color filters CF1, CF2, and CF3, and the light blocking layer BM may be disposed at (e.g., in or on) the non-light-emitting area NEA. The light blocking layer BM may be disposed at a boundary between the first to third light-emitting areas EMA1, EMA2, and EMA3. As such, when the light blocking layer BM is formed at the boundary between the first to third light-emitting regions EMA1, EMA2, and EMA3, color mixing defects that may be visible from the front or side surfaces of the display device may be prevented or reduced. The material of the light blocking layer BM is not particularly limited, and may include various suitable light blocking materials.

According to the embodiment illustrated in FIG. 7, the first light-emitting elements LD and the bank patterns BNP may be concurrently (e.g., simultaneously) formed, and the color conversion layer CCL may be implanted between the bank patterns BNP, or in other words, in a space or an opening surrounded (e.g., around a periphery thereof) by the bank patterns BNP, thereby simplifying the manufacturing process of the display device and realizing a high-resolution display device.

Figure 8:
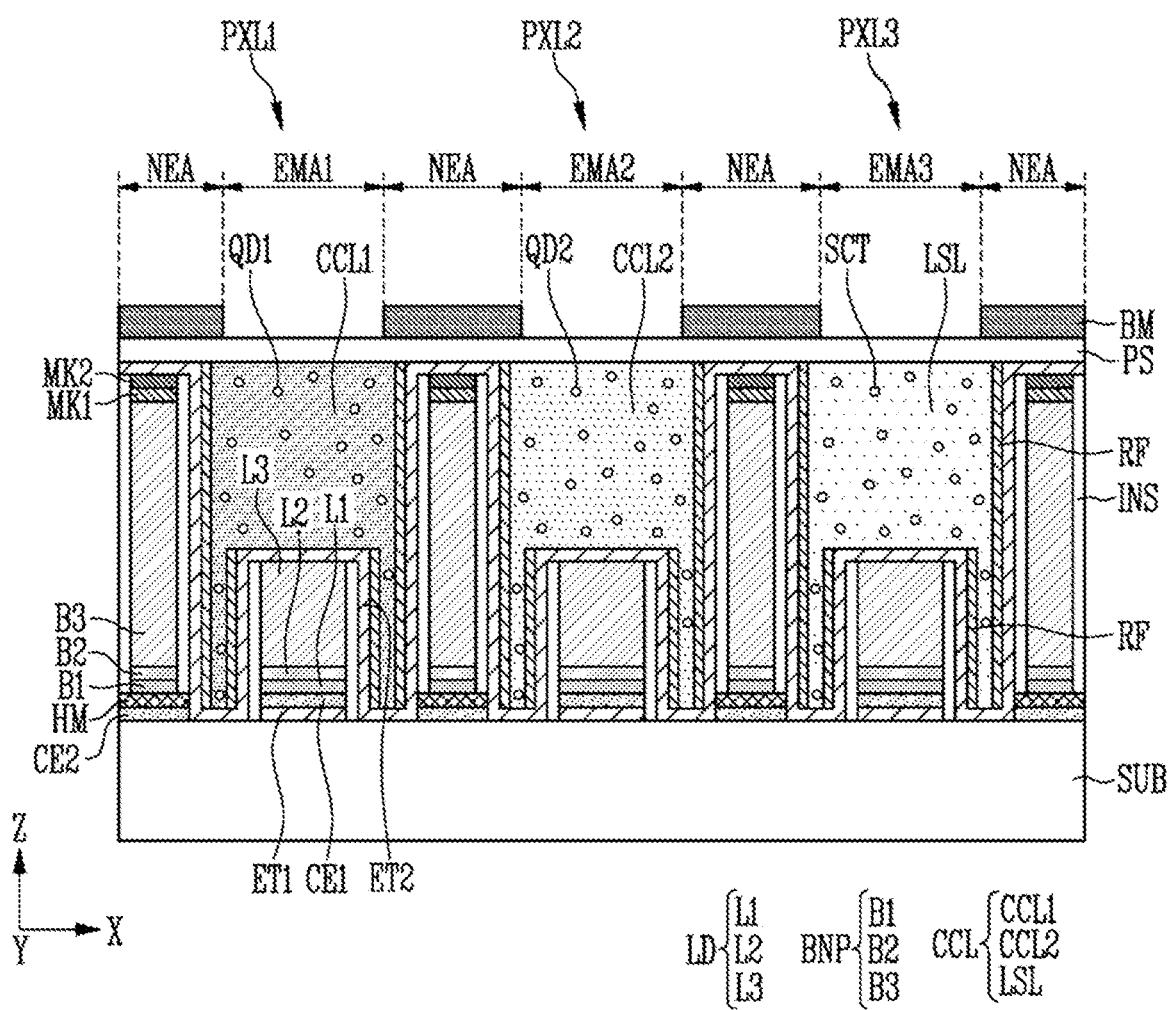
FIG. 8 is a cross-sectional view illustrating a pixel according to another embodiment.

FIG. 8 is a cross-sectional view illustrating a pixel according to another embodiment.

Referring to FIG. 8, the present embodiment may be different from the embodiment shown in FIG. 7, in that in the embodiment of FIG. 8, the color filter layer CFL may be omitted, and the color conversion layer CCL may include a first color conversion layer CCL1 disposed at (e.g., in or on) the first pixel PXL1, a second color conversion layer CCL2 disposed at (e.g., in or on) the second pixel PXL2, and a light scattering layer LSL disposed at (e.g., in or on) the third pixel PXL3.

In an embodiment, the first to third pixels PXL1, PXL2, and PXL3 may include the light-emitting elements LD that emit light of the same color as each other. For example, the first to third pixels PXL1, PXL2, and PXL3 may include light-emitting elements LD that emit light of a third color (e.g., blue). The color conversion layer CCL including color conversion particles may be disposed at (e.g., in or on) the first to third pixels PXL1, PXL2, and PXL3, so that a full-color image may be displayed.

The first color conversion layer CCL1 may include first color conversion particles that convert light of the third color emitted from the light-emitting element LD into light of the first color. For example, the first color conversion layer CCL1 may include a plurality of first quantum dots QD1 dispersed in a suitable matrix material (e.g., a predetermined matrix material), such as a base resin.

In an embodiment, when the light-emitting element LD is a blue light-emitting element for emitting blue light, and the first pixel PXL1 is a red pixel, the first color conversion layer CCL1 may include a first quantum dot QD1 that converts light of the blue color emitted from the blue light-emitting element into the light of the red color. The first quantum dot QD1 may absorb blue light to shift a wavelength according to an energy transition, thereby emitting red light. On the other hand, when the first pixel PXL1 is a pixel of a different color, the first color conversion layer CCL1 may include a first quantum dot QD1 corresponding to the different color of the first pixel PXL1.

The second color conversion layer CCL2 may include second color conversion particles that convert light of the third color emitted from the light-emitting element LD into light of the second color. For example, the second color conversion layer CCL2 may include a plurality of second quantum dots QD2 dispersed in a suitable matrix material (e.g., a predetermined matrix material), such as a base resin.

In an embodiment, when the light-emitting element LD is a blue light-emitting element for emitting blue light, and the second pixel PXL2 is a green pixel, the second color conversion layer CCL2 may include a second quantum dot QD2 that converts the blue light emitted from the blue light-emitting element into the green light. The second quantum dot QD2 may absorb blue light to shift a wavelength according to an energy transition, thereby emitting green light. On the other hand, when the second pixel PXL2 is a pixel of a different color, the second color conversion layer CCL2 may include a second quantum dot QD2 corresponding to the different color of the second pixel PXL2.

In an embodiment, the absorption coefficient of the first quantum dot QD1 and the second quantum dot QD2 may be increased by injecting blue light having a relatively short wavelength in the visible light range to the first quantum dot QD1 and the second quantum dot QD2. Accordingly, the light efficiency emitted from the first pixel PXL1 and the second pixel PXL2 may be improved, and excellent color reproducibility may be secured. In addition, the light-emitting unit EMU of the first to third pixels PXL1, PXL2, and PXL3 may be composed of the light-emitting elements LD (e.g., the blue light-emitting elements) of the same color as each other, and thus, manufacturing efficiency of the display device may be increased.

The light scattering layer LSL may be provided to efficiently use the light of the third color (e.g., blue) emitted from the light-emitting element LD. For example, when the light-emitting element LD is a blue light-emitting element for emitting blue light, and the third pixel PXL3 is a blue pixel, the light scattering layer LSL may include at least one kind of light scattering particles SCT to efficiently use the light emitted from the light-emitting element LD.

For example, the light scattering layer LSL may include a plurality of light scattering particles SCT dispersed in a suitable matrix material (e.g., a predetermined matrix material), such as a base resin. For example, the light scattering layer LSL may include the light scattering particles SCT, such as silica, but the material of the light scattering particles SCT is not limited thereto. Further, the light scattering particles SCT may not only be disposed at (e.g., in or on) the third pixel PXL3, but may also be selectively included in the first color conversion layer CCL1 or the second color conversion layer CCL2 as needed or desired. However, the present disclosure is not limited thereto, and according to one or more embodiments, the light scattering layer LSL may be omitted, or a transparent polymer may be provided instead of the light scattering layer LSL.

A protective layer PS may be disposed on the color conversion layer CCL. The protective layer PS may cover the second surface S2 of the base layer BSL and/or the color conversion layer CCL. The protective layer PS may prevent or substantially prevent impurities, such as moisture and/or air, from penetrating from the outside and damaging or contaminating the color conversion layer CCL.

In an embodiment, the protective layer PS may include at least one inorganic layer. For example, the inorganic layer may include one or more suitable inorganic materials, such as aluminum nitride (AlNx), silicon oxide (SiOx), silicon nitride (SiNx), silicon oxynitride (SiOxNy), zirconium oxide (ZrOx), hafnium oxide (HfOx), titanium oxide (TiOx), or the like, but the present disclosure is not limited thereto.

According to one or more embodiments, the protective layer PS may include at least one organic layer. For example, the organic layer may include an organic material, such as acrylates resin, epoxy resin, phenolic resin, polyamides resin, polyimides resin, polyesters resin, polyphenylenesulfides resin, or benzocyclobutene (BCB), but the present disclosure is not limited thereto.

According to one or more embodiments, a light blocking layer BM may be further disposed on the protective layer PS. The light blocking layer BM may be disposed at a boundary between the first to third light-emitting areas EMA1, EMA2, and EMA3. As such, when the light blocking layer BM is formed at the boundary between the first to third light-emitting regions EMA1, EMA2, and EMA3, color mixing defects that may be visible from the front or side surfaces of the display device may be prevented or reduced.

Hereinafter, a manufacturing method of the display device according to one or more of the above-described embodiments will now be described in more detail.

FIGS. 9 to 18 are cross-sectional views illustrating process steps of a manufacturing method of a display device according to an embodiment. FIGS. 9 to 18 are cross-sectional views illustrating a manufacturing method of the display device shown in FIG. 4, and thus, constituent elements thereof that are the same or substantially the same as (or similar to) those shown in FIG. 4 are denoted by the same reference symbols. Accordingly, redundant description thereof may not be repeated in the description below with reference to FIGS. 9 to 18.

Figure 9:
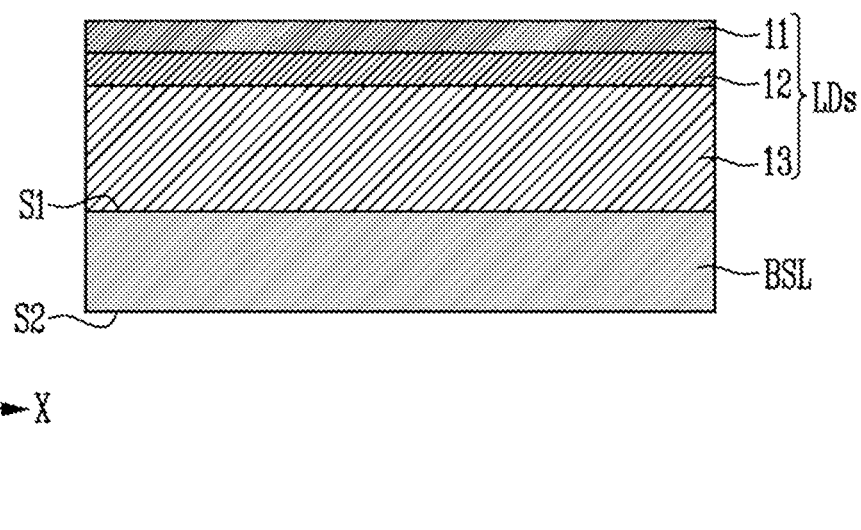
FIGS. 9-18 are cross-sectional views illustrating process steps of a manufacturing method of a display device according to an embodiment.

First, referring to FIGS. 4 and 9, a light-emitting stack LDs is formed on the first surface S1 of the base layer BSL. The base layer BSL may be formed of a silicon wafer, such that the above-described fine groove patterns PT may be easily formed, but the present disclosure is not limited thereto. For example, the constituent material of the base layer BSL may be any suitable growth substrate, and may be variously modified within a range capable of micro-processing.

The light-emitting stack LDs may be formed by growing seed crystals by an epitaxial method. According to one or more embodiments, the light-emitting stack LDs may be formed by metal organic chemical vapor deposition (MOCVD). However, the present disclosure is not limited thereto, and the light-emitting stack LDs may be formed by various suitable methods, for example, such as electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like.

The light-emitting stack LDs may include a first semiconductor layer 11, an active layer 12, and a second semiconductor layer 13 that may be epitaxially grown on the base layer BSL. Because the first semiconductor layer 11, the active layer 12, and the second semiconductor layer 13 have been described above with reference to FIG. 4 and the like, redundant description thereof will not be repeated.

Figure 10:
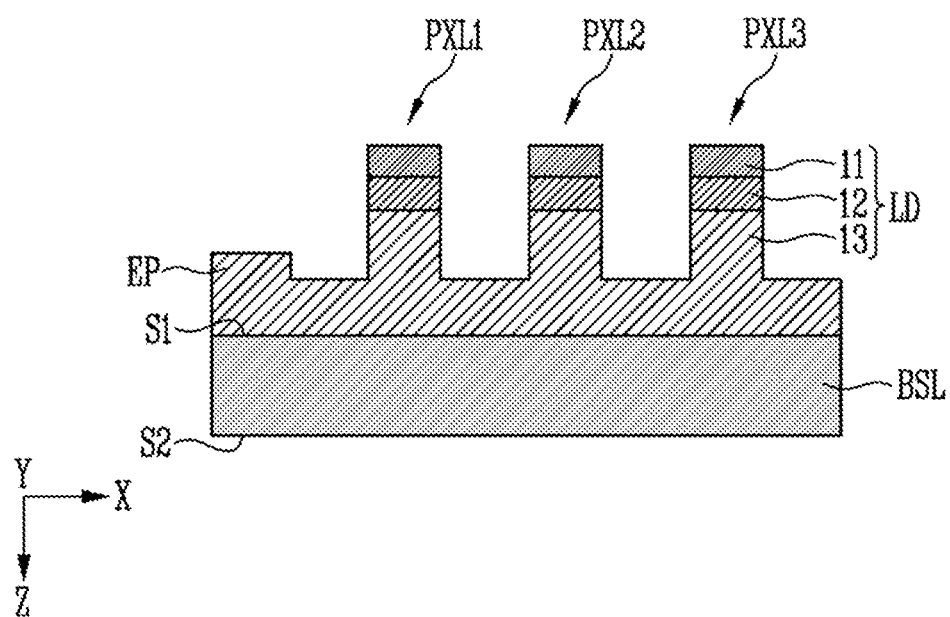

Referring to FIG. 10, the light-emitting stack LDs may then be etched to form the light-emitting elements LD and/or the electrode part EP on the first surface S1 of the base layer BSL. The light-emitting elements LD may be formed at (e.g., in or on) the first to third pixels PXL1, PXL2, and PXL3, respectively. The electrode part EP may be formed around (e.g., adjacent to) the pixels PXL. The electrode part EP may be integrally formed with the second semiconductor layer 13 of the light-emitting elements LD, but the present disclosure is not limited thereto. Etching processes of the light-emitting stack LDs may include dry etching, wet etching, reactive ion etching (RIE), inductively coupled plasma reactive ion etching (ICP-RIE), and/or the like.

Figure 11:
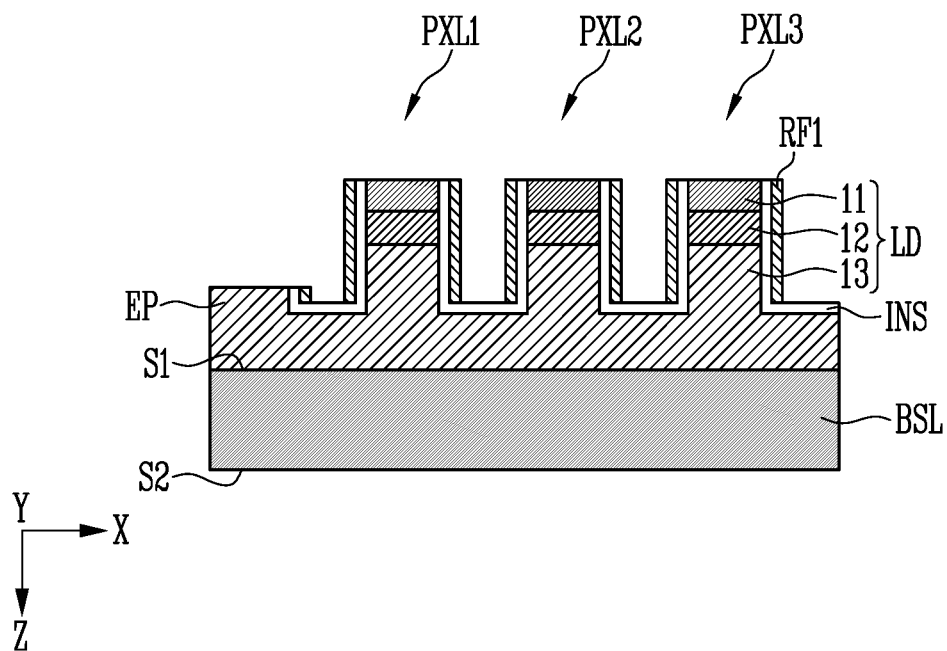

Referring to FIG. 11, an insulating layer INS and/or a first reflective layer RF1 may be formed on the light-emitting elements LD and/or the electrode part EP. The insulating layer INS may be partially formed on the side surfaces of the light-emitting elements LD and/or the electrode part EP. For example, after the insulating layer INS is formed over the first to third pixels PXL1, PXL2, and PXL3, the insulating layer INS may be partially removed to expose the upper surfaces of the light-emitting elements LD and/or the upper surface of the electrode part EP.

The first reflective layer RF1 may be partially formed on the side surfaces of the light-emitting elements LD and/or the electrode part EP. For example, after the first reflective layer RF1 is formed over the first to third pixels PXL1, PXL2, and PXL3, the first reflective layer RF1 may be partially removed to expose the upper surfaces of the light-emitting elements LD and/or the upper surfaces of the electrode part EP.

Because the insulating layer INS and/or the first reflective layer RF1 have been described above with reference to FIG. 4, redundant description thereof will not be repeated.

Figure 12:
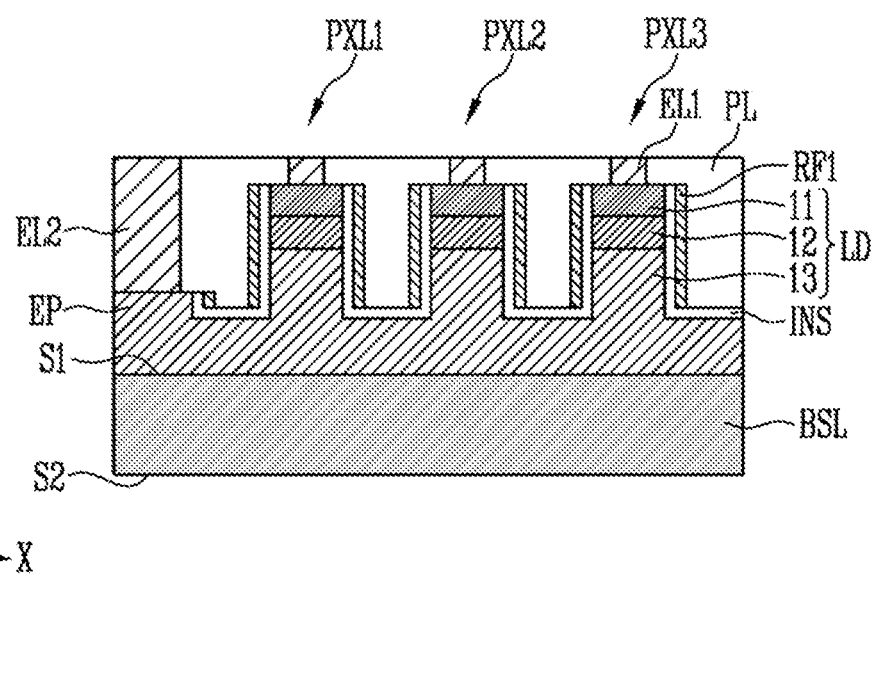

Referring to FIG. 12, a planarization layer PL, a first electrode EL1, and a second electrode EL2 may then be formed.

The planarization layer PL may be formed between the light-emitting elements LD to serve to planarize or substantially planarize steps of the light-emitting elements LD. For example, the planarization layer PL may be formed of an organic material, such as acrylates resin, epoxy resin, phenolic resin, polyamides resin, polyimides resin, polyesters resin, polyphenylenesulfides resin, or benzocyclobutene (BCB). However, the present disclosure is not limited thereto, and the planarization layer PL may be formed of an inorganic material, for example, such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first electrode EL1 may be formed on the first semiconductor layer 11 of the light-emitting elements LD. The second electrode EL2 may be formed on the electrode part EP. The first electrode EL1 and the second electrode EL2 may be formed of the same or substantially the same material as each other. The first electrode EL1 and the second electrode EL2 may be concurrently (e.g., simultaneously) formed in the same or substantially the same process, but the present disclosure is not limited thereto. For example, a portion of the planarization layer PL to be provided with the first and second electrodes EL1 and EL2 may be patterned, and a conductive layer may be formed therein. Subsequently, a chemical mechanical polish (CMP) process may be performed to concurrently (e.g., simultaneously) form the first and second electrodes EL1 and EL2. In this case, the planarization layer PL and one surface (e.g., a polished surface) of the first and second electrodes EL1 and EL2 may be disposed at (e.g., in or on) the same plane. The polished surface may refer to the above-described chemical mechanically polished flat surface. However, the process of forming the first and second electrodes EL1 and EL2 is not limited thereto, and the first and second electrodes EL1 and EL2 may be provided in various suitable ways.

Figure 13:
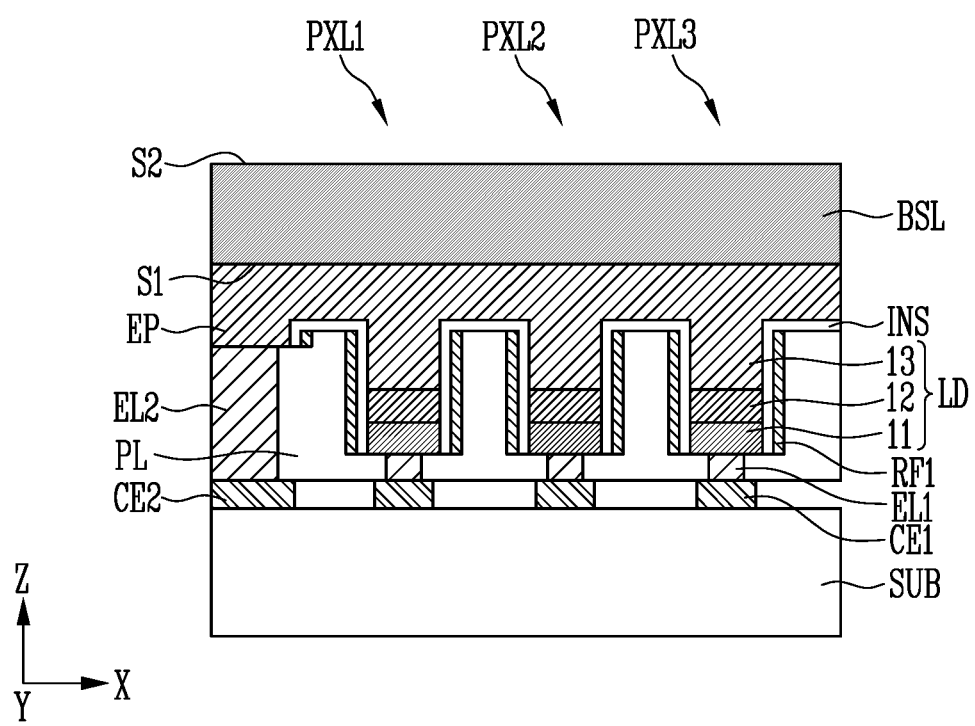

Referring to FIG. 13, the base layer BSL on which the light-emitting elements LD are formed is connected to (e.g., coupled to or attached to) the substrate SUB. As described above, when the base layer BSL on which the light-emitting elements LD are formed is directly connected to (e.g., coupled to or attached to) the substrate SUB, the process of transferring the light-emitting elements LD of an individual chip may be simplified, so that defects that may occur due to the process of transferring may be reduced or minimized, and process economics may be secured.

The substrate SUB may be a driving substrate including suitable circuit elements, for example, such as the transistors constituting the pixel circuit PXC (e.g., see FIG. 3) of each pixel PXL. For example, the substrate SUB may use a CMOS substrate including a combination of NMOS and PMOS, but the present disclosure is not limited thereto. The first electrode EL1 formed on the light-emitting elements LD may be bonded to the first connection electrode CE1 formed on the substrate SUB. Also, the second electrode EL2 formed on the electrode part EP may be bonded to the second connection electrode CE2 formed on the substrate SUB.

Each of the first and second connection electrodes CE1 and CE2 may include a metal or a metal oxide. For example, each of the first and second connection electrodes CE1 and CE2 may include copper (Cu), gold (Au), chromium (Cr), titanium (Ti), aluminum (Al), nickel (Ni), indium tin oxide (ITO), oxides or alloys thereof, and/or the like, but the present disclosure is not limited thereto. In an embodiment, the first and second connection electrodes CE1 and CE2 may be formed of the same or substantially the same material as those of the above-described first and second electrodes EL1 and EL2. In this case, the first and second connection electrodes CE1 and CE2 may be easily bonded to the first and second electrodes EL1 and EL2, respectively. However, the present disclosure is not limited thereto, and the materials constituting the first and second connection electrodes CE1 and CE2 may be variously modified as needed or desired.

Figure 14:
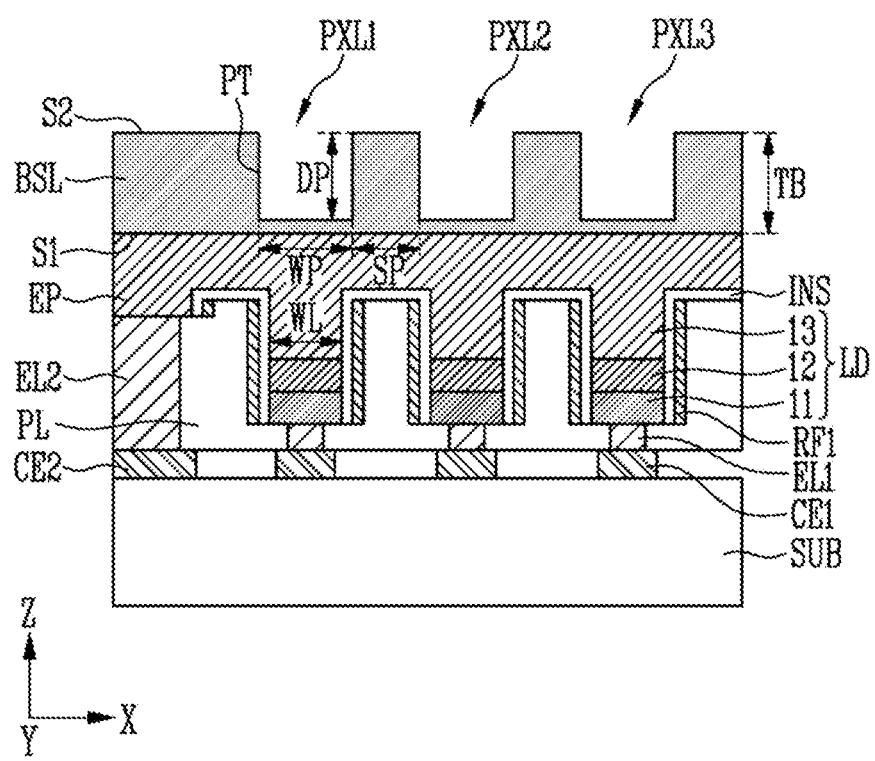

Referring to FIG. 14, the second surface S2 of the base layer BSL may then be etched to form groove patterns PT. Each of the groove patterns PT may overlap with a corresponding one of the light-emitting elements LD in the third direction (e.g., the Z-axis direction). In an embodiment, each of the groove patterns PT may completely (e.g., entirely) overlap with the corresponding one of the light-emitting elements LD in the third direction (e.g., the Z-axis direction). Accordingly, light emitted from the light-emitting elements LD may be incident into the groove patterns PT, and may be provided to the color conversion layer CCL or the like disposed inside the groove patterns PT.

The groove patterns PT may be fine patterns having a width WP in the first direction (e.g., the X-axis direction) of about a nanometer scale to a micrometer scale.

In an embodiment, the second surface S2 of the base layer BSL may be etched using deep reactive ion etching (DRIE) to form the fine groove patterns PT. However, the method of etching the base layer BSL is not limited thereto, and may be variously modified within a range capable of performing a fine process of the groove patterns PT. As described above, when the fine groove patterns PT are formed on the second surface S2 of the base layer BSL, and the color conversion layer CCL is formed inside the groove patterns PT by using a capillary phenomenon, it may be possible to realize a high-resolution display device beyond the limitations that may be imposed by the photo process or the inkjet process.

In an embodiment, the width WP of the groove patterns PT in the first direction (e.g., the X-axis direction) may be greater than the width WL of the light-emitting elements LD in the first direction (e.g., the X-axis direction). Also, the width WP of the groove patterns PT in the first direction (e.g., the X-axis direction) may be greater than a distance SP between adjacent ones of the groove patterns PT in the first direction (e.g., the X-axis direction). However, the width WP of the groove patterns PT in the first direction (e.g., the X-axis direction) is not limited thereto, and may be variously modified within a range capable of promoting the above-described capillary phenomenon.

A depth DP of the groove patterns PT in the third direction (e.g., the Z-axis direction) may be different from a thickness TB of the base layer BSL in the third direction (e.g., the Z-axis direction). For example, as shown in FIG. 14, the depth DP of the groove patterns PT in the third direction (e.g., the Z-axis direction) may be smaller than the thickness TB of the base layer BSL in the third direction (e.g., the Z-axis direction). However, the present disclosure is not limited thereto, and as described above with reference to FIG. 5, the depth DP in the third direction (e.g., the Z-axis direction) of the groove patterns PT may be equal to or substantially equal to (e.g., may be the same as) the thickness TB of the base layer BSL in the third direction (e.g., the Z-axis direction). In other words, the groove patterns PT may have a hole shape penetrating through the base layer BSL. In this case, the groove patterns PT may penetrate through the base layer BSL to expose the ends (e.g., the second semiconductor layer 13) of the light-emitting elements LD disposed thereunder.

According to one or more embodiments, side surfaces of the groove patterns PT may be perpendicular to or substantially perpendicular to a lower surface of the groove patterns PT or the second surface S2 of the base layer BSL. However, the present disclosure is not limited thereto, and the shape of the groove patterns PT may be variously modified as needed or desired. For example, the side surfaces of the groove patterns PT may have a suitable inclination angle (e.g., a predetermined inclination angle) with respect to the lower surface of the groove patterns PT or the second surface S2 of the base layer BSL. In other words, the groove patterns PT may have a trapezoidal shape with a width decreasing in the direction opposite to the third direction (e.g., the (−) Z-axis direction). As another example, the side and/or lower surfaces of the groove patterns PT may be implemented as curved surfaces.

Figure 15:
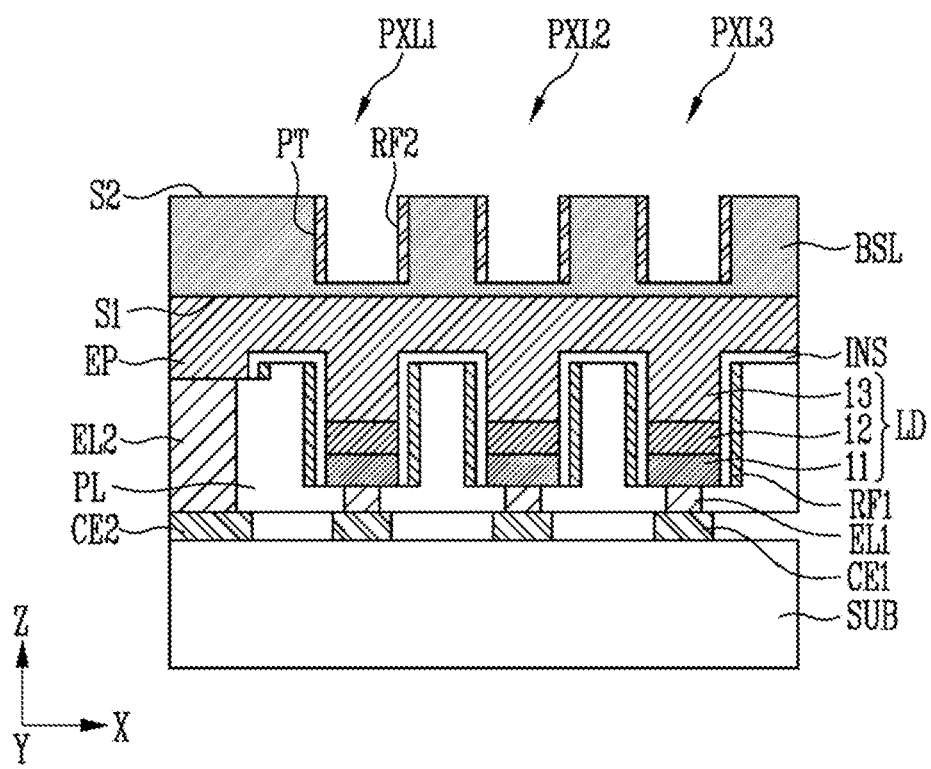

Referring to FIG. 15, a second reflective layer RF2 may then be formed on the groove patterns PT. The second reflective layer RF2 may be formed on the side surfaces of the groove patterns PT to prevent or substantially prevent color mixing between adjacent pixels PXL. Also, the second reflective layer RF2 may reflect light emitted from the light-emitting elements LD and the color conversion layer CCL, thereby improving light-output efficiency of the display panel PNL. The material of the second reflective layer RF2 is not particularly limited, and may be formed of various suitable reflective materials.

Figure 16:
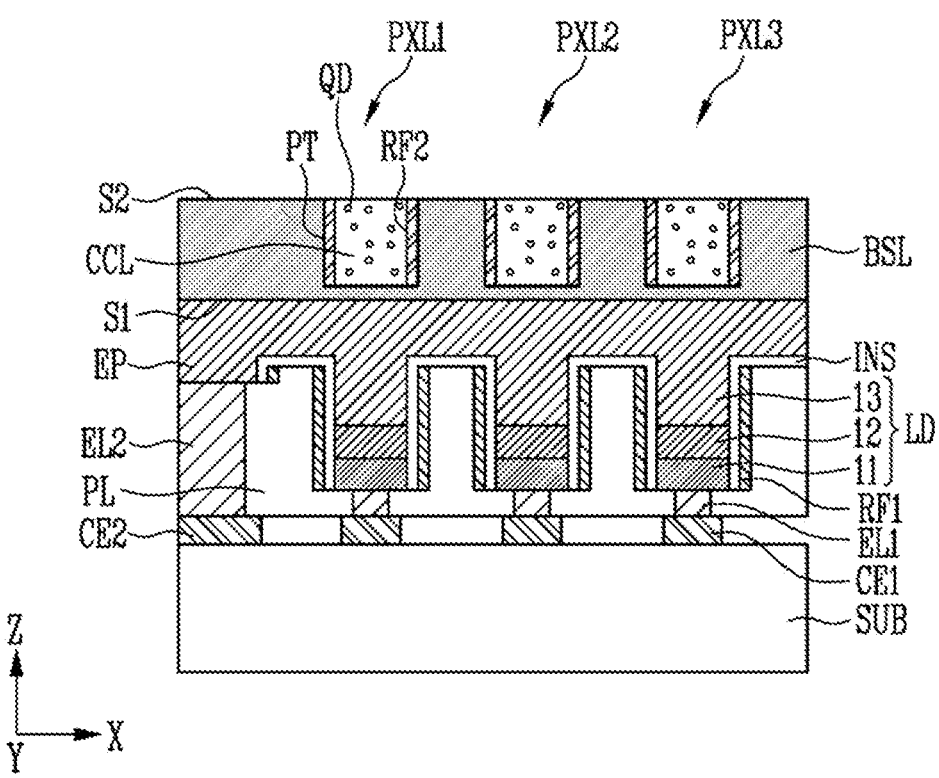

Referring to FIG. 16, a color conversion layer CCL may then be formed inside the groove patterns PT. First, the color conversion layer CCL may be provided on the second surface S2 of the base layer BSL. For example, the color conversion layer CCL may be provided on the second surface S2 of the base layer BSL by dip coating, spray coating, spin coating, or screen coating, but the present disclosure is not limited thereto. Subsequently, the color conversion layer CCL provided on the second surface S2 of the base layer BSL may be implanted into the fine groove patterns PT formed on the second surface S2 of the base layer BSL by a capillary phenomenon.

According to one or more embodiments, when groove patterns PT to which the color conversion layer CCL is not implanted exist, the color conversion layer CCL may be additionally implanted into these groove patterns PT using ultrasonic waves. However, the present disclosure is not limited thereto, and the color conversion layer CCL may be implanted into the fine groove patterns PT according to various suitable processes or methods.

As such, when the color conversion layer CCL is formed inside the fine groove patterns PT that are formed in the base layer BSL by using the capillary phenomenon, a high-resolution display device may be realized beyond limitations that may be imposed by the photo process or inkjet process.

The color conversion layer CCL may overlap with the light-emitting elements LD in the third direction (e.g., the Z-axis direction). The color conversion layer CCL may include a quantum dot QD that converts light emitted from the light-emitting elements LD of each pixel PXL into light of a desired color (e.g., a specific color). For example, the color conversion layer CCL may include a plurality of quantum dots QD dispersed in a suitable matrix material (e.g., a predetermined matrix material), such as a base resin.

In an embodiment, the first to third pixels PXL1, PXL2, and PXL3 may include the light-emitting elements LD that emit light of the same color as each other. For example, the first to third pixels PXL1, PXL2, and PXL3 may include light-emitting elements LD for emitting a third color (e.g., blue). The color conversion layer CCL may include a quantum dot QD that converts blue light emitted from the light-emitting element LD into white light. In this case, the absorption coefficient of the quantum dot QD may be increased by injecting blue light having a relatively short wavelength in the visible ray range to the quantum dot QD. Accordingly, the light efficiency emitted from the pixels PXL may be improved, and excellent color reproducibility may be secured. In addition, the light-emitting unit EMU of the first to third pixels PXL1, PXL2, and PXL3 may be composed of the light-emitting elements LD (e.g., the blue light-emitting elements) of the same color as each other, and thus, manufacturing efficiency of the display device may be increased.

As another example, as described above with reference to FIG. 6, the color conversion layer CCL may include the first color conversion layer CCL1 disposed at (e.g., in or on) the first pixel PXL1, the second color conversion layer CCL2 disposed at (e.g., in or on) the second pixel PXL2, and the light scattering layer LSL disposed at (e.g., in or on) the third pixel PXL3. A full-color image may be displayed by disposing the color conversion layer CCL including color conversion particles on the first to third pixels PXL1, PXL2, and PXL3.

As another example, the first to third pixels PXL1, PXL2, and PXL3 may include light-emitting elements LD that emit light of different colors from each other. For example, the first pixel PXL1 may include a first color (e.g., red) light-emitting element LD, the second pixel PXL2 may include a second color (e.g., green) light-emitting element LD, and the third pixel PXL3 may include a third color (e.g., blue) light-emitting element LD.

Figure 17:
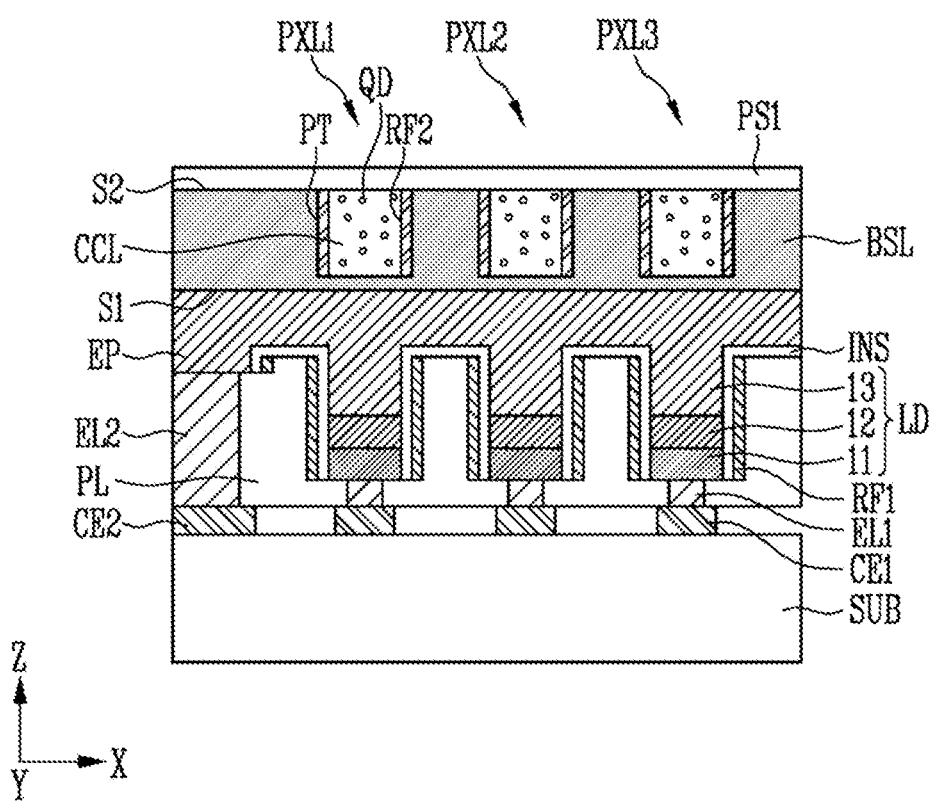

Referring to FIG. 17, a protective layer PS (e.g., a first protective player PS1) may then be formed on the color conversion layer CCL. The protective layer PS may directly cover the second surface S2 of the base layer BSL and/or the color conversion layer CCL. The protective layer PS may be formed over the first to third pixels PXL1, PXL2, and PXL3. The protective layer PS may prevent or substantially prevent impurities, such as moisture and/or air, from penetrating from the outside and damaging or contaminating the color conversion layer CCL.

The protective layer (PS) may be an inorganic layer, and may be formed of silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like, but the present disclosure is not necessarily limited thereto.

Figure 18:
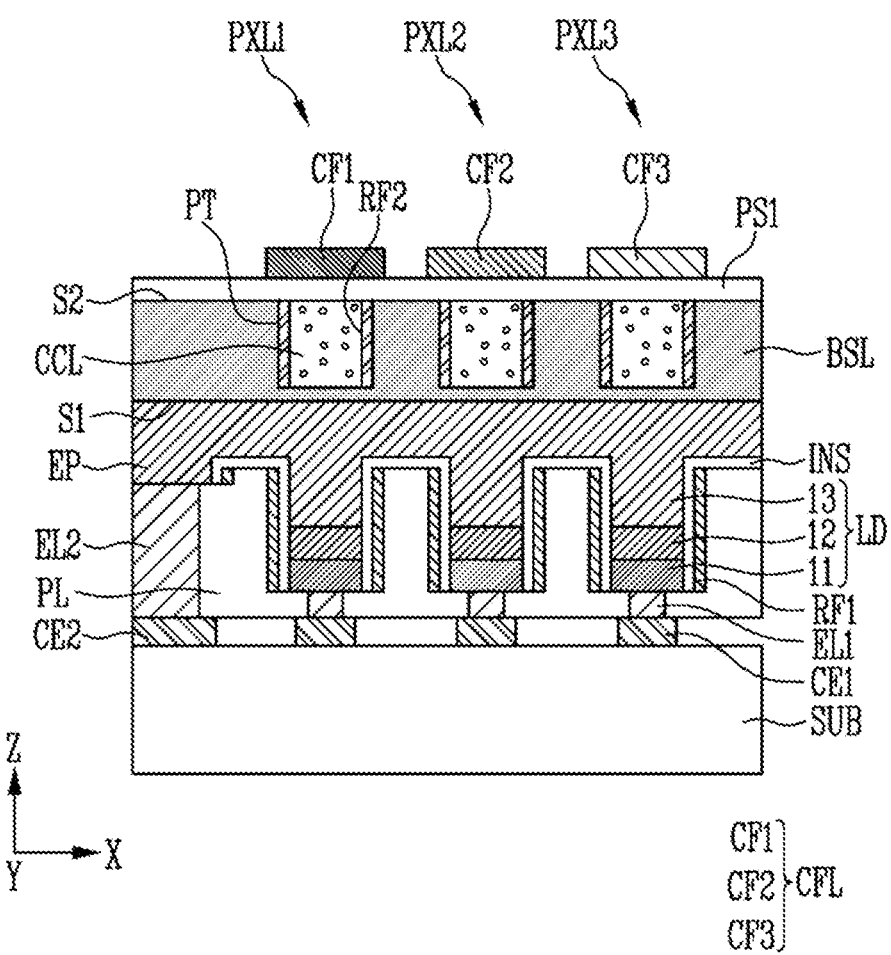

Referring to FIG. 18, a color filter layer CFL may then be formed on the protective layer PS. The color filter layer CFL may be directly formed on the protective layer PS. The color filter layer CFL may include color filters CF1, CF2, and CF3 corresponding to the color of each pixel PXL. In other words, a full-color image may be displayed by forming the color filters CF1, CF2, and CF3 to match the colors of the first to third pixels PXL1, PXL2, and PXL3, respectively. For example, the first color filter CF1 including a color filter material that selectively transmits light of a first color (e.g., red) may be formed at (e.g., in or on) the first pixel PXL1, the second color filter CF2 including a color filter material that selectively transmits light of a second color (e.g., green) may be formed at (e.g., in or on) the second pixel PXL2, and the third color filter CF3 including a color filter material that selectively transmits light of a third color (e.g., blue) may be formed at (e.g., in or on) the third pixel PXL3. The color filters CF1, CF2, and CF3 may be formed using inkjet printing or photoresist, but the present disclosure is not limited thereto.

Subsequently, the display device shown in FIG. 4 may be completed by forming the second protective layer PS2 and/or the light blocking layer BM on the color filter layer CFL. The second protective layer PS2 may cover a lower member including the color filter layer CFL. The second protective layer PS2 may prevent or substantially prevent moisture and/or air from penetrating into the above-described lower member. In addition, the second protective layer PS2 may protect the above-described lower member from foreign substances, for example, such as dust.

In an embodiment, the second protective layer PS2 may include at least one inorganic layer. For example, the inorganic layer may be formed of one or more suitable inorganic materials, such as aluminum nitride (AlNx), silicon oxide (SiOx), silicon nitride (SiNx), silicon oxynitride (SiOxNy), zirconium oxide (ZrOx), hafnium oxide (HfOx), titanium oxide (TiOx), or the like, but the present disclosure is not limited thereto.

According to one or more embodiments, the second protective layer PS2 may include at least one organic layer. For example, the organic layer may be formed of an organic material, such as acrylates resin, epoxy resin, phenolic resin, polyamides resin, polyimides resin, polyesters resin, polyphenylenesulfides resin, or benzocyclobutene (BCB), but the present disclosure is not limited thereto.

The light blocking layer BM may be formed on the second protective layer PS2. The light blocking layer BM may be disposed at (e.g., in or on) the non-light-emitting area NEA. In other words, the light blocking layer BM may be disposed at a boundary between the first to third light-emitting areas EMA1, EMA2, and EMA3. As such, when the light blocking layer BM is formed at the boundary between the first to third light-emitting regions EMA1, EMA2, and EMA3, color mixing defects that may be visible from the front or side surfaces of the display device may be prevented or reduced. The material of the light blocking layer BM is not particularly limited, and may include various suitable light blocking materials.

According to one or more embodiments described above, because the color conversion layer CCL is provided in the base layer BSL, which may be a growth substrate of the light-emitting elements LD, a separate substrate for providing the color conversion layer CCL may be omitted, thereby simplifying the manufacturing process of the display device.

In addition, a high-resolution display may be realized by forming the fine groove patterns PT in the base layer BSL, and implanting the color conversion layer CCL into the groove patterns PT using a capillary phenomenon.

Hereinafter, one or more other embodiments will be described in more detail. In the following embodiments, the same or substantially the same components as those described above are denoted by the same reference symbols, and thus, redundant description thereof may be simplified or may not be repeated.

FIGS. 19 to 25 are cross-sectional views illustrating process steps of a manufacturing method of a display device according to another embodiment.

FIGS. 19 to 25 are cross-sectional views illustrating the manufacturing method of the display device shown in FIG. 7, and thus, constituent elements thereof that are the same or substantially the same as those of FIG. 7 are denoted by the same reference symbols. Accordingly, redundant description thereof may not be repeated in the following description with reference to FIGS. 19 to 25.

Figure 19:
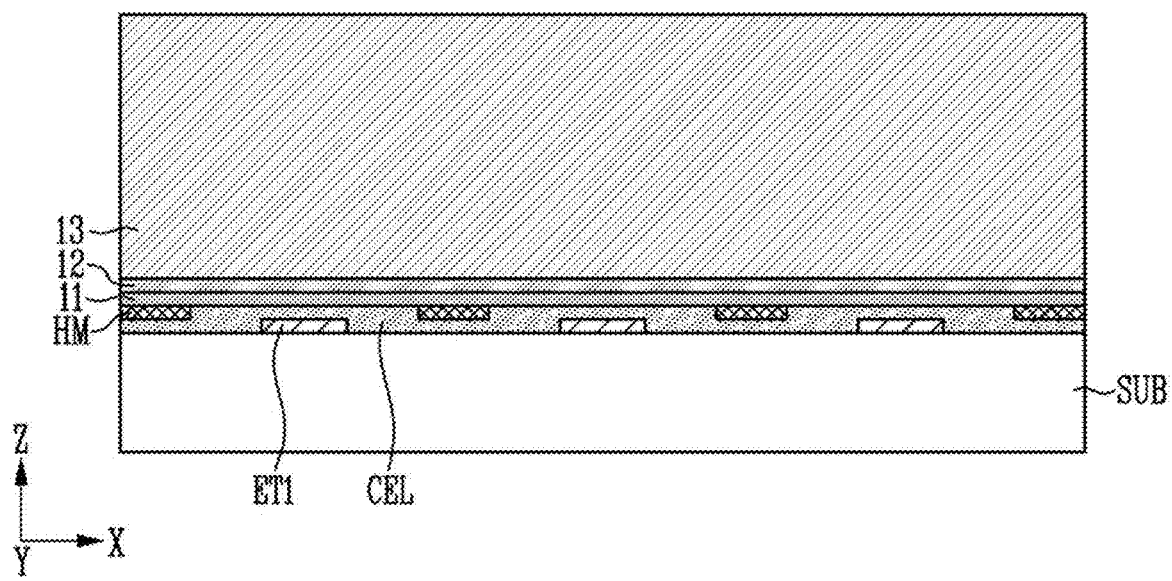
FIGS. 19-25 are cross-sectional views illustrating process steps of a manufacturing method of a display device according to another embodiment.

Referring to FIG. 19, first, a substrate SUB is prepared, and light-emitting stacks 11, 12, and 13 are provided on the substrate SUB.

The substrate SUB may be a driving substrate including suitable circuit elements, for example, such as the transistors constituting the pixel circuit PXC (e.g., see FIG. 3) of each pixel PXL. A first electrode ET1, a connection electrode layer CEL, and/or a hard mask layer HM may be provided on the substrate SUB.

The first electrode ET1 may be formed at a position where a corresponding light-emitting element LD, which will be described in more detail below, is provided. The connection electrode layer CEL may be formed over the entire surface of the substrate SUB, but the present disclosure is not limited thereto. The hard mask layer HM may be formed at a position where the bank patterns BNP will be provided to form a lower end of the bank patterns BNP, which will be described in more detail below. However, the present disclosure is not limited thereto, and the hard mask layer HM may be omitted as needed or desired in other embodiments.

The light-emitting stacks 11, 12, and 13 may be provided on the substrate SUB. The light-emitting stacks 11, 12, and 13 may be formed by growing seed crystals by an epitaxial method. According to one or more embodiments, the light-emitting stacks 11, 12, and 13 may be formed by metal organic chemical vapor deposition (MOCVD). However, the present disclosure is not limited thereto, and the light-emitting stacks 11, 12, and 13 may be formed by various suitable methods, for example, such as electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like.

The light-emitting stacks 11, 12, and 13 may include an epitaxially grown first semiconductor layer 11, an active layer 12, and a second semiconductor layer 13. The first semiconductor layer 11, the active layer 12, and the second semiconductor layer 13 may be sequentially provided in the third direction (e.g., the Z-axis direction) on the substrate SUB.

The first semiconductor layer 11 may include, for example, at least one p-type semiconductor layer. For example, the first semiconductor layer 11 may include a semiconductor material, such as GaN, InGaN, InAlGaN, AlGaN, or AlN, and may include a p-type semiconductor layer doped with the first conductive dopant (e.g., the p-type dopant), such as Mg, Zn, Ca, Sr, Ba, and/or the like. For example, the first semiconductor layer 11 may include a GaN semiconductor material doped with the first conductive dopant (e.g., the p-type dopant), but the present disclosure is not necessarily limited thereto, and the first semiconductor layer L1 may be formed of various suitable materials.

The active layer 12 may be disposed between the first semiconductor layer 11 and the second semiconductor layer 13. The active layer 12 may include any one of a single well structure, a multi well structure, a single quantum well structure, a multi quantum well (MQW) structure, a quantum dot structure, or a quantum wire structure, but the present disclosure is limited thereto. The active layer 12 may include GaN, InGaN, InAlGaN, AlGaN, or AlN, and various other suitable materials may constitute the active layer 12.

According to one or more embodiments, an electron blocking layer (EBL) may be further disposed between the active layer 12 and the first semiconductor layer 11. The electron blocking layer may block the flow of electrons supplied from the second semiconductor layer 13 from escaping to the first semiconductor layer 11, thereby increasing the electron-hole recombination probability in the active layer 12. The energy bandgap of the electron blocking layer may be greater than that of the active layer 12 and/or the first semiconductor layer 11, but the present disclosure is not limited thereto.

According to one or more embodiments, a super lattices layer (SLL) may be further disposed between the active layer 12 and the second semiconductor layer 13. The super lattice layer may relieve a stress of the active layer 12 and the second semiconductor layer 13 to improve the quality of the light-emitting elements LD. For example, the super lattice layer may be formed in a structure in which InGaN and GaN are alternately stacked, but the present disclosure is not limited thereto.

The second semiconductor layer 13 may be disposed on the active layer 12, and may include a semiconductor layer of a different kind from that of the first semiconductor layer 11. In an embodiment, the second semiconductor layer 13 may include at least one n-type semiconductor layer. For example, the second semiconductor layer 13 may include a semiconductor material, such as GaN, InGaN, InAlGaN, AlGaN, or AlN, and may be an n-type semiconductor layer doped with a second conductive dopant (e.g., an n-type dopant), such as Si, Ge, Sn, and/or the like. For example, the second semiconductor layer 13 may include a GaN semiconductor material doped with the second conductive dopant (e.g., the n-type dopant). However, the material constituting the second semiconductor layer 13 is not limited thereto, and the second semiconductor layer 13 may be formed of various suitable materials.

Figure 20:
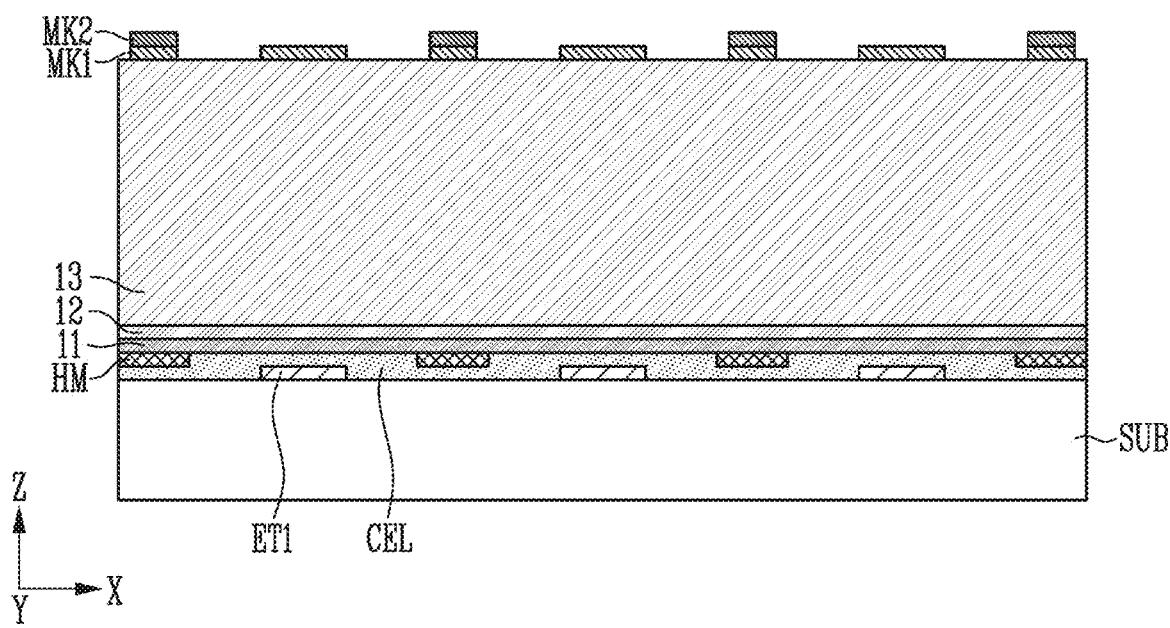

Referring to FIG. 20, first and second mask layers MK1 and MK2 may then be formed on the light-emitting stacks 11, 12, and 13.

The first mask layer MK1 may be partially formed at positions where the light-emitting elements LD and the bank patterns BNP, which will be described in more detail below, are provided. The second mask layer MK2 may be formed on the first mask layer MK1. The second mask layer MK2 may be selectively formed at positions where the bank patterns BNP are to be provided.

The first mask layer MK1 and the second mask layer MK2 may be formed of different materials from each other. For example, the first mask layer MK1 may include silicon oxide (SiOx), and the second mask layer MK2 may include nickel (Ni), but the present disclosure is not limited thereto.

Figure 21:
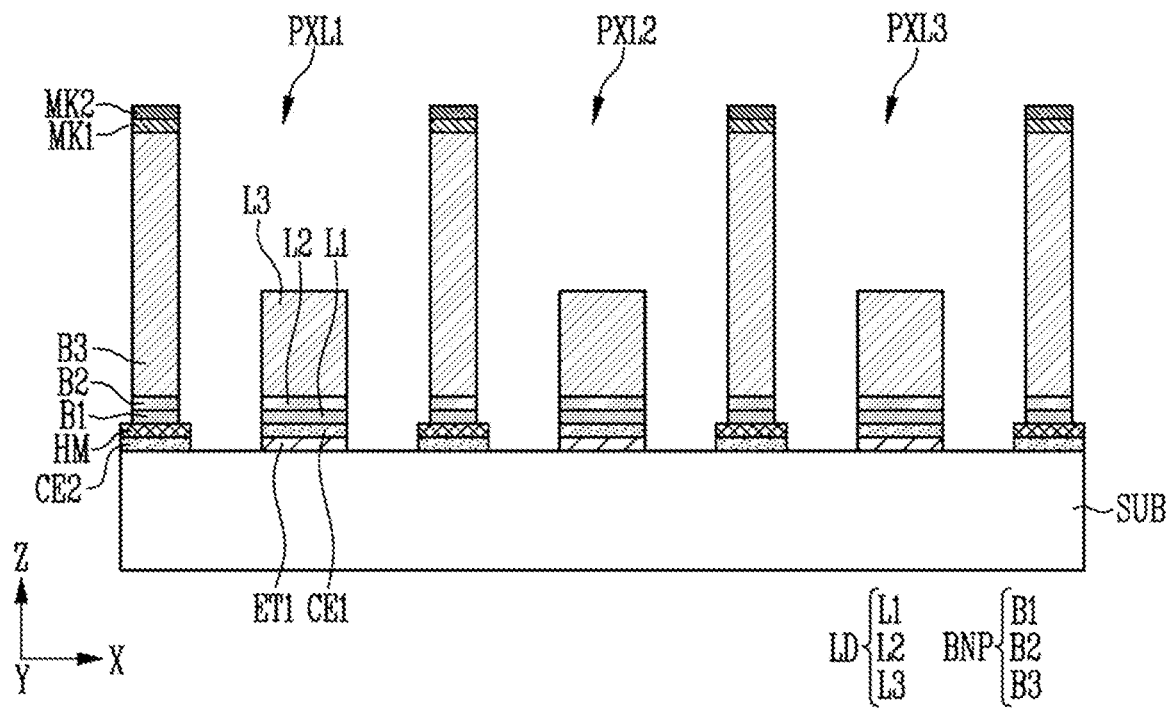

Referring to FIG. 21, the light-emitting stacks 11, 12, and 13 may then be patterned to form the light-emitting elements LD and the bank patterns BNP. The bank patterns BNP may be formed at a boundary between the first to third pixels PXL1, PXL2, and PXL3. The light-emitting elements LD may be formed at (e.g., in or on) the first to third pixels PXL1, PXL2, and PXL3 between the bank patterns BNP.

In the process of patterning the light-emitting stacks 11, 12 and 13, the light-emitting elements LD and the bank patterns BNP having different thicknesses from each other may be concurrently (e.g., simultaneously) formed with each other by using a difference in etch selectivity between the first mask layer MK1 and the second mask layer MK2.

According to one or more embodiments, in the process of patterning the light-emitting stacks 11, 12, 13, the connection electrode layer CEL may be separated into the first connection electrode CE1 and the second connection electrode CE2. For example, the connection electrode layer CEL may be separated into a first connection electrode CE1 under (e.g., underneath) the light-emitting elements LD, and a second connection electrode CE2 under (e.g., underneath) the hard mask layer HM.

Figure 22:
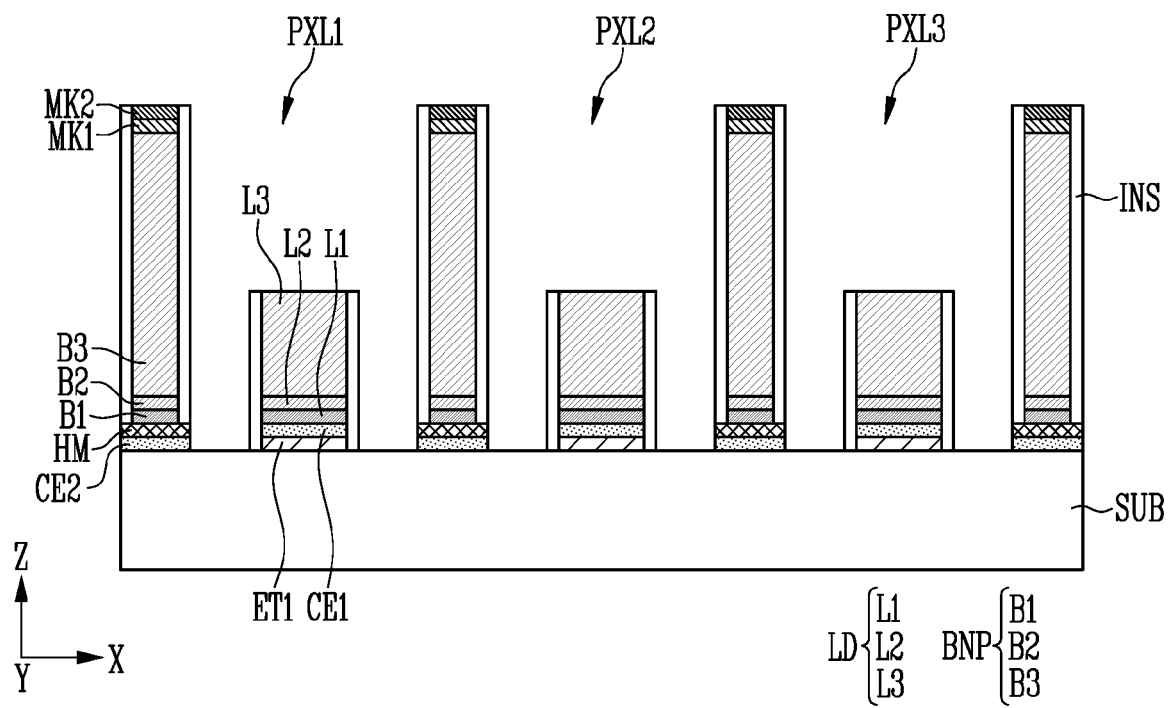

Referring to FIG. 22, an insulating layer INS may then be formed on the light-emitting elements LD and/or the bank patterns BNP. The insulating layer INS may be partially formed on side surfaces of the light-emitting elements LD and/or the bank patterns BNP. After the insulating layer INS is formed over the first to third pixels PXL1, PXL2, and PXL3, the insulating layer INS may be partially removed to expose upper surfaces of the light-emitting elements LD and/or the bank patterns BNP. In an embodiment, when the light-emitting elements LD and/or the bank patterns BNP are formed in the third direction (e.g., the Z-axis direction), or in other words, perpendicular to or substantially perpendicular to the substrate SUB, the insulating layer INS provided on the upper surfaces of the light-emitting elements LD and/or the bank patterns BNP may be etched without a mask.

Figure 23:
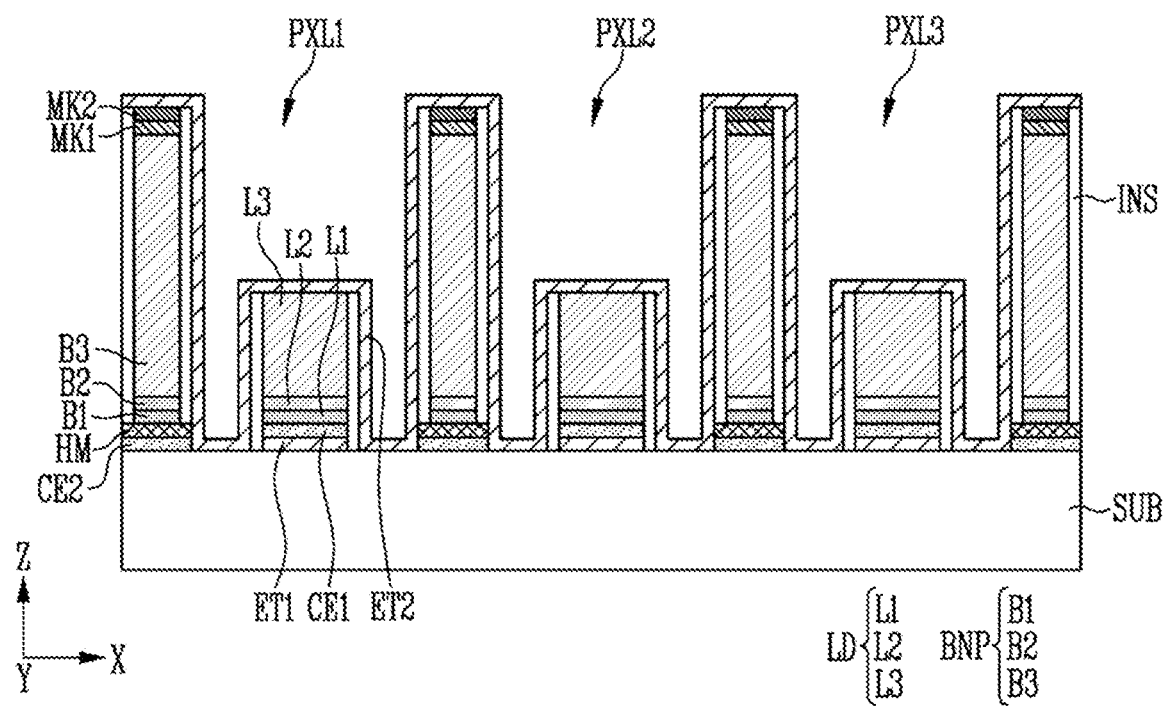
Figure 24:
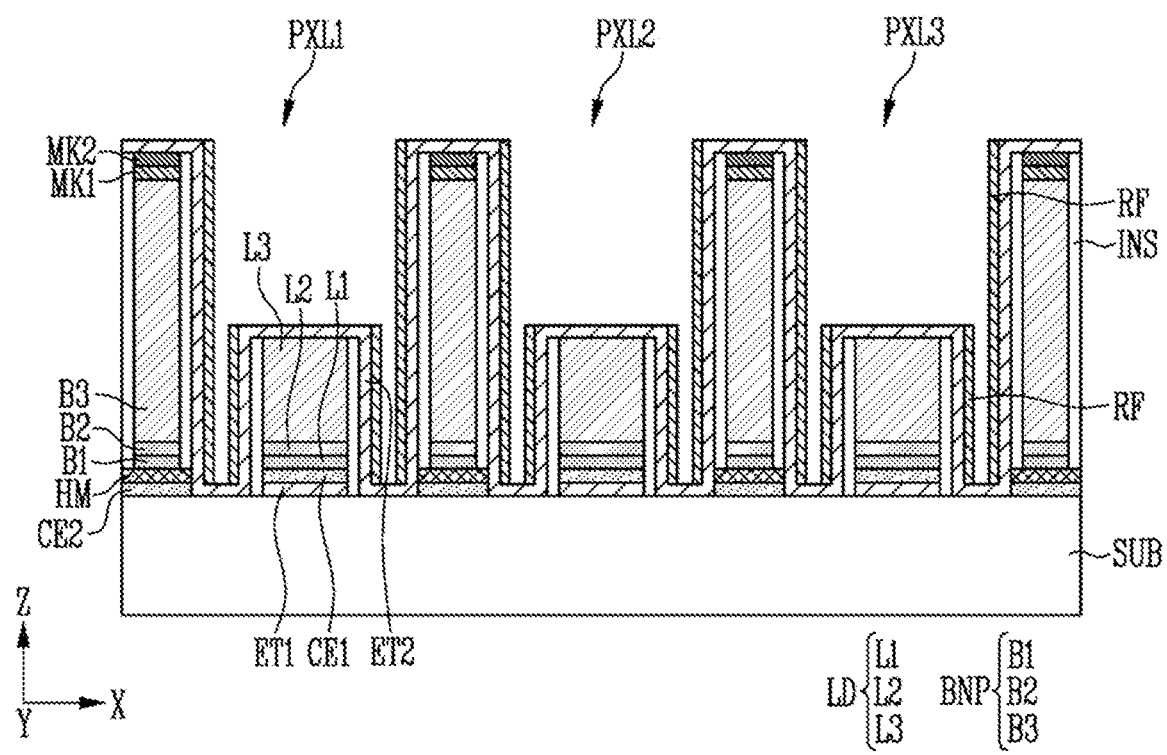

Referring to FIG. 23, a second electrode ET2 may then be formed on the light-emitting elements LD. The second electrode ET2 may be directly disposed on the upper surface of the light-emitting elements LD exposed by the insulating layer INS, and may be in contact with the second semiconductor layer L3 of the light-emitting elements LD.

The second electrode ET2 may be formed over the first to third pixels PXL1, PXL2, and PXL3. In other words, the second electrode ET2 may be formed to at least partially cover the bank patterns BNP, but the present disclosure is not limited thereto.

The second electrode ET2 may be formed of various suitable transparent conductive materials. For example, the second electrode ET2 may be formed of at least one of various suitable transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be transparent or substantially transparent or translucent to satisfy a desired light transmittance (e.g., a predetermined light transmittance). Accordingly, the light emitted from the light-emitting elements LD may pass through the second electrode ET2, and may be emitted to the outside of the display panel PNL.

Referring to FIG. 23, a reflective layer RF may then be formed on the bank patterns BNP and/or the light-emitting elements LD. The reflective layer RF may be partially formed on the side surfaces of the bank patterns BNP and/or the light-emitting elements LD. The reflective layer RF may reflect light emitted from the light-emitting elements LD to improve light-output efficiency of the display panel PNL. In addition, the reflective layer RF may be disposed on the side surfaces of the bank patterns BNP to prevent or substantially prevent color mixing between adjacent pixels PXL. The material of the reflective layer RF is not particularly limited, and may be formed of various suitable reflective materials. In some embodiments, the reflective layer RF may be partially etched after being formed over the first to third pixels PXL1, PXL2, and PXL3.

Figure 25:
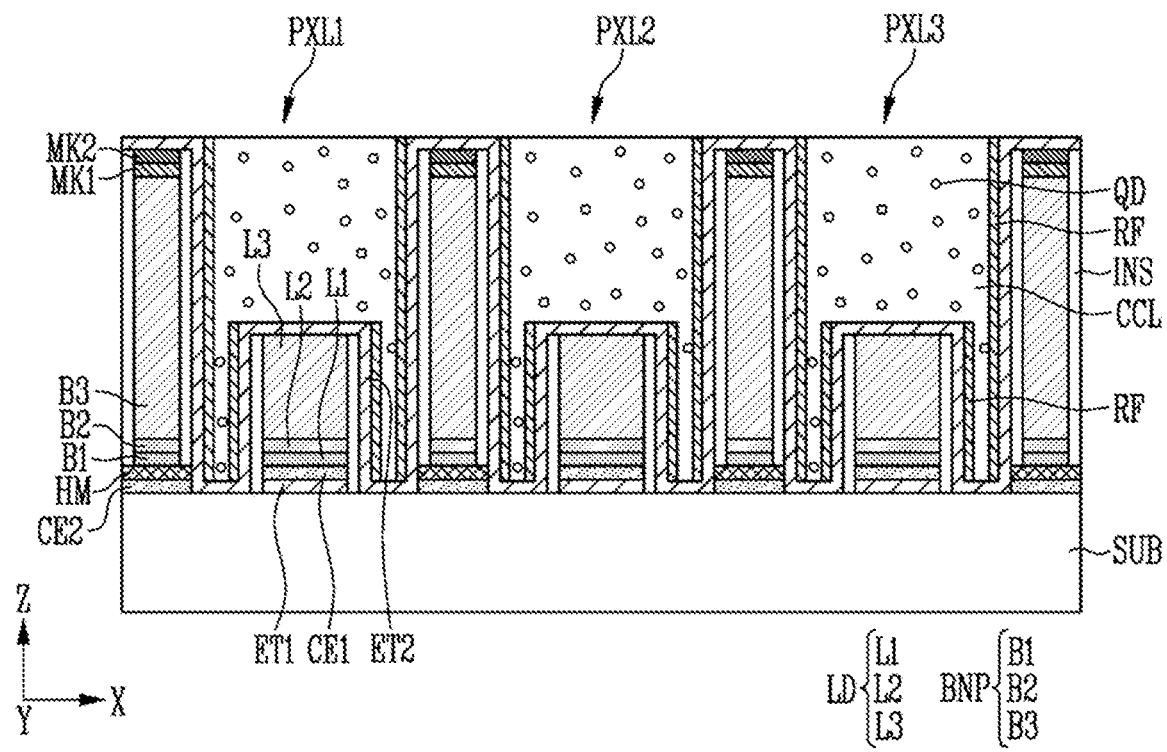

Referring to FIG. 25, a color conversion layer CCL may then be formed on the light-emitting elements LD. The color conversion layer CCL may be provided between the bank patterns BNP. The color conversion layer CCL may be formed between the side surfaces of the bank patterns BNP on the light-emitting elements LD. In other words, the color conversion layer CCL may be formed in a space or an opening defined by the bank patterns BNP.

For example, first, the color conversion layer CCL may be provided on the substrate SUB on which the bank patterns BNP are formed. The color conversion layer CCL may be provided on the substrate SUB by dip coating, spray coating, spin coating, or screen coating, but the present disclosure is not limited thereto. Subsequently, the color conversion layer CCL provided on the substrate SUB may be implanted into a space or an opening defined by the bank patterns BNP by the capillary phenomenon.

According to an embodiment, when the color conversion layer CCL is not sufficiently implanted into at least a portion of a space or an opening defined by the bank patterns BNP, the color conversion layer CCL may be additionally implanted inside the groove patterns PT using ultrasonic waves. However, the present disclosure is not limited thereto, and the color conversion layer CCL may be implanted into a space or an opening defined by the bank patterns BNP according to various suitable processes or methods.

As such, when the color conversion layer CCL is formed in the space or opening defined by the bank patterns BNP by using the capillary phenomenon, a high-resolution display device may be realized beyond the limitations that may be imposed by the photo process or the inkjet process.

The color conversion layer CCL may include quantum dots as a color conversion material that converts light emitted from the light-emitting elements LD of each pixel PXL into light of a desired color (e.g., a specific color). Because the color conversion layer CCL has been described in detail above with reference to FIG. 7 and the like, redundant description thereof will not be repeated.

The protective layer PS may be formed on the color conversion layer CCL, and the color filter layer CFL and/or the light blocking layer BM may be formed on the protective layer PS to complete the display device shown in FIG. 7. Because the protective layer PS, the color filter layer CFL, and/or the light blocking layer BM have been described in detail above with reference to FIG. 7, redundant description thereof will not be repeated.

According to one or more of the above-described embodiments, the light-emitting elements LD and the bank patterns BNP may be concurrently (e.g., simultaneously) formed, and the color conversion layer CCL may be implanted between the bank patterns BNP, or in other words, in a space or an opening surrounded (e.g., around a periphery thereof) by the bank patterns BNP, thereby simplifying the manufacturing process of the display device, and realizing a high-resolution display device.

Hereinafter, an electronic device to which the display devices of one or more of the above-described embodiments may be applied will be described in more detail.

FIGS. 26 to 29 illustrate various examples of electronic devices according to various embodiments.

Figure 26:
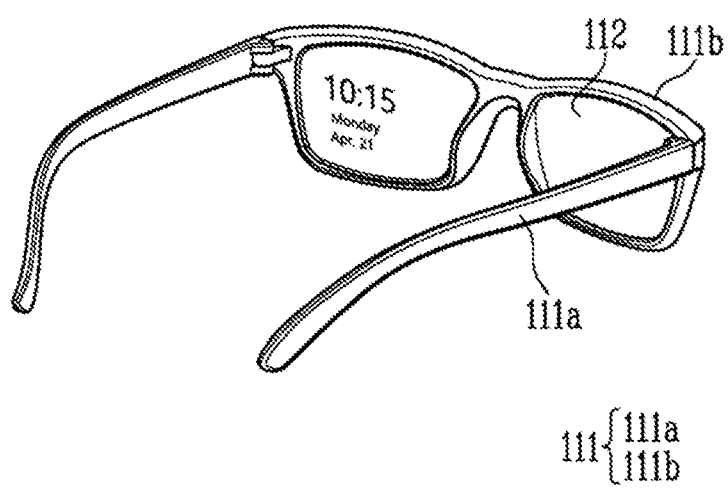
FIGS. 26-29 illustrate various examples of electronic devices according to various embodiments.

Referring to FIG. 26, the display device according to one or more of the above-described embodiments may be applied to smart glasses. The smart glasses may include a frame 111, and a lens unit (e.g., a lens) 112. The smart glasses are wearable electronic devices that may be worn on a user's face, and may have a structure in which a part of the frame 111 may be folded or unfolded. For example, the smart glasses may be a wearable device for augmented reality (AR).

The frame 111 may include a housing 111b for supporting the lens unit 112, and a leg unit (e.g., legs) 111a for wearing by the user. The leg unit 111a may be folded or unfolded by being connected to the housing 111b by a hinge.

A battery, a touch pad, a microphone, and/or a camera may be embedded in the frame 111. In addition, a projector for outputting light and/or a processor for controlling an optical signal may be embedded in the frame 111.

The lens unit 112 may be an optical member that transmits light or reflects light. The lens unit 112 may include glass and/or a transparent synthetic resin.

The display device according to one or more of the above-described embodiments may be applied to the lens unit 112. For example, the user may recognize an image displayed by an optical signal transmitted from the projector of the frame 111 through the lens unit 112. For example, the user may recognize information, such as time and date, that may be displayed on the lens unit 112.

Figure 27:
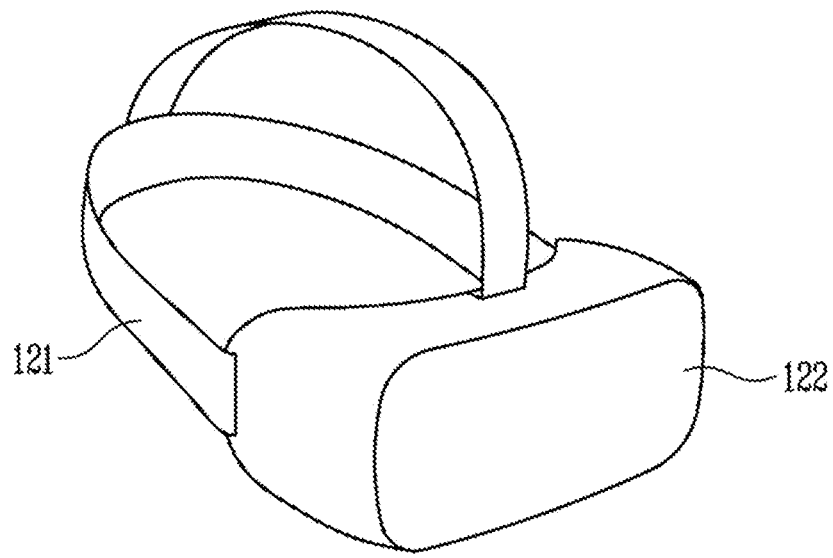

Referring to FIG. 27, the display device according to one or more of the above-described embodiments may be applied to a head mounted display (HMD). The head mounted display may include a head mounted band 121, and a display storage case 122. For example, the head mounted display may be a wearable electronic device that may be worn on a user's head.

The head mounting band 121 may be connected to the display storage case 122 to fix the display storage case 122. The head mounted band 121 may include a horizontal band and a vertical band for fixing the head mounted display to the user's head. As shown in FIG. 27, the horizontal band may be provided to surround (e.g., around a periphery of) a side portion of the user's head, and the vertical band may be provided to surround (e.g., around a periphery of) an upper portion of the user's head. However, the present disclosure is not limited thereto, and the head mounting band 121 may be implemented in a form of an eyeglass frame or a helmet.

The display storage case 122 may accommodate the display device, and may include at least one lens. The at least one lens may provide an image to the user. For example, the display device according to one or more of the above-described embodiments may be applied to a left eye lens and a right eye lens implemented in the display storage case 122.

Figure 28:
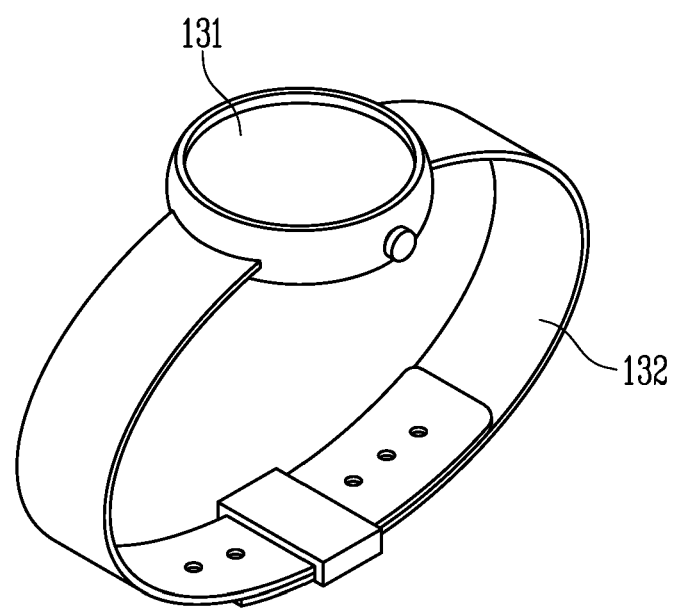

Referring to FIG. 28, the display device according to one or more of the above-described embodiments may be applied to a smart watch. The smart watch may include a display unit (e.g., a display) 131, and a strap unit (e.g., a strap) 132. The smart watch may be a wearable electronic device, and the strap unit 132 thereof may be mounted on the user's wrist. The display device according to one or more of the above-described embodiments may be applied to the display unit 131. For example, the display unit 131 may provide image data including information, such as time and date.

Figure 29:
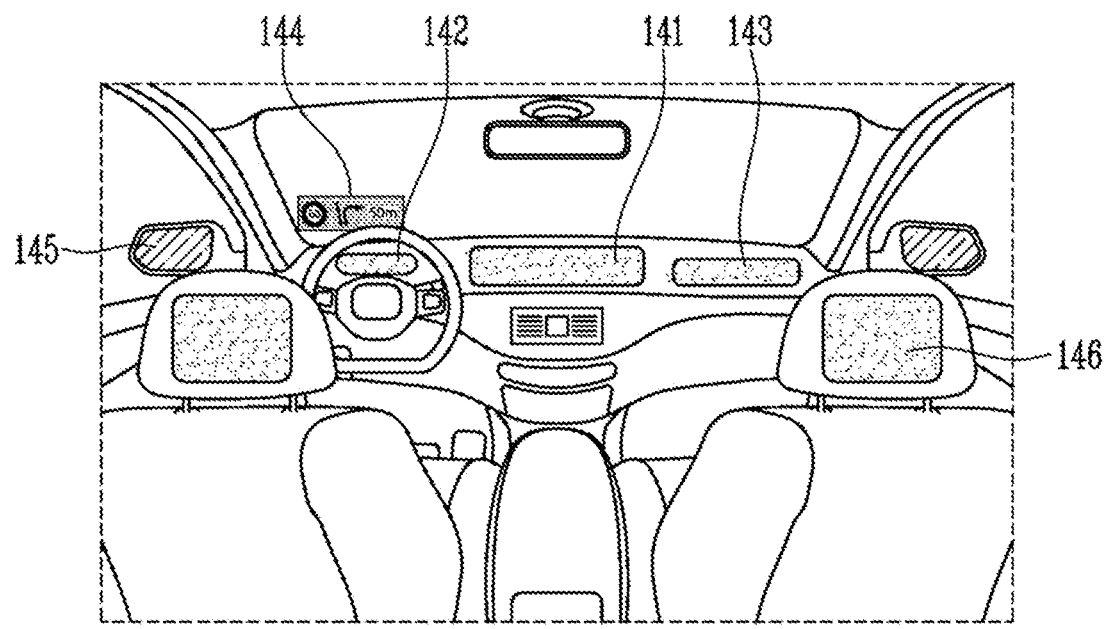

Referring to FIG. 29, the display device according to one or more of the above-described embodiments may be applied to an automotive display. For example, the automotive display may refer to an electronic device provided inside and outside a vehicle to provide image data.

For example, the display device according to one or more of the above-described embodiments may be applied to at least one of an infotainment panel 141, a cluster 142, a co-driver display 143, a heads-up display 144, a side mirror display 145, and/or a rear-seat display 146.

Figure 30A:
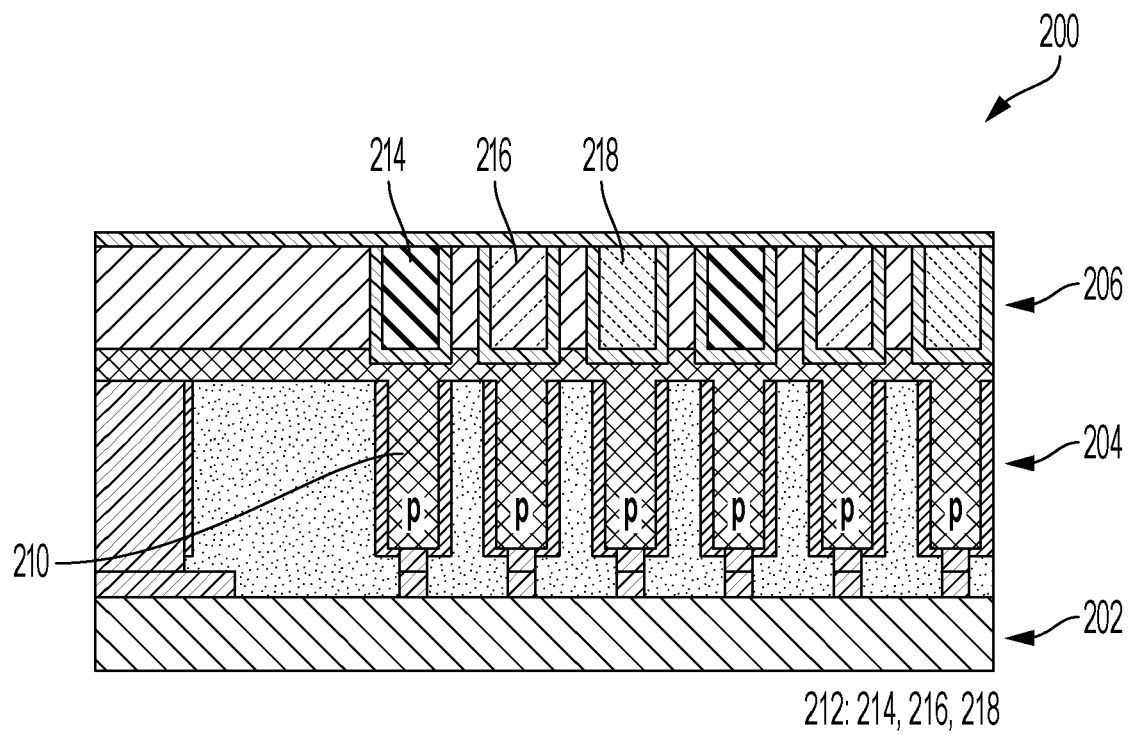
FIGS. 30A-30C illustrate schematic cross-sectional views of a portion of a display device according to one or more embodiments of the present disclosure.
Figure 30B:
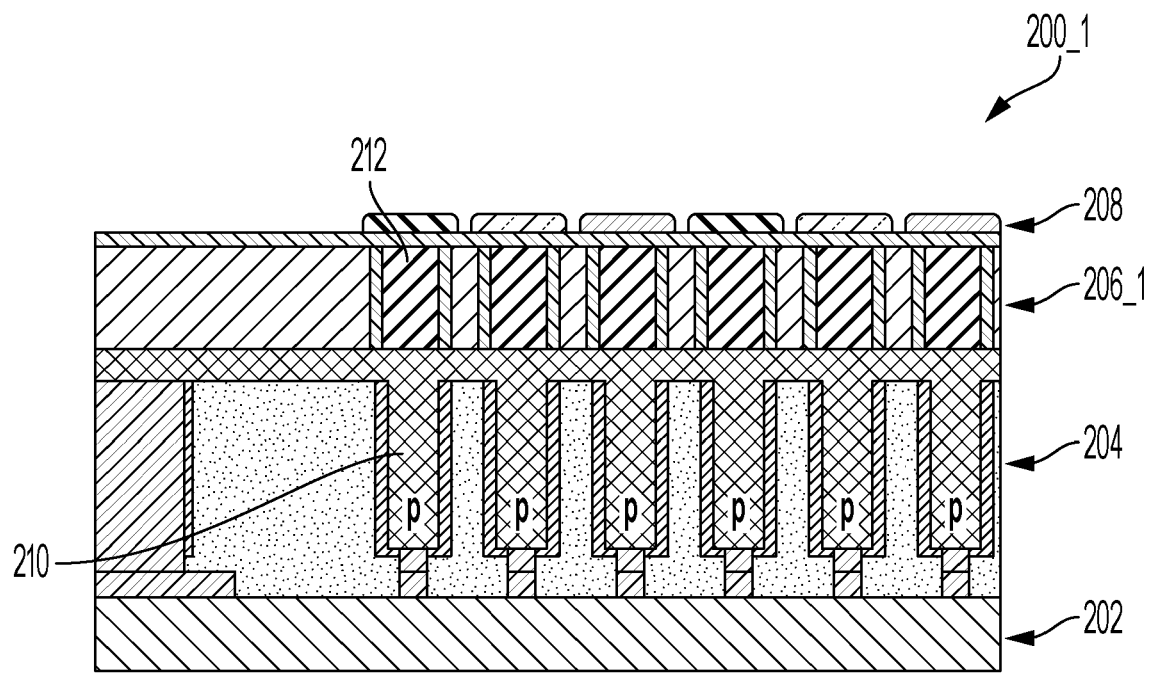
Figure 30C:
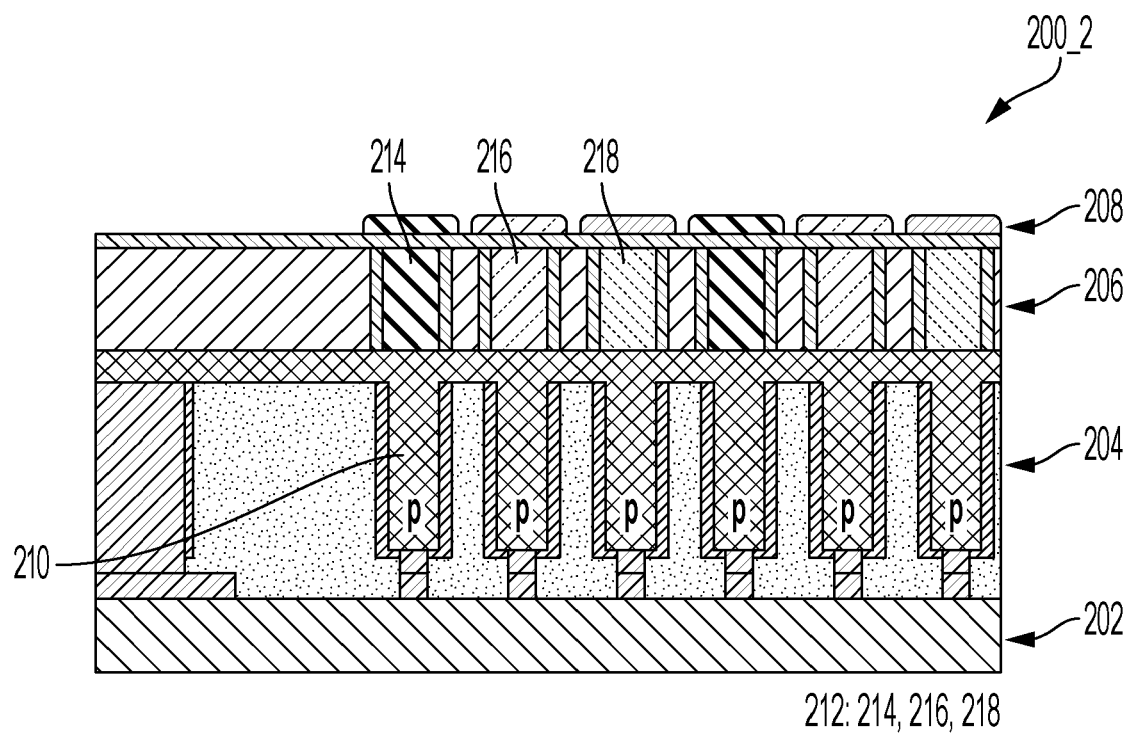

FIGS. 30A to 30C illustrate schematic cross-sectional views of a portion of a display device according to one or more embodiments of the present disclosure. FIG. 30A illustrates a display device 200 according to an embodiment, FIG. 30B illustrates a display device 200_1 according to an embodiment, and FIG. 30C illustrates a display device 200_2 according to an embodiment. The display devices 200_1 and 200_2 shown in FIGS. 30B and 30C may be the same or substantially the same as the display device 200 shown in FIG. 30A, except that a color filter layer 208 may be further formed on a color conversion layer thereof, and the color conversion layer thereof may be different from (e.g., 206_1) or the same (or substantially the same) as (e.g., 206) the color conversion layer 206 shown in FIG. 30A. Accordingly, the display device 200 shown in FIG. 30A may be described in more detail hereinafter, such that redundant description with respect to the display devices 200_1 and 200_2 shown in FIGS. 30B and 30C may not be repeated, and the differences thereof may be mainly described in more detail.

Referring to FIGS. 30A through 30C, the display devices 200, 200_1, and 200_2 may each include a driving substrate 202, a light emitting layer 204 on the driving substrate 202, and a color conversion layer 206 or 206_1 on the light emitting layer 204. The driving substrate 202 may include driving circuitry thereon, such as, for example, driving circuitry for an active matrix display device. The driving circuitry may include a plurality of driving elements for driving a plurality of light emitting elements 210 of the light emitting layer 204. For example, the driving substrate 202 may include a wafer (e.g., a CMOS wafer) comprising a plurality of transistors (e.g., CMOS transistors) disposed thereon, which may operate as driving transistors and/or switching transistors for controlling an emission of light from the light emitting elements 210 of the light emitting layer 204. In an embodiment, the driving substrate 202 may include a base substrate including, for example, a silicon substrate (e.g., a silicon wafer), but the present disclosure is not limited thereto, and the base substrate may include any suitable material suitable for forming the driving elements (e.g., the CMOS transistors, CMOS cells, and/or the like) thereon as would be known to those skilled in the art. In an embodiment, or more layers may be formed, coated, or disposed on the base substrate of the driving substrate 202. The one or more layers may include, for example, one or more of a buffer layer, a passivation layer, an insulation layer, and/or a planarization layer, but the present disclosure is not limited thereto. The one or more layers may include an organic material, an inorganic material, or an inorganic material and an organic material, but the present disclosure is not limited thereto.

A number of electrical contacts (e.g., contact metals 320/322 in FIG. 31C) may be formed at (e.g., in or on) the one or more layers. For example, the electrical contacts may be formed on or partially embedded in the one or more layers. In some embodiments, the electrical contacts may be located on an upper surface of the one or more layers such that a bonding surface thereof may be exposed. The electrical contacts may be formed of, for example, SAC 305 including 96.5 wt %, 3.0 wt %, 0.5 wt % respectively of tin (Sn), silver (Ag) and copper (Cu); AuSn including 70 wt % and 30 wt % respectively of gold (Au) and tin (Sn), 80 wt % and 20 wt % respectively of gold (Au) and tin (Sn), or 90 wt % and 10 wt % respectively of gold (Au) and tin (Sn); or gold (Au), tin (Sn), or copper (Cu), and/or the like. However, the present disclosure is not limited thereto, and any other suitable combinations of known materials (e.g., metals) may be used to fabricate the electrical contacts.

The light emitting layer 204 may include the plurality of light emitting elements 210. Each of the light emitting elements 210 may be a light-emitting diode (LED) including an organic material or an inorganic material. For example, each of the light emitting elements 210 may include a micro LED light emitting element having a micro scale size, for example, such as a size (e.g., a width) in a range of a few to hundreds of micrometers (μm). However, the present disclosure is not limited thereto, and each of the light-emitting elements 210 may include any suitable organic or inorganic light emitting element, for example, such as an organic light-emitting diode. The light-emitting elements 210 may be arranged in any suitable matrix structure in a plan view (e.g., a view from a direction that is perpendicular to or substantially perpendicular to a surface of the relevant element or layer, for example, such as a top surface of the display device), such that the light-emitting elements 210 may be disposed in rows and columns along a display area of the display device 200.

Each of the light-emitting elements 210 may emit light toward the color conversion layer 206 or 206_1. In an embodiment, each of the light emitting elements 210 of the light emitting layer 204 may include a light-emitting material to emit a same colored first light, for example, such as a blue light. In this case, because only the array of blue light-emitting elements may be arranged in the light emitting layer 204, the transferring process may be simplified or omitted, and design freedom of the arrangement structure thereof may be increased. However, the present disclosure is not limited thereto, and each of the light emitting elements 210 of the light emitting layer 204 may emit any suitable same colored light as each other.

The color conversion layer 206 may include a plurality of color conversion units (e.g., color converters) 212 configured to convert the light emitted by the light-emitting elements 210 of the light emitting layer 204 into at least one different colored light. For example, each of the color conversion units 212 may overlap with at least one corresponding light-emitting element 210 of the light emitting layer 204 to convert the first colored light emitted by the at least one corresponding light-emitting element 210 into a different colored light. Each of the color conversion units 212 may include a suitable color conversion material (e.g., see 317 in FIG. 32B) to convert the light emitted by the light-emitting elements 210 incident thereon into at least one different colored light from the first colored light. For example, in an embodiment, the color conversion material may include quantum dots (QD).

According to an embodiment, each of the quantum dots (QD) included in the color conversion units 212 includes a nanocrystalline material, for example, such as a silicon-based nanocrystal, a group II-VI-based compound semiconductor nanocrystal, a group III-V-based compound semiconductor nanocrystal, a group IV-VI-based compound semiconductor nanocrystal, or a mixture thereof. The group II-VI-based compound semiconductor nanocrystal includes at least one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The group III-V-based compound semiconductor nanocrystal includes at least one selected from GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The group IV-VI-based compound semiconductor nanocrystal includes SbTe. However, the present disclosure is not limited to these particular materials for the quantum dots (QD), and any other suitable quantum dot (QD) materials known to those skilled in the art may be used.

In an embodiment, as shown in FIG. 30A, the color conversion units 212 may include a first color conversion unit 214 including a first color conversion material to convert the first colored light (e.g., the blue light) emitted by the light-emitting elements 210 into a second colored light (e.g., a red light), a second color conversion unit 216 including a second color conversion material to convert the first colored light emitted by the light-emitting elements 210 into a third colored light (e.g., a green light), and a third color conversion unit 218 including a third color conversion material to convert the first colored light emitted by the light-emitting elements 210 into a fourth colored light (e.g., a blue light). In some embodiments, the second colored light, the third colored light, and the fourth colored light may correspond to a red color, a green color, and a blue color, respectively, but the present disclosure is not limited thereto, and each of the second, third, and fourth colors may be any suitable colors (e.g., cyan, magenta, yellow, and the like) that, when combined with each other, may implement a full color image.

In some embodiments, the first color conversion material may include red quantum dots (e.g., R-QD) to convert the first colored light (e.g., the blue light) into red light to emit the red light, and the second color conversion material may include green quantum dots (e.g., G-QD) to convert the first colored light (e.g., the blue light) into green light to emit the green light. In some embodiments, because the light-emitting elements 210 may already emit a blue colored light as the first colored light, the fourth colored light may be the same as the first colored light. In this case, the third color conversion material may include a filling material or a scattering material instead of quantum dots (QD) to enable the blue colored light emitted by the light-emitting elements 210 to be transmitted therethrough without being converted, and to flatten or substantially flatten a top surface of the third color conversion unit 218. However, the present disclosure is not limited thereto, and in some embodiments, the third color conversion material may include blue quantum dots (e.g., B-QD) or white quantum dots (W-QD) to convert the first colored light emitted by the light-emitting elements 210 to the fourth colored light and to emit the fourth colored light, which may be different from or the same as the first colored light emitted by the light-emitting elements 210.

In another embodiment, as shown in FIG. 30B, each of the color conversion units 212 of the color conversion layer 206_1 may convert the first colored light transmitted by the light-emitting elements 210 into the same second colored light to emit the same second colored light. For example, in some embodiments, each of the color conversion units 212 of the color conversion layer 206_1 may include white quantum dots (W-QD) to convert the blue colored light emitted by the light-emitting elements 210 into white light, and to emit the white light. In one or more embodiments, the W-QD may be formed by a mixture of red quantum dots (R-QD) and green quantum dots (G-QD), and may be yellowish in color. When a blue light is incident (or applied) to the W-QD, the W-QD converts the frequency of the blue light to a white or substantially white light.

In this case, the color filter layer 208 may be further provided on the color conversion layer 206_1 to filter different colored lights from the while light emitted by the color conversion units 212 of the color conversion layer 206_1, and to transmit the different colored lights therethrough. For example, the color filter layer 208 may include a red color filter to transmit red light from the white light emitted by the color conversion units 212, a green color filter to transmit green light from the white light emitted by the color conversion units 212, and a blue color filter to transmit blue light from the white light emitted by the color conversion units 212. Unlike the color conversion layer 206 or 206_1, which transforms a wavelength of light incident thereon to a different wavelength of light to emit a different colored light according to the incident light, the color filters of the color filter layer 208 may filter wavelengths of light passing therethrough to only allow a particular wavelength of light to be transmitted therethrough. Moreover, the color filter layer 208 may improve purity and/or clarification of the colors, and may block blue light emitted from the pixels that does not collide with the quantum dots of the color conversion units 212 from being transmitted upwards, for example, to improve purity of color.

However, the present disclosure is not limited thereto, and in some embodiments, as shown in FIG. 30C, the display device 200_2 having the first color conversion unit 214, the second color conversion unit 216, and the third color conversion unit 218, which may be the same or substantially the same as (or similar to) those of FIG. 30A, may further include the color filter layer 208 thereon as needed or desired, for example, to improve purity of the colors emitted by the first color conversion unit 214, the second color conversion unit 216, and the third color conversion unit 218 of the color conversion layer 206.

Accordingly, in various embodiments, a design, a structure, an arrangement, and/or a manufacturing process of the light-emitting elements 210 of the light emitting layer 204 may be simplified, while implementing a high-definition full color display device by employing the color conversion layer 206 and/or the color filter layer 208.

Figure 31A:
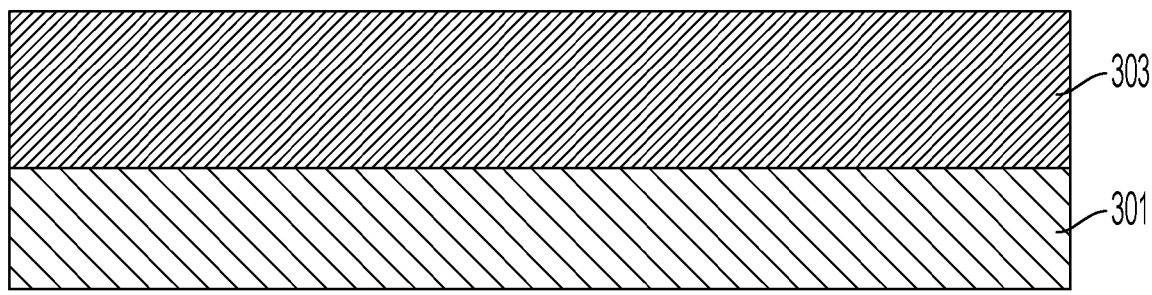
FIGS. 31A-31C illustrate schematic cross-sectional views of various processes of a method of manufacturing a display device according to one or more embodiments of the present disclosure.
Figure 31B:
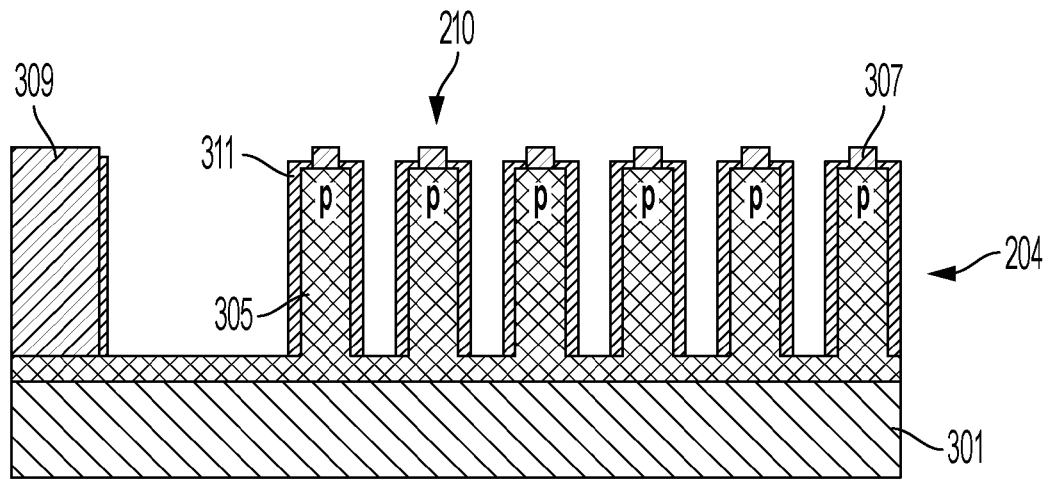
Figure 31C:
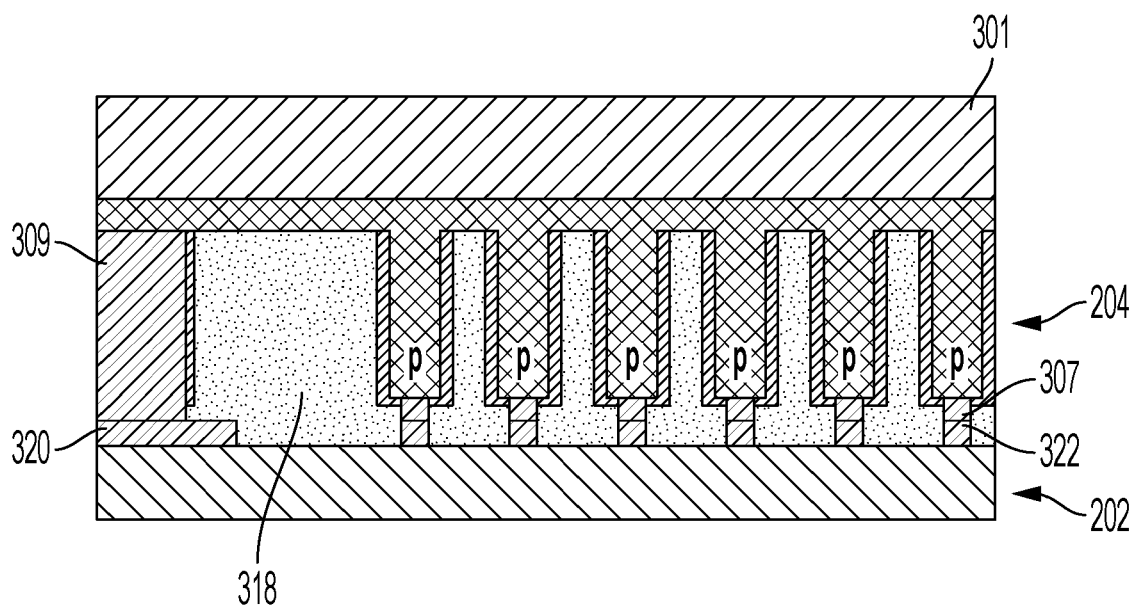

FIGS. 31A-31C illustrate schematic cross-sectional views of various processes of a method of manufacturing a display device according to one or more embodiments of the present disclosure. FIGS. 31A-31C illustrate various processes of forming the light emitting layer 204 shown in FIGS. 30A through 30C according to one or more embodiments of the present disclosure.

In brief overview, as discussed above, each of the light-emitting elements 210 may be implemented as a micro LED light emitting element having a micro scale size. In some embodiments, each of the light-emitting elements 210 may be fabricated from an epitaxially grown epitaxial layer 303 including, for example, Gallium Nitride (GaN). However, the present disclosure is not limited thereto, and the epitaxial layer 303 may include any suitable material for forming the light-emitting elements 210 as would be known to those having ordinary skill in the art. The epitaxial layer 303 may be epitaxially grown on a first surface of a substrate 301 including a suitable material, for example, such as silicon (Si) (e.g., an Si wafer). However, the present disclosure is not limited thereto, and the substrate 301 may include any suitable material for epitaxially growing the epitaxial layer 303, for example, such as Sapphire and/or the like. After the light emitting elements 210 are formed from the epitaxial layer 303 on the first surface of the substrate 301, the substrate 301 is attached to the driving substrate 202 with the light-emitting elements 210 therebetween, for example, via any suitable wafer to wafer (W2W) bonding method. For example, each of the light-emitting elements 210 may be connected to the driving substrate 202 (e.g., to a corresponding driving element thereof) via contact metals 307/322. After the substrate 301 is attached to the driving substrate 202 (e.g., via W2W bonding), the color conversion layer 206 (or the color conversion layer 206_1) may be formed in a second surface of the substrate 301 opposite the first surface. Accordingly, the transfer process of the light-emitting elements 210 may be omitted or simplified.

In more detail, referring to FIG. 31A, the epitaxial layer 303 including GaN (or any other suitable material for emitting the first color light (e.g., the blue light)) may be epitaxially grown on the first surface of the substrate 301. In this case, rather than using separate RGB wafers (e.g., separate RGB materials) to form different colored light-emitting elements to emit different colored lights, for example, such as red, green, and blue light-emitting elements (e.g., pixels), because all of the light-emitting elements 210 emit the first color light, for example, the blue light, the epitaxial layer 303 may be grown from GaN on a blue colored substrate 301 including silicon, for example. However, the present disclosure is not limited to the materials of the epitaxial layer 303 and the substrate 301.

In some embodiments, the epitaxial layer 303 may be epitaxially grown to have a suitable thickness for forming the light-emitting elements 210, for example, such as a few micrometers (μm) in height (e.g., in a thickness direction). In this case, the substrate 301 may have a suitable thickness for facilitating the growing of the epitaxial layer 303 thereon, and for forming the light-emitting elements 210 from the epitaxial layer 303, for example, such as about 300 μm in the thickness direction. In this case, as will be discussed in more detail below, because the substrate 301 may be too thick for forming the color conversion layer 206 or 206_1 therein, a wafer thinning process may be subsequently performed on the second surface of the substrate 301 to reduce the thickness of the substrate 301 to a suitable thickness for forming the light conversion units 212 therein, for example, such as from about a few to about 10 μm. However, the present disclosure is not particularly limited to the thicknesses of the epitaxial layer 303 and/or the substrate 301.

Referring to FIG. 31B, the epitaxial layer 303 may be patterned to form a pixel pattern layer including a plurality of pixel patterns 305. For example, in some embodiments, the epitaxial layer 204 may be patterned (e.g., etched and/or the like) such that portions of the epitaxial layer 303 may be removed, and the remaining portions thereof may correspond to the pixel pattern layer having the plurality of pixel patterns 305 that are spaced apart from each other with a gap therebetween. In this case, each of the pixel patterns 305 may include a PN junction diode including one or more inorganic semiconductor-based materials doped with a P-type material and an N-type material.

For example, the PN junction diode may include the GaN material of the epitaxial layer 303 that is doped with the P-type material, the N-type material, and a PN junction between the N-type doped material and the P-type doped material. When a voltage is applied to the PN junction diode in a forward direction, holes and electrons may be injected, and energy generated by recombination of the holes and electrons may be converted into light energy to emit light of a desired color (e.g., a predetermined or certain color). As shown in FIG. 31B, a positive side (e.g., the P-type doped material) P of each of the pixel patterns 305 may be formed at an end of each of the pixel patterns 305 facing in a direction away from the substrate 301 to be connected to a corresponding transistor on the driving substrate 202 via a contact metal 307/322 (e.g., see FIG. 31C) and/or the like, to drive the corresponding light-emitting element 210. A negative side (e.g., the N-type doped material) may be orientated towards the substrate 301. However, the present disclosure is not limited thereto, and the positive side may be oriented towards the substrate 301 and the negative side may be formed at the end of the pixel patterns 305 facing away from the substrate 301. The positive side P may be doped with, for example, magnesium, and the negative side may be doped with, for example, silicon, but the present disclosure is not limited thereto, and any other suitable P-type and N-type doping materials known to those of ordinary skill in the art may be used.

In some embodiments, a contact metal 307 connected to an electrode (e.g., an anode electrode) of a corresponding pixel pattern 305 may be disposed on the positive side P of the corresponding pixel pattern 305, and a passivation layer 311 may be disposed to cover at least a portion of the positive side P and side surfaces of the pixel patterns 305. In some embodiments, the passivation layer 311 may also be disposed on bottom surfaces of the gaps between adjacent ones of the pixel patterns 305, but the present disclosure is not limited thereto. The passivation layer 311 may prevent or substantially prevent light emitted at the PN junction of a corresponding pixel pattern 305 from leaking to an adjacent pixel pattern 305, and may include, for example, a reflective metal material such as aluminum and/or the like. The contact metal 307 may connect the electrode (e.g., the anode electrode) of each of the pixel patterns 305 to a corresponding transistor on the driving substrate 202 (e.g., see FIG. 33) when the light emitting layer 204 is bonded to the driving substrate 301 (e.g., via the W2W bonding). In some embodiments, the contact metal 307 may include a metal material having high conductivity, for example, such as gold (Au), tin (Sn) copper (Cu), or any suitable combinations thereof (e.g., SnAgCu (SAC 305) (having 96.5% Sn, 3.0% Ag, and 0.5% Cu), AuSn (e.g., having 80% Au and 20% Sn), and/or the like). However, the materials of the passivation layer 311 and the contact metal 307 are not limited thereto, and any other suitable combinations of known materials (e.g., metals) may be used to fabricate the contact metals 307 and the passivation layer 311.

In some embodiments, a common electrode (e.g., a common cathode) 309 of the pixel patterns 305 may be formed on the patterned epitaxial layer 303, and may be spaced apart from the pixel patterns 305. The common electrode may, for example, be provided with a common voltage (or a common power) for each of the pixel patterns 305. The common electrode 309 may be connected, for example, to a power source provided by the driving substrate 202 via a contact metal (e.g., see 320 in FIG. 31C). Unlike the anode electrodes, the common electrode may be common to multiple pixel patterns 305 of the light emitting layer 204. In some embodiments, the passivation layer 311 may also be disposed on side surfaces of the common electrode 309, but the present disclosure is not limited thereto. Accordingly, the light emitting layer 204 including the plurality of light-emitting elements 210 may be formed from the epitaxial layer 303 on the first surface of the substrate 301, such that a high resolution micro LED chip with a pixelated epitaxial wafer may be formed as shown in FIG. 31B.

Referring to FIG. 31C, the substrate 301 may be bonded to the driving substrate 202 with the light emitting layer 204 therebetween. For example, the substrate 301 may be bonded to the driving substrate 202 using any suitable W2W bonding method such that the first surface of the substrate having the light emitting layer 204 formed thereon faces the driving substrate 202. In more detail, in some embodiments, a planarization layer 318 may be formed on the first surface of the substrate 301 to cover the pixel patterns 305, and to fill the gaps between adjacent ones of the pixel patterns 305 and between the common electrode 309 and the pixel patterns 305.

The planarization layer 318 may planarize or substantially planarize a surface of the light emitting layer 204, and may expose a bonding surface of each of the contact metals 307 and the common electrode 309. The bonding surface of each of the contact metals 307 may be bonded to a bonding surface of a corresponding contact metal 322 located on the driving substrate 202 to connect the anodes of the pixel patterns 305 to corresponding ones of the driving elements (e.g., the CMOS transistors or CMOS cells) on the driving substrate 202. The bonding surface of the common electrode 309 may be bonded to a bonding surface of the contact metal 320 on the driving substrate 202 to connect the common electrode 309 to the power source provided by the driving substrate 202.

In some embodiments, a damascene process (which may be similar to polishing, and typically used during semiconductor fabrication) may be performed on the second surface of the substrate 301 opposite to the first surface on which the light-emitting layer 204 is formed, to reduce a thickness of the substrate 301. For example, as discussed above, in some embodiments, the thickness of the substrate 301 may be about 300 μm to facilitate the epitaxial growing of the epitaxial layer 303, and the forming of the light-emitting elements 210 from the epitaxial layer 303 on the first surface thereof. In this case, however, the thickness (e.g., about 300 μm) of the substrate 301 may be too thick to form the color conversion layer 206 or 206_1 to have suitable sized openings (or holes) OP (e.g., see FIG. 32A), and a suitable aspect ratio (e.g., a high aspect ratio). For example, in some embodiments, a suitable thickness of the color conversion layer 206 or 206_1 maybe in a range of a few to about 10 μm. In order to rapidly reduce the thickness of the substrate 301 from about 300 μm to about 10 μm or less, the damascene process (or a suitable polishing process) may be performed on the second surface of the substrate 301, which may reduce the thickness of the substrate 301 much quicker when compared to, for example, a dry etching process. However, the present disclosure is not limited thereto, and any suitable thickness reduction process may be performed on the second surface of the substrate 301 to reduce the thickness of the substrate 301 for forming the color conversion units 212 therein, when the thickness of the substrate 301 is too thick for forming the color conversion units 212 therein.

Figure 32A:
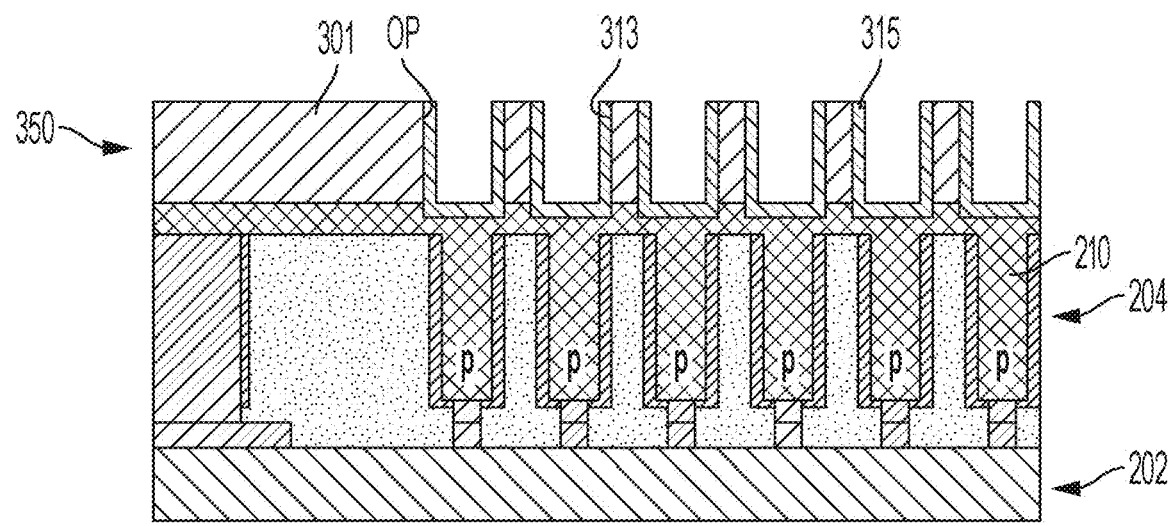
FIGS. 32A-32C illustrate schematic cross-sectional views of various methods of manufacturing a display device according to one or more embodiments of the present disclosure.
Figure 32B:
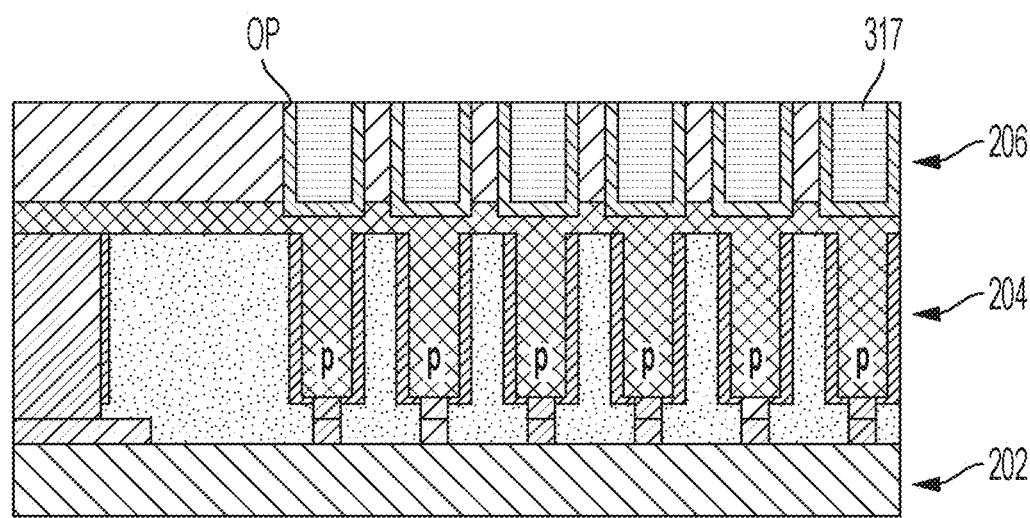
Figure 32C:
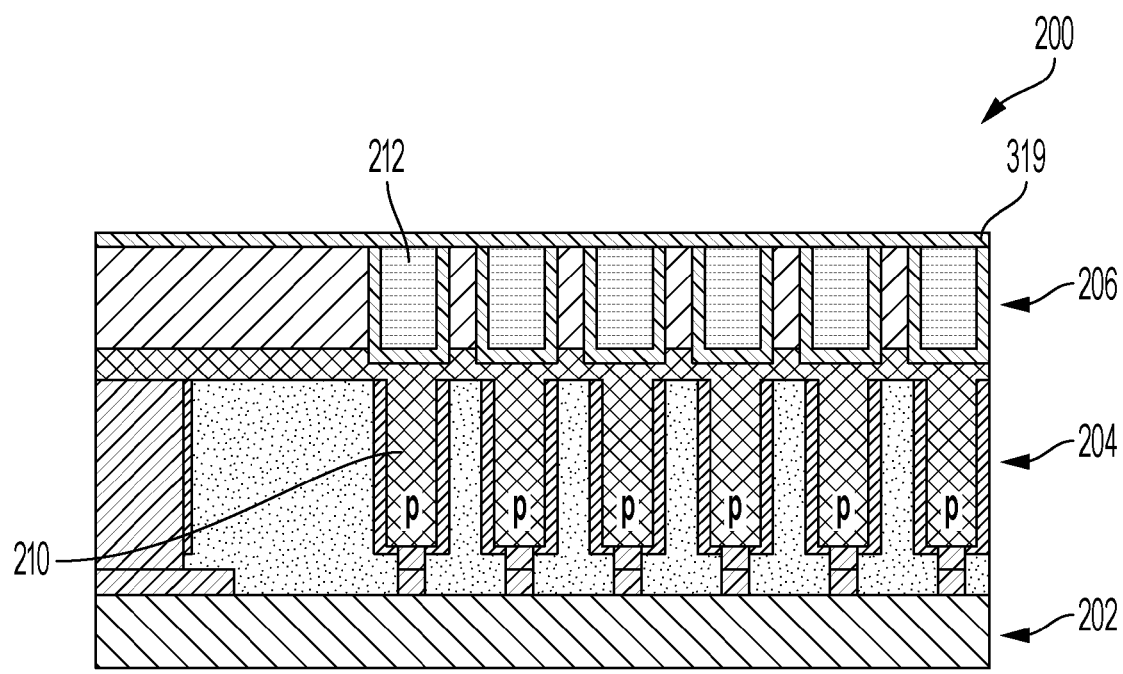

FIGS. 32A-32C illustrate schematic cross-sectional views of various methods of manufacturing a display device according to one or more embodiments of the present disclosure. FIGS. 32A-32C illustrate various processes of forming the color conversion layer 206 (or the color conversion layer 206_1) according to one or more embodiments of the present disclosure.

Referring to FIG. 32A, the second surface of the substrate 301 may be patterned to form a fine pattern layer 350. For example, in some embodiments, the second surface of the substrate 301 may be etched using a photoresist (or other suitable pattern) and deep reactive ion etching (DRIE), such that a plurality of openings (or holes) OP with a suitable aspect ratio (e.g., a high aspect ratio) may be formed in the substrate 301. The aspect ratio may refer to a capability of forming a deep enough hole (e.g., a deep enough opening OP), and may be a ratio corresponding to the height (e.g., in the thickness direction) of a sidewall 313 of a corresponding opening OP and the width of the corresponding opening OP.

The openings OP may have a circular shape, a square shape, a rectangular shape, or any other suitable planar shape (e.g., a shape when viewed in a plan view, or in other words, a view from a direction that is perpendicular to or substantially perpendicular to a surface of the relevant element or layer). The openings OP may overlap with the light-emitting elements 210, for example, in a one-to-one correspondence, but the present disclosure is not limited thereto, and each opening may overlap with at least one or more corresponding light-emitting elements 210. Similar to the light-emitting elements 210, the openings OP may be formed in the substrate 301 in a matrix structure having any suitable arrangement, for example, such as along rows and columns corresponding to (e.g., overlapping with) the rows and the columns of the light-emitting elements 210 at the display area. Each opening OP may correspond to (e.g., overlap with) a light-emitting region of a corresponding light-emitting element 210. In some embodiments, each of the openings OP may have a larger area than that of the light-emitting region of the corresponding light-emitting element 210, but the present disclosure is not limited thereto. For example, in some embodiments, each of the openings may overlap with a corresponding light-emitting element 210 in the thickness direction, and may have a larger width (or a larger diameter) than that of the corresponding light emitting element 210 in a direction perpendicular to or substantially perpendicular to the thickness direction.

Each of the openings OP may expose a portion of the epitaxial layer 303 formed on the first surface of the substrate 301. For example, each of the openings OP may overlap with a corresponding light-emitting element 210 of the light emitting layer 204, such that each of the openings OP may expose a portion of the epitaxial layer 303 corresponding to the light-emitting region of the corresponding light-emitting element 210. However, the present disclosure is not limited thereto, and in some embodiments, each of the openings OP may be formed as a groove, such that a portion of the epitaxial layer 303 thereunder may not be exposed.

In some embodiments, the openings OP may define the light-emitting regions (e.g., pixel areas) of the light-emitting elements 210. In some embodiments, the openings OP may have a larger area than that of a light-emitting region of a corresponding light-emitting element 210. In some embodiments, a passivation layer 315 may be disposed to cover at least the side walls 313 of the openings OP. In some embodiments, the passivation layer 214 may further cover a bottom surface of each of the openings OP. The passivation layer 315 may prevent or substantially prevent leakage light to adjacent ones of the openings OP. The passivation layer 315 may include, for example, aluminum oxide ($Al_2O_3$), hafnium oxide ($HfO_x$), silicon oxide ($SiO_x$), and/or the like, but the present disclosure is not limited thereto, and any suitable material known to those of ordinary skill in the art may be used to form the passivation layer 315.

Figure 33:
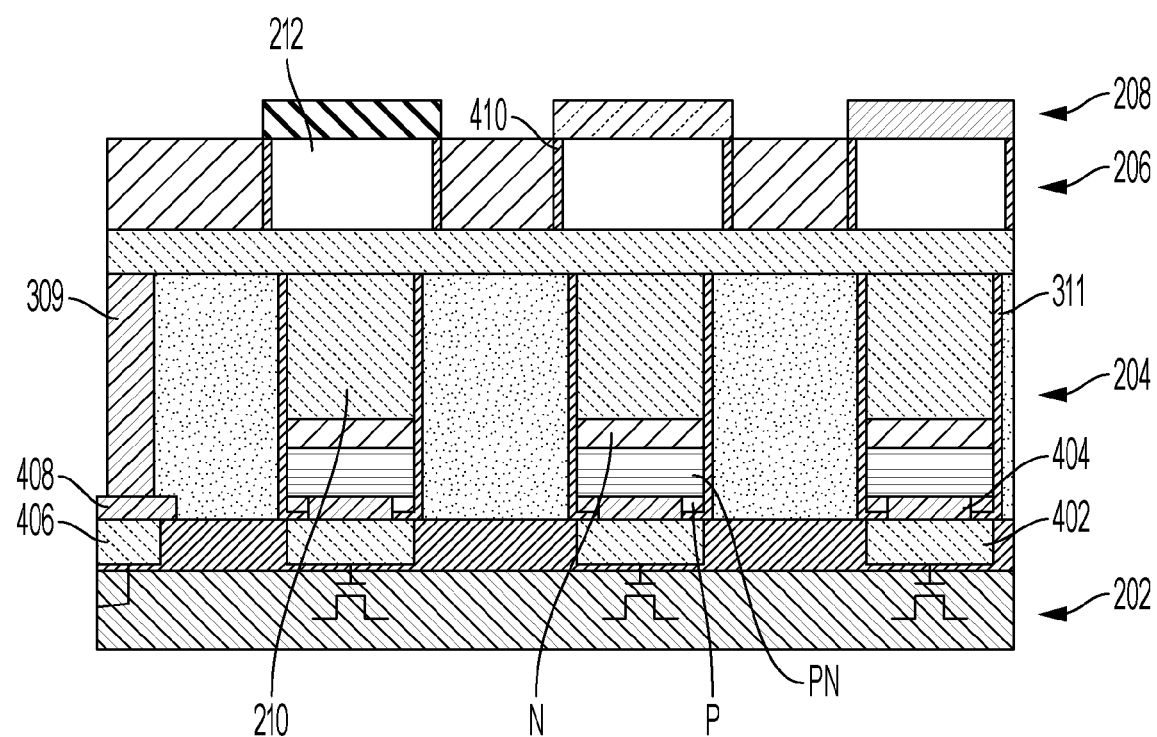
FIG. 33 illustrates a schematic cross-sectional view of a portion of a display device according to one or more embodiments of the present disclosure.

In some embodiments, a reflector layer may be further formed on the passivation layer 315 on the sidewalls 313 of the openings OP, or may be formed on the sidewalls 313 of the openings OP instead of the passivation layer 315 (e.g., see 410 in FIG. 33). The reflector layer may reflect light that may be lost between the sidewalls 313 of the openings OP. The reflector layer may include any suitable reflective material as would be known to those skilled in the art. Unlike the passivation layer 315, which may or may not be formed to cover the bottom surface of the openings OP, the reflector layer may expose the bottom surface of the opening OP, or may expose the passivation layer 315 covering the bottom surface of the opening OP. In other words, unlike the passivation layer 315, the reflector layer may not cover the bottom surface of the opening OP to allow light to be transmitted through the bottom surface of the opening. However, the present disclosure is not limited thereto, and in other embodiments, one or more other suitable layers may be disposed on the sidewalls 313 of the openings OP in addition to, or instead of, the passivation layer 315 and/or the reflector layer as would be known to those skilled in the art.

As shown in FIG. 32B, the openings OP of the fine pattern layer 350 may be filled with any suitable color conversion material 317, for example, such as various suitable quantum dots (QD) as described above, to form the color conversion layer 206 (or 206_1) having the plurality of color conversion units 212. In some embodiments, due to a small size of the openings OP, it may be difficult to fill the openings OP using, for example, photolithographic or inkjet methods. For example, as each of the openings OP may correspond to a light-emitting area (or a pixel area) of a corresponding light-emitting element 210, a size of the openings OP may correspond to a size of the corresponding light-emitting area, for example, in a range of a few to hundreds of micrometers (μm). Accordingly, in some embodiments, the openings OP may be filled by the color conversion material 317, which may be in a liquid state, by applying the color conversion material 317 on the second surface of the substrate 301 in which the openings OP are formed, and using a capillary force of the openings OP, for example, to fill the openings OP. If any of the openings OP are left unfilled, a suitable ultrasonic method may be used to fill the unfilled openings OP. However, the present disclosure is not limited thereto, and the openings OP may be filled with the color conversion material 317 using any suitable method (which may include photolithographic or inkjet methods).

In some embodiments, as described above with reference to FIG. 30B, each of the openings OP may be filled with the same color conversion material, for example, such as the white QD. In this case, each of the color conversion units 212 may convert the first color light (e.g., the blue light) emitted from a corresponding light-emitting element 210 into white light. In some embodiments, the color filter layer 208 having different colored color filters may be further formed on the color conversion layer 206_1 to filter different colored lights from the white light emitted from the color conversion units 212.

In some embodiments, as described above with reference to FIGS. 30A and 30C, some of the openings OP may be filled with the R-QD material to emit red light, some of the openings OP may be filled with the G-QD material to emit green light, and the other openings OP may be filled with the filler material (or the scattering material) to transmit the blue light emitted by corresponding ones of the light-emitting elements 210 therethrough (or may be filled with a suitable QD to emit blue light therefrom). In this case, to selectively fill the openings OP with the different materials, a mask and/or the like may be further used to expose corresponding ones of the openings OP to be filled, and to mask the other openings OP that are not to be filled. However, the present disclosure is not limited thereto, and the openings OP may be filled with the different materials using any suitable method.

After the openings OP are filled with the suitable color conversion material 317 (or the filling/scattering material according to the color of light to be emitted/transmitted at the corresponding opening OP), a planarization layer 319 may be formed to cover the fine pattern layer 350 and the openings OP filled by the color conversion materials 317 (or the filling/scattering material). The planarization layer 319 may protect the color conversion units 212, which may be vulnerable to moisture and/or heat, from an external environment. The planarization layer 319 may include an organic material and/or an inorganic material, and may include a single layer or multi-layers. For example, the planarization layer 319 may include at least one of silicon oxide (SiOx), silicon nitride (SiNx), and/or the like, but the material of the planarization layer 319 is not particularly limited thereto, and may include any suitable material known to those skilled in the art. Accordingly, the color conversion layer 206 or 206_1 of FIGS. 30A through 30C may be formed according to the kind of color conversion material 317 used to fill the openings OP.

In some embodiments, as shown in FIG. 30A, when the color conversion units 212 (e.g., including the first, second, and third color conversion units 214, 216, and 218) emit the different colored lights having a suitable color purity, the color filter layer 208 may be omitted. Accordingly, by combining the lights emitted by the first, second, and third color conversion units 214, 216, and 218, a high-resolution full color image may be realized.

In other embodiments, as shown in FIGS. 30B and 30C, the color filter layer 208 may be further formed on the color conversion layer 206 or 206_1. For example, as shown in FIG. 30B, the color filter layer 208 may filter the white light emitted by each of the color conversion units 212 of the color conversion layer 206_1 into the corresponding red, green, and blue lights. In an embodiment, the color filter layer 208 may include a red color filter to filter and transmit red light therethrough from the white light emitted from a corresponding color conversion unit 212, a green color filter to filter and transmit green light therethrough from the white light emitted from a corresponding color conversion unit 212, and a blue color filter to filter and transmit blue light therethrough from the white light emitted from a corresponding color conversion unit 212. However, the present disclosure is not limited thereto, and the color filter layer 208 may include any suitable colored color filters that may be used to implement a full color image.

As another example, as shown in FIG. 30C, the color filter layer 208 may include the red, green, and blue color filters to filter the different colored lights emitted by (or transmitted through) the first, second, and third color conversion units 214, 216, and 218 into the corresponding red, green, and blue lights. Accordingly, by combining the different colored lights transmitted through the color filter layer 208, a high-resolution full color image may be realized.

In some embodiments, the color filters of the color filter layer 208 may be formed using, for example, photolithography, but the present disclosure is not limited thereto, and the color filter layer 208 may be formed using any suitable method as would be known to those skilled in the art, for example, such as an imprint method or the like. In an embodiment, each of the color filters may be surrounded along its edge or periphery by a peripheral layer. In one or more embodiments, the peripheral layer may include a reflective metal and/or a black matrix for preventing light leakage, or may be a passivation layer, but the present disclosure is not limited thereto.

While the color filter layer 208 is shown and described as having red, green, and blue color filters, the present disclosure is not limited thereto. For example, the color filters of the color filter layer 208 in one or more other embodiments may have other suitable colors that are used to together to represent full or partially full colors. Further, there may be more of one color filter from among the red, green, and blue color filters than other filters having the other two colors. For example, there may be twice as many green color filters as there are red and blue color filters in one or more embodiments. Further, the color filter layer 208 may include a clear or transparent material or window, in addition to, or instead of, one or more red, green, and/or blue color filters, to allow the emitted light to pass therethrough without substantive change in components, luminosity, or frequency of the light.

FIG. 33 illustrates a schematic cross-sectional view of a portion of a display device according to one or more embodiments of the present disclosure.

As shown in FIG. 33, in some embodiments, each of the light-emitting elements 210 may include a PN junction diode including a P-type doped material, an N-type doped material, and the PN junction PN between the N-type doped material and the P-type doped material. For example, each of the light-emitting elements 210 may include multiple quantum wells (MQW) for light emitting formed therein. A positive side P of the PN junction diode may be connected to a corresponding anode metal 402 (e.g., the contact metal 322) via a bonding metal 404 (e.g., the contact metal 307), and a negative side N of the PN junction diode may be disposed towards the color conversion layer 206/206_1. The anode metal 402 may be connected to a corresponding driving element (e.g., the CMOS transistors, CMOS cells, and/or the like) on the driving substrate 202. The common electrode 309 may be connected to a cathode metal 406 (e.g., the contact metal 320) via a bonding metal 408. The cathode metal 406 may be connected to a voltage line or a power line on the driving substrate 202.

In some embodiments, the color conversion layer 206 may include a reflector layer 410 on the sidewalls thereof. The reflector layer 410 may include any suitable reflective material as would be known to those skilled in the art to reflect light that may be lost between the sidewalls of the openings of the color conversion layer 206. As shown in FIG. 33, in some embodiments, the reflector layer 410 may be directly disposed on the sidewalls of the openings of the color conversion layer 206, or may be disposed on the passivation layer 315 (e.g., see FIG. 32A) on the sidewalls of the openings of the color conversion layer 206. In some embodiments, unlike the passivation layer 315, which may or may not cover a bottom surface of the openings of the color conversion layer 206, the reflector layer 410 may not cover the bottom surface of the openings to allow light to be transmitted therethrough. However, the present disclosure is not limited thereto, and in other embodiments, one or more other suitable layers may be disposed on the sidewalls 313 of the openings OP in addition to, or instead of, the passivation layer 315 and/or the reflector layer 410 as would be known to those skilled in the art.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a base layer; and
   light-emitting elements on a first surface of the base layer,
   wherein the base layer includes groove patterns that are recessed from a second surface of the base layer, and the groove patterns overlap with the light-emitting elements, respectively,
   wherein the base layer comprises a silicon material, and the groove patterns penetrate the silicon material of the base layer from the second surface of the base layer, and
   wherein the display device further comprises a color conversion layer in the groove patterns.

2. The display device of claim 1, wherein the light-emitting elements are directly on the first surface of the base layer.

3. The display device of claim 1, further comprising a protective layer covering the second surface of the base layer and the color conversion layer.

4. The display device of claim 1, further comprising a color filter layer on the color conversion layer.

5. The display device of claim 1, further comprising a reflective layer between the groove patterns and the color conversion layer.

6. The display device of claim 1, wherein the color conversion layer comprises:
   a base resin; and
   quantum dots dispersed in the base resin.

7. The display device of claim 1, further comprising a planarization layer between the light-emitting elements.

8. The display device of claim 7, further comprising a substrate on the planarization layer, and electrically connected to the light-emitting elements.

9. The display device of claim 8, further comprising a connection electrode between the substrate and the light-emitting elements.

10. The display device of claim 1, wherein each of the light-emitting elements comprises:
    a first semiconductor layer;
    a second semiconductor layer on the first semiconductor layer; and
    an active layer between the first semiconductor layer and the second semiconductor layer.

11. The display device of claim 10, wherein the second semiconductor layer is directly on the first surface of the base layer.

12. A manufacturing method of a display device, comprising:
    forming light-emitting elements on a first surface of a base layer;
    coupling the light-emitting elements to a substrate; and
    etching a second surface of the base layer to form groove patterns overlapping with the light-emitting elements, respectively,
    wherein the base layer comprises a silicon material, and the groove patterns penetrate the silicon material of the base layer from the second surface of the base layer, and
    wherein the method further comprises forming a color conversion layer in the groove patterns.

13. The manufacturing method of claim 12, further comprising forming a protective layer covering the second surface of the base layer and the color conversion layer.

14. The manufacturing method of claim 12, further comprising forming a color filter layer on the color conversion layer.

15. The manufacturing method of claim 12, further comprising:
    forming a planarization layer between the light-emitting elements; and
    forming a first electrode on the light-emitting elements,
    wherein the first electrode on the light-emitting elements is coupled to a first connection electrode on the substrate.

16. The manufacturing method of claim 12, wherein the forming of the light-emitting elements comprises:
    providing a light-emitting stack on the base layer; and
    etching the light-emitting stack.

17. The manufacturing method of claim 16, wherein the light-emitting stack comprises:
    a first semiconductor layer;
    a second semiconductor layer formed on the first semiconductor layer; and
    an active layer formed between the first semiconductor layer and the second semiconductor layer.

18. The manufacturing method of claim 17, wherein the second semiconductor layer is directly formed on the first surface of the base layer.

* * * * *